United States Patent [19]
Rhein et al.

[11] Patent Number: 5,650,728
[45] Date of Patent: Jul. 22, 1997

[54] FAULT DETECTION SYSTEM INCLUDING A CAPACITOR FOR GENERATING A PULSE AND A PROCESSOR FOR DETERMINING ADMITTANCE VERSUS FREQUENCY OF A REFLECTED PULSE

[75] Inventors: David Adelbert Rhein, Columbia; Lloyd Ronald Beard, Centralia; Gerald Bernard Roberts, Paris; Thomas Jude Herrick, Rolla, all of Mo.

[73] Assignees: Hubbell Incorporated, Conn.; University of Missouri, Mo.

[21] Appl. No.: 415,375

[22] Filed: Apr. 3, 1995

[51] Int. Cl.$^6$ .................... H01H 31/02; G01R 31/11
[52] U.S. Cl. ............................. 324/543; 324/534
[58] Field of Search ....................... 324/543, 522, 324/133, 539, 519, 523, 532, 527, 515, 520, 533, 512, 540, 541, 525, 534, 535

[56] References Cited

U.S. PATENT DOCUMENTS

| | | | |
|---|---|---|---|
| 3,588,688 | 6/1971 | Lockie | 324/54 |
| 3,777,217 | 12/1973 | Groce et al. | 324/539 |
| 4,144,487 | 3/1979 | Pharney | 324/522 |
| 4,165,482 | 8/1979 | Gale | 324/523 |
| 4,254,374 | 3/1981 | Trihus | 324/539 |
| 4,370,609 | 1/1983 | Wilson et al. | 324/51 |
| 4,406,985 | 9/1983 | Phillips et al. | 324/51 |
| 4,491,782 | 1/1985 | Bellis et al. | 324/52 |
| 4,568,872 | 2/1986 | Heller et al. | 324/52 |
| 4,775,839 | 10/1988 | Kosina et al. | 324/530 |
| 5,206,595 | 4/1993 | Wiggins et al. | 324/535 |
| 5,319,311 | 6/1994 | Kawashima et al. | 324/534 |
| 5,341,265 | 8/1994 | Westrom et al. | 361/44 |
| 5,345,180 | 9/1994 | Maier et al. | 324/537 |
| 5,352,984 | 10/1994 | Piesinger | 324/532 |

OTHER PUBLICATIONS

IEEE Paper—Impulsive Response Analysis of A Real Feeder For High Impedenance Fault Detection by P.R. Silva et al., Presented at 1994 IEEE Transmission & Distribution Conf. Chicago, IL, Apr. 10–15, 1994.

A Thesis entitled Fault Detection on Distribution Laterals by David A. Rhein presented to the University of Missouri—Rolla, Anticipated Publication 1995.

Primary Examiner—Sandra L. O'Shea
Assistant Examiner—Roger Phillips
Attorney, Agent, or Firm—Jerry M. Presson; Stacey J. Longanecker

[57] ABSTRACT

A system comprising a portable apparatus and employing a method of admittance versus frequency analysis to detect the existence of a fault in a de-energized electrical line regardless of whether the line contains branches. The portable apparatus comprises a capacitor unit detachably connected to a de-energized line, ground or a neutral conductor, a switch unit detachably connected to a de-energized line, the de-energized line being tested, and an insulated cable connecting the capacitor unit to the switch unit. The switch unit comprises a discharge switch that can be activated by pulling on the hot line tool. The capacitor unit comprises a capacitor which is discharged into the electrical line via the insulated cable and the switch unit when the discharge switch is activated to create a pulse. The capacitor unit comprises circuitry for generating voltage and current samples of pulse response signals and a microprocessor for determining the admittance of the electrical line using Fast Fourier transforms of the current and voltage samples. The admittance of the line is compared with stored data relating to lines having different load impedances and having faults located at various distances from the capacitor unit and detectable at various frequencies to determine the existence of a fault.

50 Claims, 36 Drawing Sheets

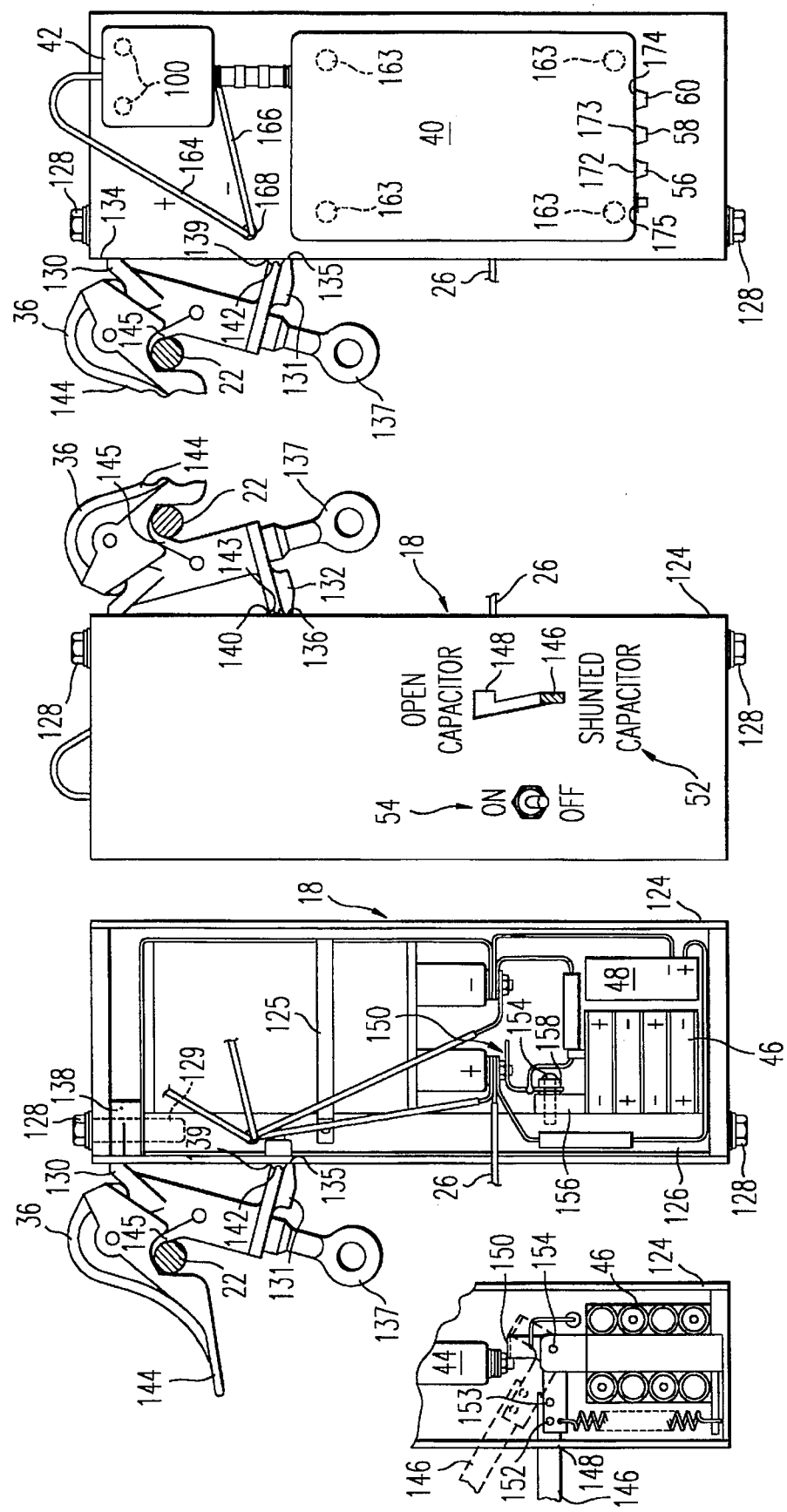

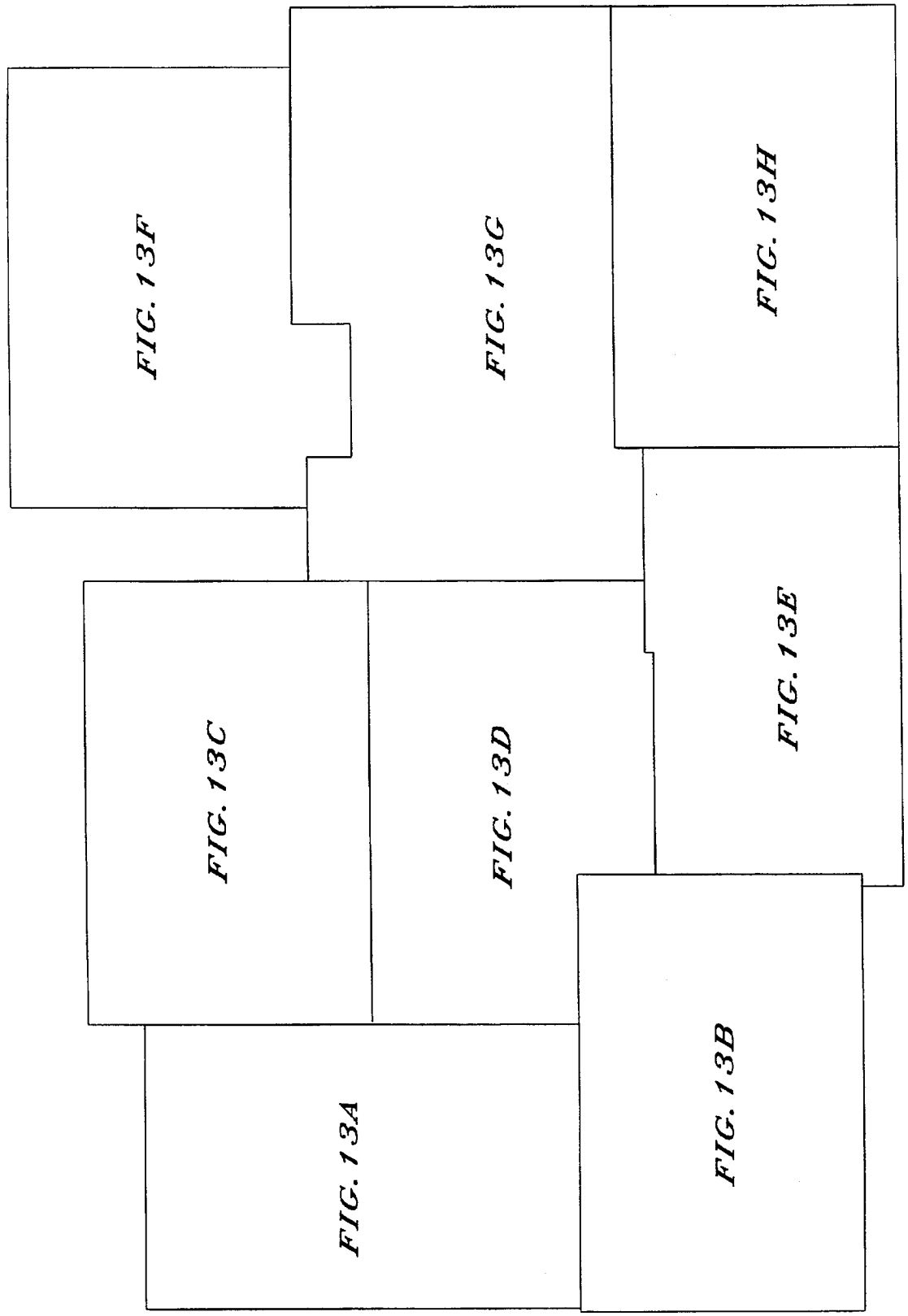

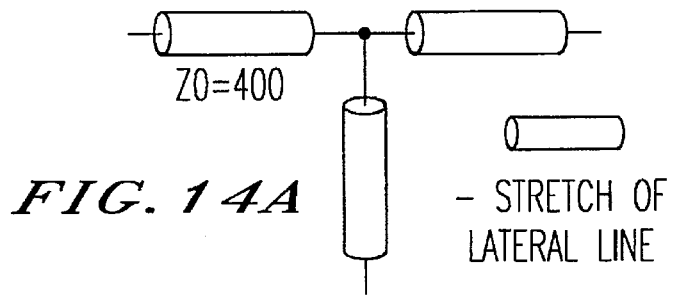
FIG. 14A — STRETCH OF LATERAL LINE
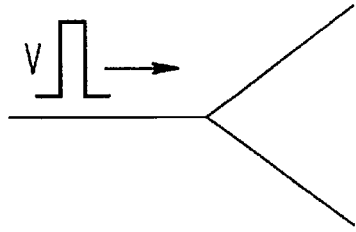
FIG. 14B
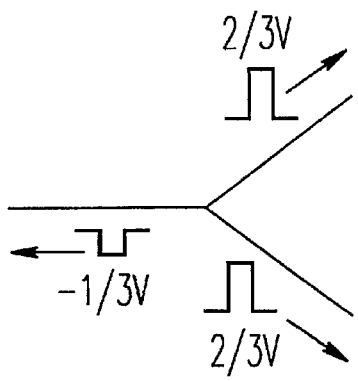
FIG. 14C
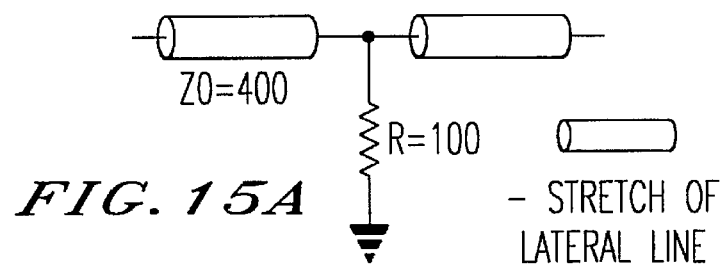
FIG. 15A — STRETCH OF LATERAL LINE
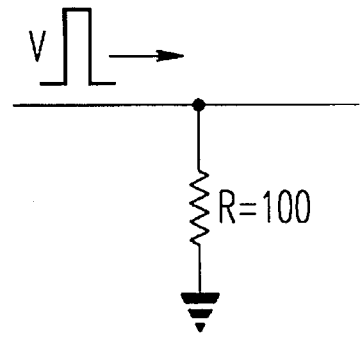
FIG. 15B
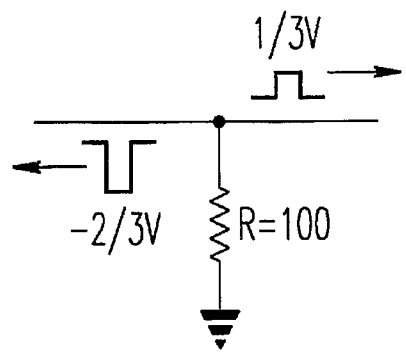
FIG. 15C

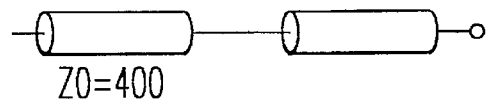
*FIG. 16A*  — STRETCH OF LATERAL LINE
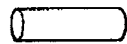
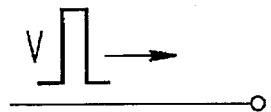
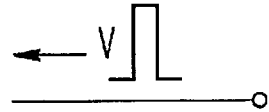
*FIG. 16B*          *FIG. 16C*
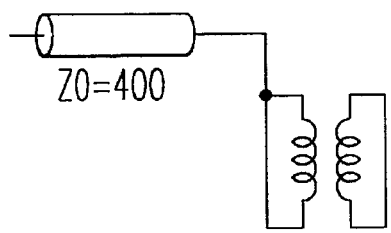
*FIG. 17A*
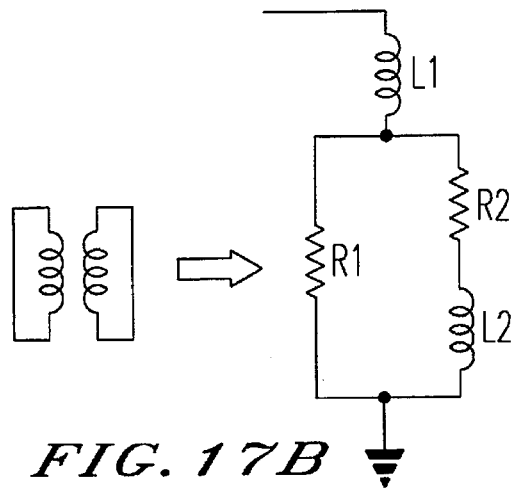
*FIG. 17B*
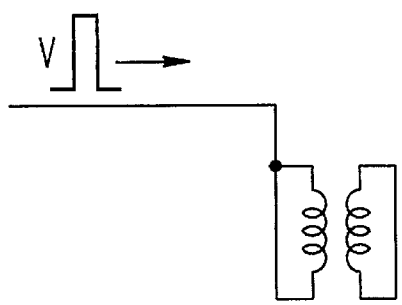
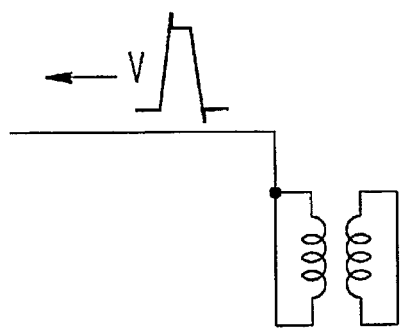
*FIG. 17C*          *FIG. 17D*

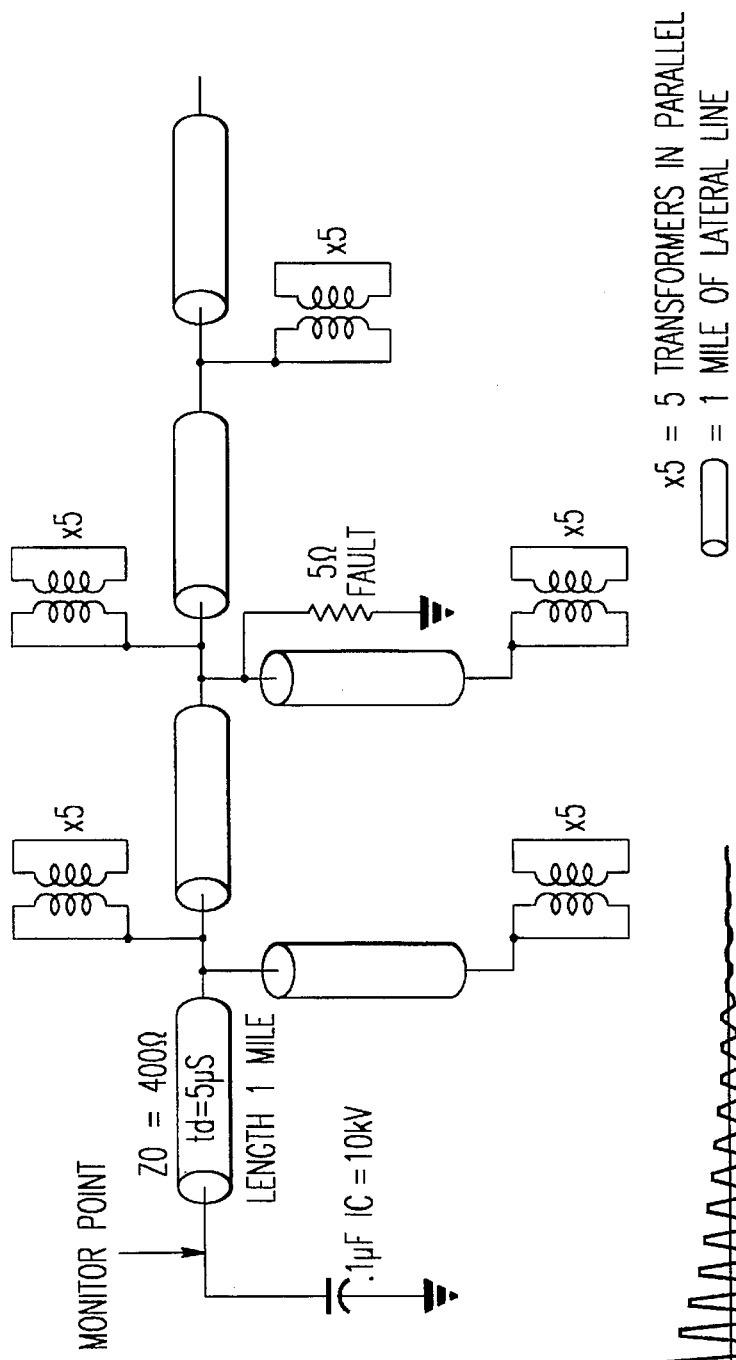
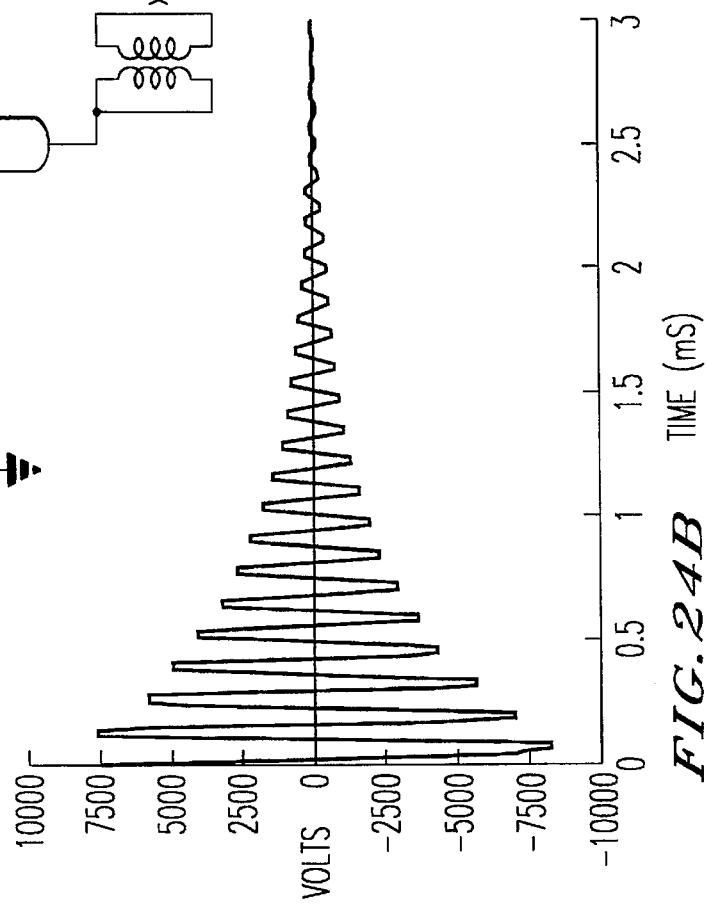

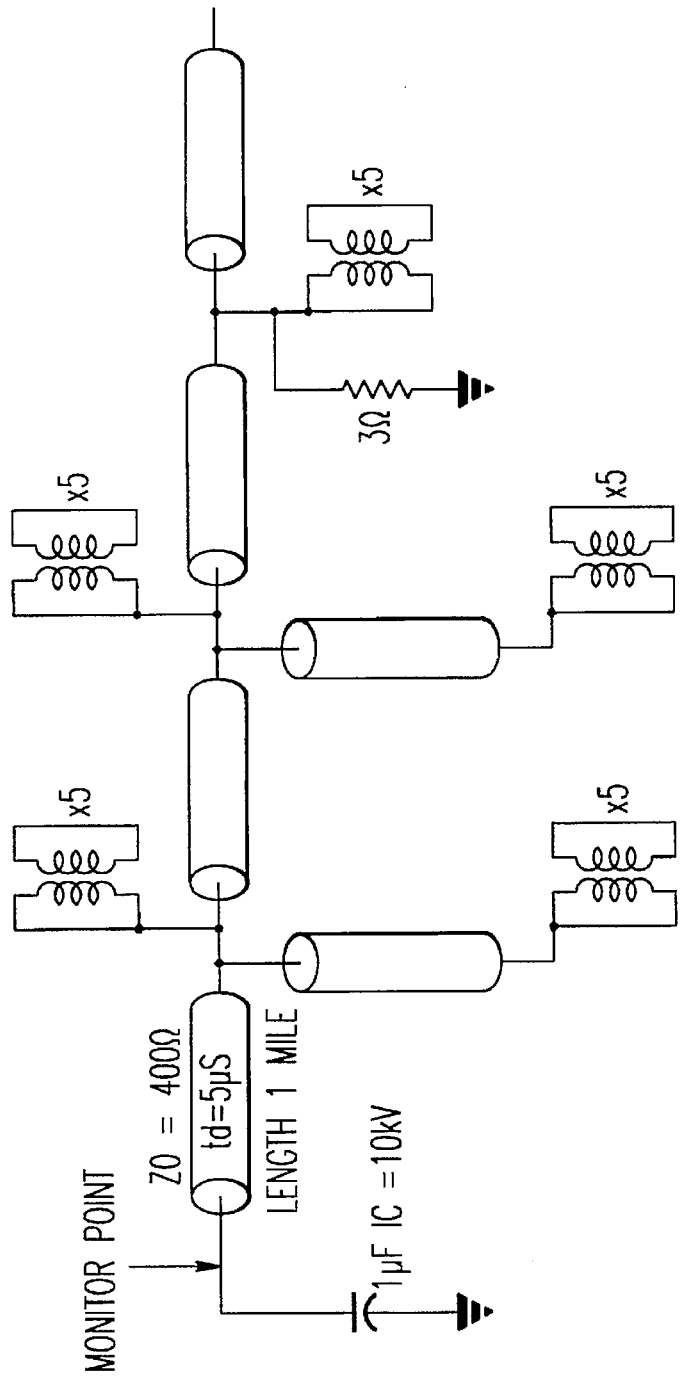
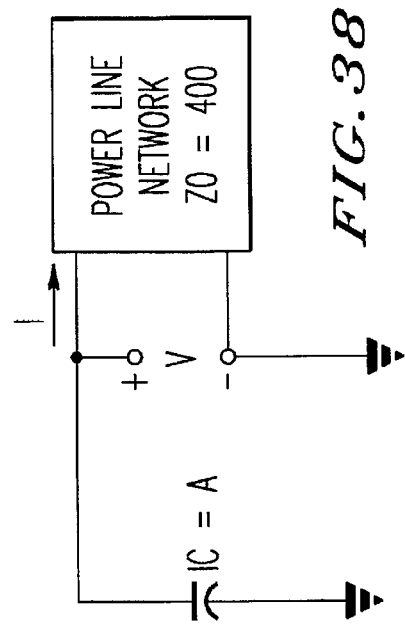
*FIG. 39*
*FIG. 38*

5,650,728

FAULT DETECTION SYSTEM INCLUDING A CAPACITOR FOR GENERATING A PULSE AND A PROCESSOR FOR DETERMINING ADMITTANCE VERSUS FREQUENCY OF A REFLECTED PULSE

FIELD OF THE INVENTION

The present invention relates to the detection of faults in systems which supply or receive electrical power, and more particularly to a portable apparatus and a method for determining whether or not a fault exists in a de-energized line.

BACKGROUND OF THE INVENTION

A fault in a power line in an overhead power distribution system can arise from a number of conditions such as lightning striking on or near the line, or animals, fallen trees, wind storms or other conditions damaging the line. Most faults, however, are temporary, that is, the line and its associated circuit are restored after a recloser on the line operates. Temporary faults are therefore corrected without requiring line maintenance. Temporary faults are oftentimes difficult to identify. Utility companies frequently resort to locating or merely confirming the existence of a fault by closing a cutout into the line or circuit suspected of being faulted. If the fuse does not operate or blow, the fault most likely cleared itself. Fuses used as diagnostic tools in this manner, however, all too often blow because the fault did not clear itself.

Fault conditions in an electrical system, whether they occur on the supply or load side, can be hazardous to lineman installing or repairing the system, and to system users. For example, a lineman closing a cutout or fuse connecting a distribution lateral to a main line can be exposed to hot gases, and struck with chards from the fuse, when the fuse explodes due to a fault in the line. Linemen must wear protective equipment and observe many precautions when diagnosing the existence of line faults using this technique. Further, cutouts are subjected to unnecessary wear when they are closed into a faulted line, thereby reducing the life of the cutout. Additional damage to the circuit to which the faulted line is connected can occur from repeated and unnecessary cutout closing into the faulted line. Finally, the expense of such fault detection measures is considerable if a fuse needs to be replaced every time the existence of a fault condition is confirmed.

A need exists for a tool which allows a lineman to check the condition of a line suspected of being faulted before installing a new fuse and without having to first close the cutout. The same tool should also be useful to diagnose systems that are not a part of overhead power distribution systems such as underground power lines and other types of conductors in supply and load side electrical systems.

Existing fault detection systems suffer from a number of disadvantages and drawbacks. One type of existing fault detection system employs Time Domain Relectometry (TDR), or the radar method, to locate faults on underground and overhead lines. Systems employing TDR typically comprise a device for generating a pulse on the line being tested, and TDR equipment to detect and display reflected responses. These systems require a significant amount of complex and expensive equipment to create the pulse and to display the reflected response waveforms. Further, these systems typically require a highly skilled and trained human operator to interpret the displayed, reflected response waveforms to determine the existence and location of a fault.

Some of the difficulties with detecting faults arise not from test modalities such as TDR, but rather from the test line or circuit itself. For example, if a distribution lateral is tested for a fault, and the fault test involves transmitting a test pulse on the lateral, the pulse may encounter a branch, a fault, the end of the line, a transformer or other termination.

Fault detection systems employing the TDR method are not suited for diagnosing faults on lines having branches. As with a fault, a portion of the pulse is generally reflected from the branch toward the pulse source and has a negative amplitude, and the remaining pulse energy is refracted and travels along the multiple pathways extending from the branch. Existing detection systems using TDR cannot distinguish reflected pulses due to a branch from reflected pulses due to a fault. In addition, a pulse travels along a 1 mile line in approximately 5 microseconds. Reflections from a fault or a branch 1 mile away from the pulse source therefore return in approximately 10 microseconds. Further, the pulse of a 0.1 microfarad capacitor discharging into a 400 ohm distribution lateral does not decay for 200 microseconds. Thus, reflected pulses interact with the incident pulse. Interactions between the reflected and incident pulses cannot be effectively deciphered using a detection method such as TDR. Further, the pulse width of the decaying exponential of the discharging capacitor generally cannot be sufficiently shortened without sacrificing capacitor size and, accordingly, the energy needed to provide a large enough pulse to travel along the lateral without being attenuated too much to be useful. Since a large negative reflection is typically viewed as characteristic of a fault in TDR systems, anything that decreases the size of the reflection decreases the effectiveness of the TDR system in detecting a fault. Thus, the above-described effect of branches on a pulse renders TDR an unreliable method for determining fault on lines with branches.

In addition, fault detection systems employing the TDR method generally operate with a low output voltage and therefore cannot detect a fault on a line having an insulated gap. A need exists for a fault detection system that operates at both high and low voltages and is therefore capable of arcing over small insulative gaps in the fault path which might break down once system voltage is restored.

U.S. Pat. No. 5,345,180 discloses another type of fault detection system wherein a line is provided with a wide square-wave pulse of approximately 0.5 milliseconds in duration. The pulse is generated electronically using a gate turn-off (GTO) thryistor and the system voltage. A current transformer measures the resulting current which is then integrated. The integrated current value is compared with a threshold value to determine if a fault exists. The system is disadvantageous because the pulse generation method is complicated, particularly since a pulse of relatively long duration is required. This is because the current characteristic of a capacitor is the most difficult current characteristic to differentiate from that of a short circuit. The differentiation is more pronounced as the duration of the pulse increases. Hence, a pulse of relatively long duration is necessary.

Another method of detecting high impedance faults is presented in an I.E.E.E. paper entitled "Impulsive Response Analysis of a Real Feeder for High Impedance Fault Detection" by P. R. Silva et al. The paper discusses injecting a feeder to be tested with a pulse from the substation. The feeder response must first be measured, stored and analyzed for a feeder operating under normal conditions. The feeder response for a feeder operating under fault conditions is then measured, stored and analyzed in order to be compared with the normal feeder response. The normal and faulted feeder responses are compared in several ways. First, the time domain responses for a normal feeder and the same feeder operating under faulted conditions are compared. Second, the frequency components of the normal and faulted feeder responses, which are calculated using the Fast Fourier Transform, are compared. Finally, the energy content of the normal and faulted feeder responses is compared.

This method suffers from a number of drawbacks. First, the method requires measurement and storage of normal responses or signatures of all circuits being tested. A fault detection system is needed which works on a multitude of different lateral configurations with varying lengths, loads (e.g., transformers), fault locations, and fault resistance levels without first having to normalize each configuration. Second, the three indexes or tests used to compare the responses of a normal operating feeder and the same feeder under fault conditions do not clearly differentiate changes in the feeder responses due to various reflected pulses, which arise from various switch, fault, load and branch conditions of the feeder being tested. Thus, a need exists for a fault detection system which discriminates the effects of various feeder conditions on the feeder response in order to more reliably identify when particular types of faults have occurred.

In view of the foregoing deficiencies in existing fault detection systems, there exists a need for a more effective method of detecting fault, as well as equipment which employs the method.

SUMMARY OF THE INVENTION

The present invention realizes a number of advantages over existing fault detection systems. In accordance with the present invention, a portable apparatus for determining the presence of a fault in a de-energized electrical line is provided which comprises a capacitor unit, a switching unit detachably connected to the electrical line, and a cable for connecting the switching unit to the capacitor unit. The capacitor unit comprises a capacitor having a positive terminal and a negative terminal, a programmable processing device and a voltage divider connected to the capacitor and to the programmable processing device. The switching unit comprises switching means connectable to the electrical line and to one end of the cable. The other end of the cable is connected to the positive terminal. The processing device is programmable to discharge the capacitor into the electrical line via the cable when the switching means is activated to measure electrical characteristics of said electrical line, and to determine existence of a fault on said electrical line using said electrical characteristics of said line.

In accordance with another aspect of the invention, a method of determining the existence of a fault on a de-energized electrical line is provided which comprises the steps of generating a pulse for transmission along the electrical line, calculating admittance data relating to the input admittance of the electrical line in response to the pulse and determining from the admittance data whether a fault exists on the electrical line.

In accordance with another aspect of the invention, a fault detection system is provided which allows a lineman to test a lateral for a fault before installing a new fuse. This is particularly important when a fault does not clear without human intervention, since the newly installed fuse will explode.

In accordance with another aspect of the present invention, a portable fault detection system is provided which detects the presence of faults on de-energized electrical supply and load lines. On power supply lines, the system detects faults on both underground lines and overhead lines having branches.

In accordance with another aspect of the present invention, the fault detection system discharges a pulse into a test line using a capacitive unit and analyzes the responses by determining the input admittance of the line as a function of frequency.

In accordance with another aspect of the present invention, a fault detection system is provided which uses the admittance versus frequency data of a line being tested to determine the presence of a fault regardless of the length of, number of branches in or load on the line, or the location and resistance level of a fault thereon. The system does not require normalized data specific to the line being tested and representative of unfaulted conditions on the line.

In accordance with still another aspect of the present invention, a fault detection system is provided which comprises a switch unit configured to be detachably suspended from a de-energized line being tested using a hot line tool, and a capacitor unit connected to the switch unit via a cable and detachably mounted on a neutral conductor or another de-energized line. The system requires minimal set-up time.

In accordance with still another aspect of the present invention, the capacitor unit comprises circuitry to generate a test pulse and to measure and analyze pulse responses. The capacitor unit is configurable to be self-powered via a power supply and batteries or to receive power from an energized line. The batteries are changeable without the use of tools to open the capacitor unit.

In accordance with still another aspect of the present invention, the fault detector system comprises indicators for indicating the presence or absence of fault under all prevailing ambient lighting conditions.

BRIEF DESCRIPTION OF THE DRAWINGS

These and other features and advantages of the present invention will be more readily apprehended from the following detailed description when read in connection with the appended drawings, which form a part of this original disclosure, and wherein:

FIGS. 8, 9, 10 and 11 are right side interior, front interior, left side exterior, and right side exterior views, respectively, of the capacitor unit of the fault detection system depicted in FIG. 1;

FIGS. 14A, 14B and 14C are diagrams depicting the effect of a branch on a pulse;

FIGS. 15A, 15B and 15C are diagrams depicting the effect of a fault on a pulse;

FIGS. 16A, 16B and 16C are diagrams depicting the effect of an open-ended line on a pulse;

FIGS. 17A, 17B and 17C are diagrams depicting the effect of a transformer on a pulse;

FIGS. 24A and 24B are, respectively, a schematic diagram of a typical faulted distribution lateral and a graph of the voltage during a test on the faulted lateral;

FIG. 38 is a schematic diagram of an equivalent circuit for testing;

FIG. 39 is a schematic diagram of a typical faulted line;

DETAILED DESCRIPTION OF THE PREFERRED EMBODIMENTS

Figure 1:
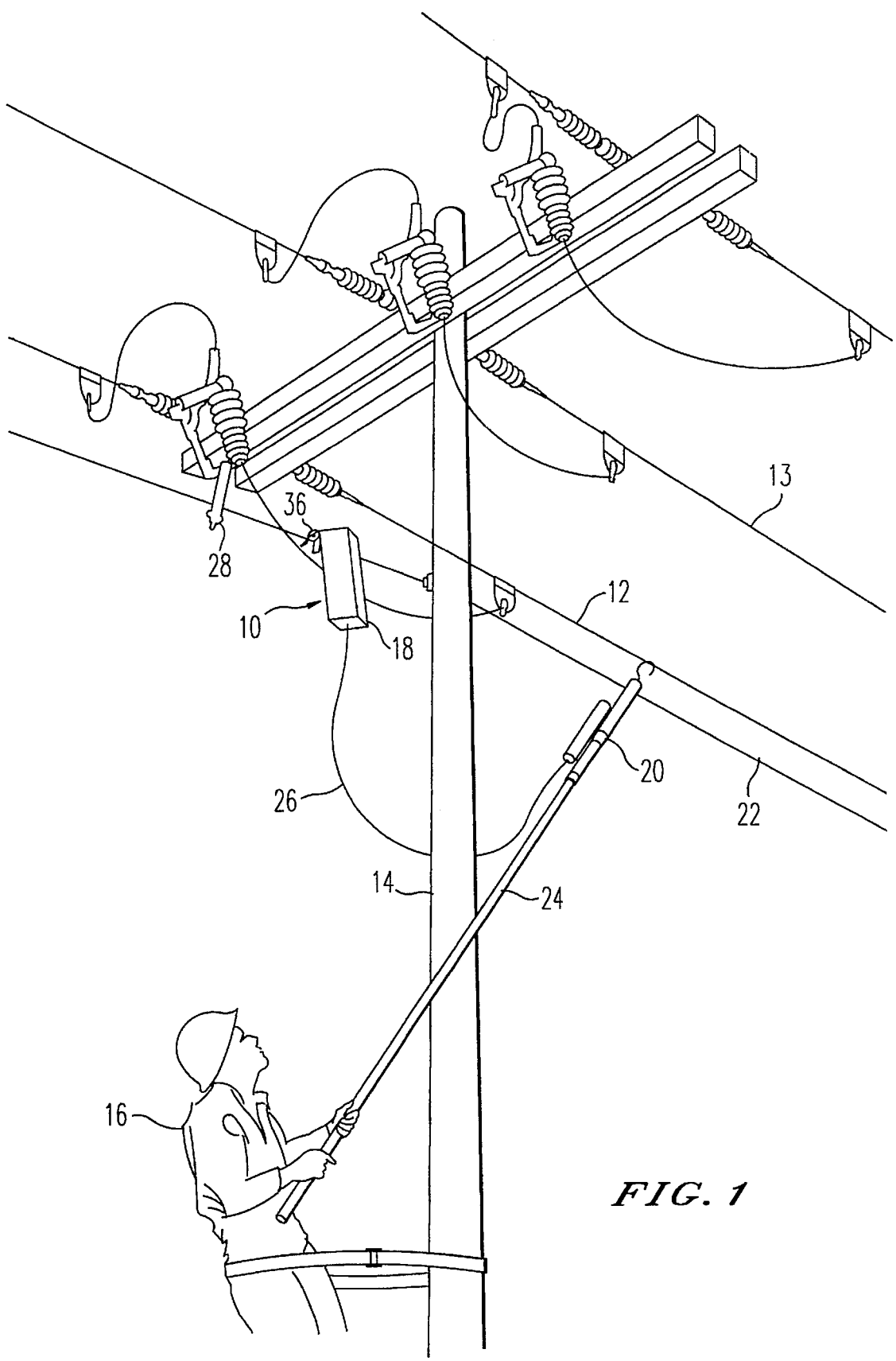
FIG. 1 illustrates a lineman using a fault detection system constructed in accordance with an embodiment of the present invention on a distribution lateral.

With reference to FIG. 1, the fault detection system 10 of the present invention is shown for illustrative purposes in use with a power distribution line (i.e., a distribution lateral) 12, which is to be tested and which is suspended above the ground on a supporting structure such as a pole 14. In addition to electrical power supply lines, the fault detection system 10 can be used to detect faults in transformers, capacitors and other supply side circuits. Electrical faults, however, are not limited to power distribution systems. The fault detection system 10 can also be used to detect faults associated with electrical systems in industrial plants and with other major electrical power load or user systems (i.e., commercial and residential equipment).

The fault detection system 10 preferably comprises a capacitor unit 18 and a switch unit 20. A lineman 16 connects the capacitor unit 18 to a neutral conductor 22, and connects the switch unit 20 to the line 12 being tested for a fault. The switch unit 20 is designed to be mounted on the end of a conventional hot line tool 24. Because of its relatively heavy weight, the capacitor unit is preferably not mounted on the end of a hot line tool. As described below, the capacitor unit 18 is provided with a clamp 36 for suspending it from the neutral conductor 22. The capacitor unit, therefore, is not only placed in a convenient location, but provides grounding for the fault detection system 10 as well. The switch unit 20 is connected to the capacitor unit 18 via a conductor, e.g., an insulated cable 26. Using the system 10, the line 12 can be tested for a fault in a de-energized state before closing the cutout 28. Thus, the potential hazard associated with closing a cutout into a faulted distribution line is eliminated. The capacitor unit can also be connected to another de-energized line 13 for phase-to-phase fault testing.

The capacitor unit 18 and the switch unit 20 will now be described in connection with FIG. 2. The switch unit 20 comprises a hook 30 for engaging the test line 12. The switch unit further comprises a discharge switch 32 and a fuse 34, which together with the hook 30 provide an electrically conductive path to the capacitor unit 18 via the conductor 26 when the discharge switch is 32 closed.

The capacitor unit has a clamp 36 for detachably securing the capacitor unit 18 to the neutral conductor 22 or the de-energized line 13. The capacitor unit 18 can also be supported against the pole 14 using, for example, a strap (not shown). The capacitor unit further comprises a capacitor box assembly 38, an electronics assembly 40 and a voltage divider 42.

The capacitor box assembly 38 preferably comprises a 10 kilovolt, 1.0 microfarad capacitor 44 which, when the discharge switch 32 is closed, discharges and energizes the test line 12 with a pulse. The capacitor is preferably charged using one or more batteries 46 which provide a high voltage power supply 48 with a 12 volt DC input signal. The high voltage power supply 48 generates a 10 kilovolt output signal which is applied to the terminals of the capacitor 44.

In accordance with an embodiment of the invention, the capacitor 44 is connected in parallel with a series circuit comprising a 700 ohm resistor 50 and a safety shunt switch 52. The capacitor box assembly 38 further comprises a charging switch 54 connected between the battery or batteries 46 and the input to the high voltage power supply 48. To operate the system 10, the safety shunt switch 52 is switched to the open or unshunted position. The charging switch 54 is then closed to commence charging of the capacitor.

The 10 kilovolt output from the high voltage power supply 48 is also applied to the voltage divider 42. The electronics assembly 40 is provided with an output from the voltage divider 42 to monitor the discharge of the capacitor 44. The electronics assembly 40 comprises a microprocessor 188 on a circuit board 186 (FIGS. 13A–13H) which detects faults on test lines using the pulse from the capacitor 44, as described in more detail below. The electronics assembly comprises batteries to provide power, and a number of indicators such as light emitting diodes (LEDs) 56, 58 and 60 and buzzers 62 and 64 to indicate line fault conditions and the capacitor charging state (e.g., partially and fully charged).

Figure 3:
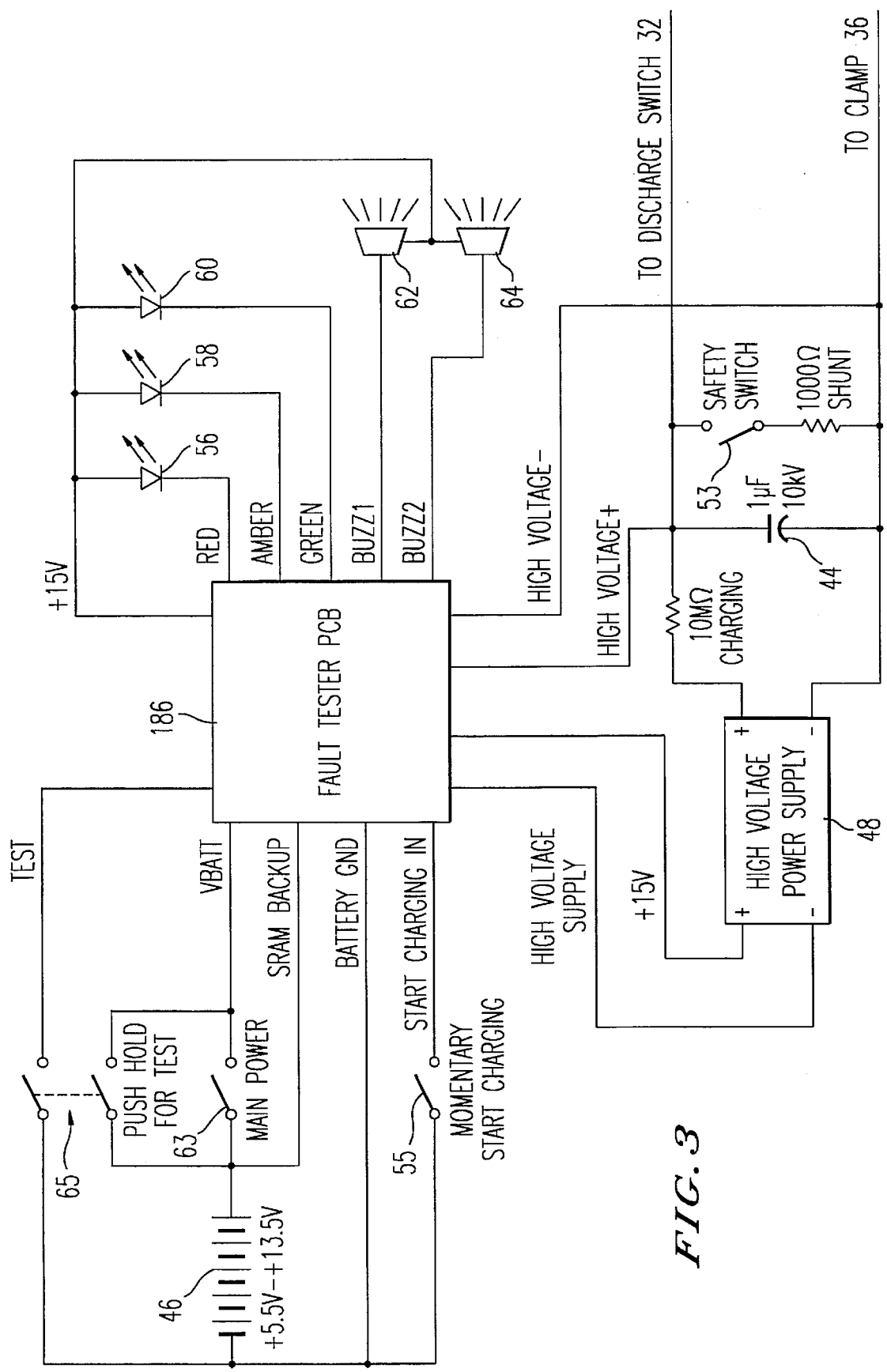
FIG. 3 is a diagram depicting the capacitor unit constructed in accordance with another embodiment of the present invention.

In accordance with another embodiment of the invention, depicted in FIG. 3, the capacitor unit 18 is provided with a safety shunt lever 53 that is automatically opened (e.g., via a mechanical connection between the clamp and the lever 53) when the clamp 36 is connected to the neutral conductor 22 to unshunt the capacitor 44. Another switch, i.e., the MAIN POWER switch 63, on the capacitor unit 18 is preferably closed mechanically and automatically when the safety shunt lever 53 is opened to provide power to the circuit board 186 in the electronics assembly 40. A charging switch 55 is configured as a momentary-type switch that is activated by an operator or lineman to commence capacitor charging. The microprocessor 188 (FIG. 13D) on the circuit board 186 in the electronics assembly 40 monitors the pin corresponding to the switch 55. When the pin is high, the microprocessor 188 sends a signal to a solid state switch on the circuit board 186 which generates an output signal for transmission to the high voltage power supply 48 to begin charging the capacitor 44.

Figure 13A:
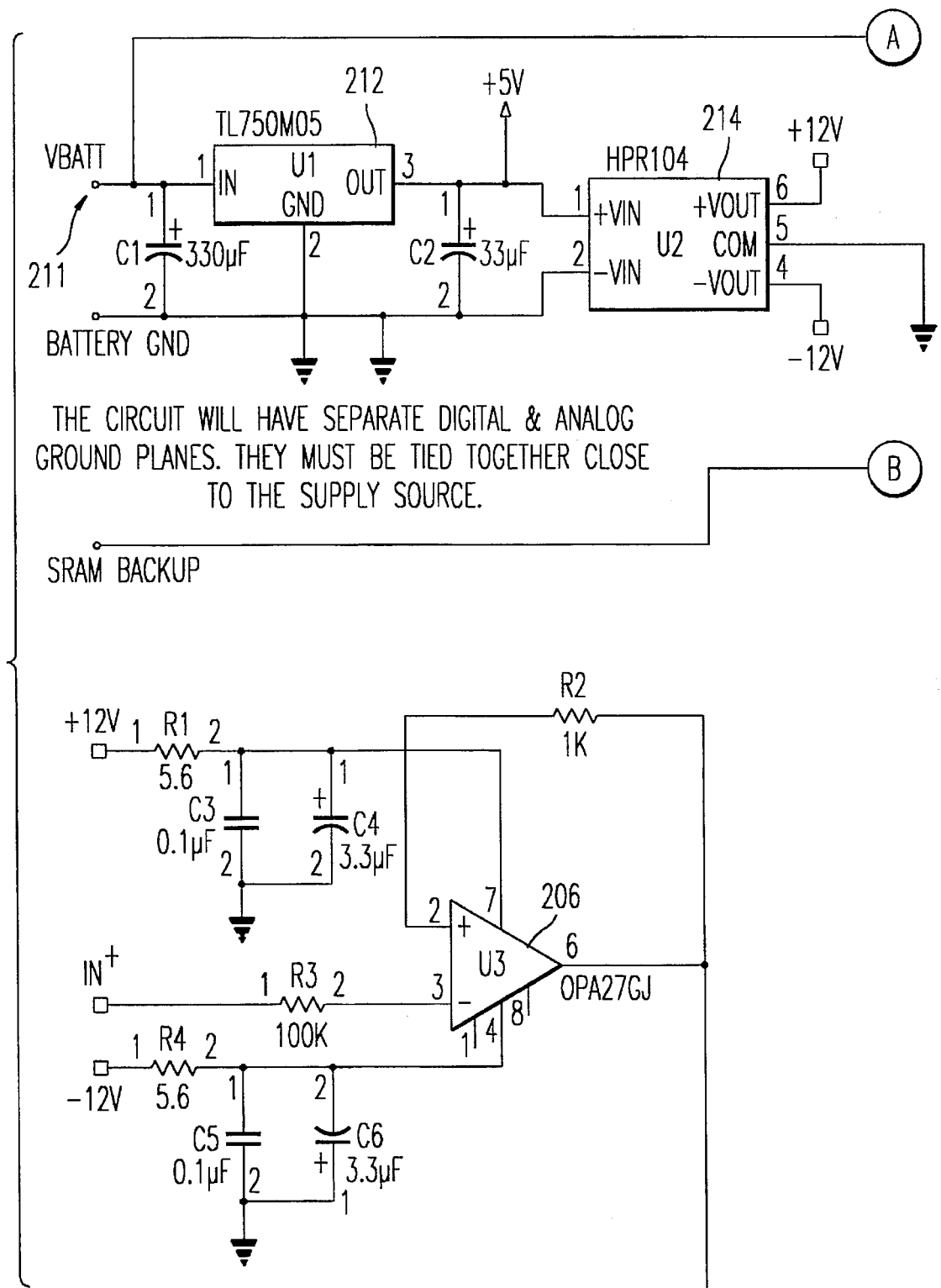
FIGS. 13A, 13B, 13C, 13D, 13E, 13F, 13G and 13H are schematic diagrams of a circuit board in the capacitor unit constructed in accordance with an embodiment of the present invention.
Figure 13B:
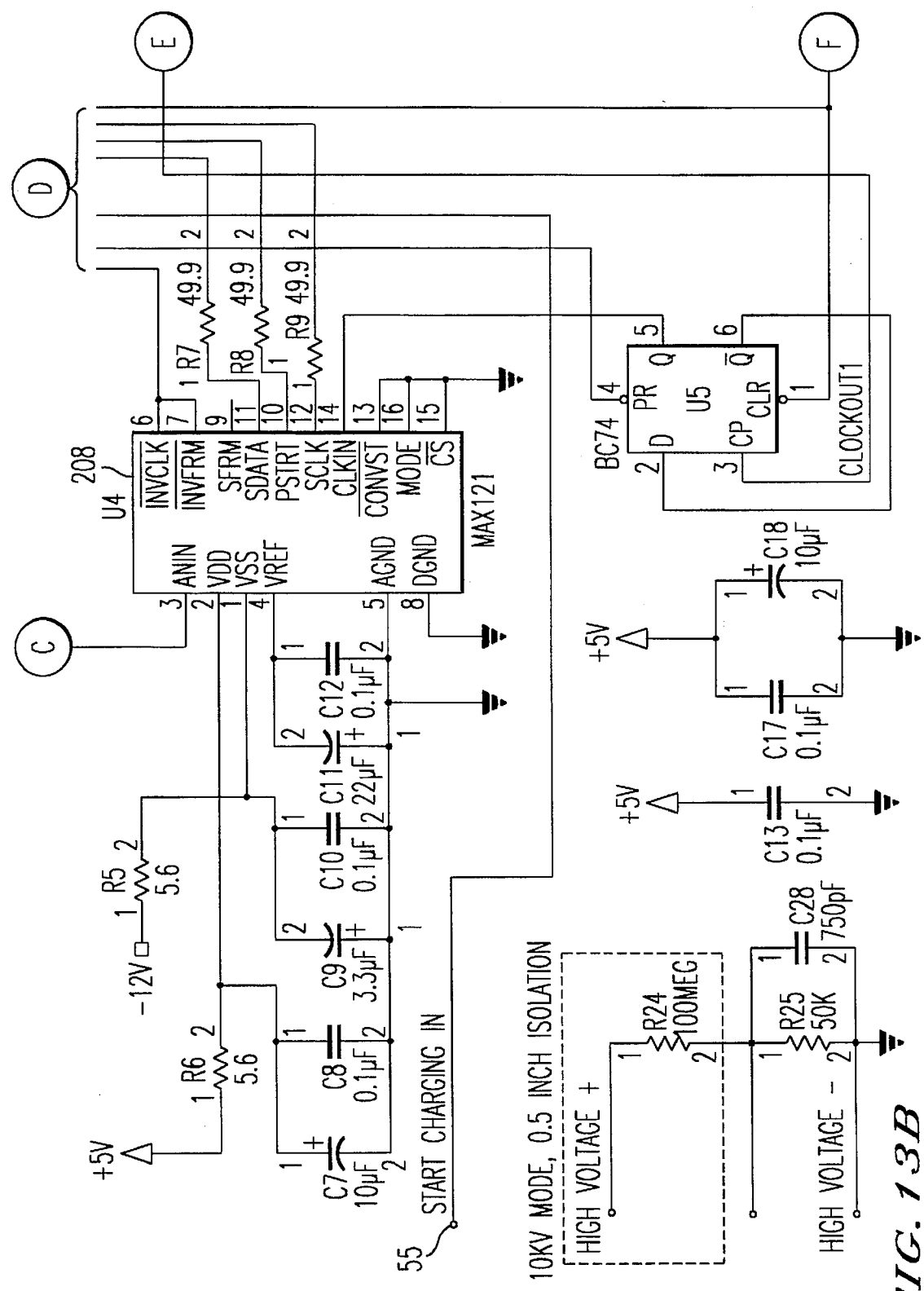
Figure 13C:
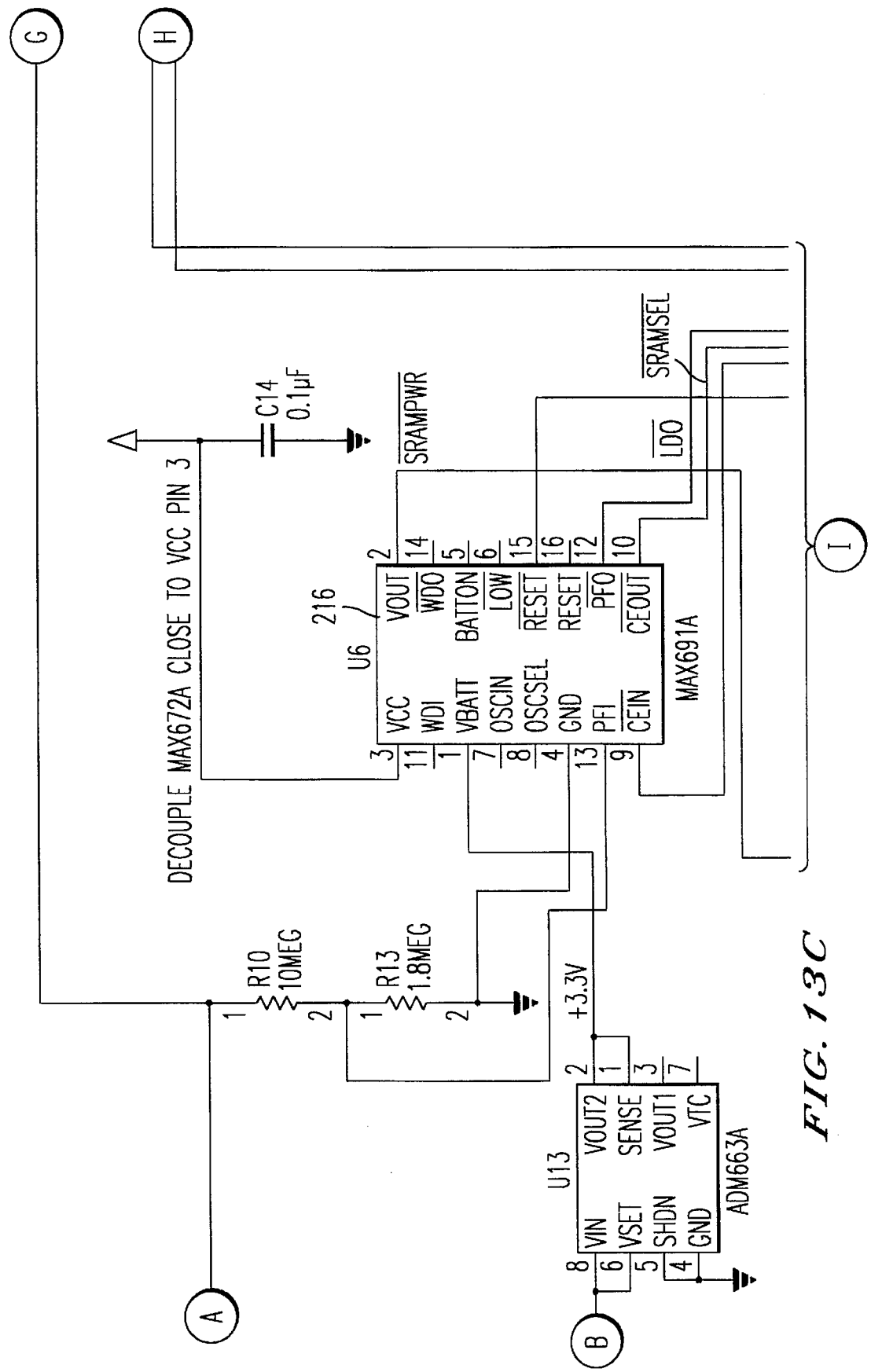
Figure 13D:
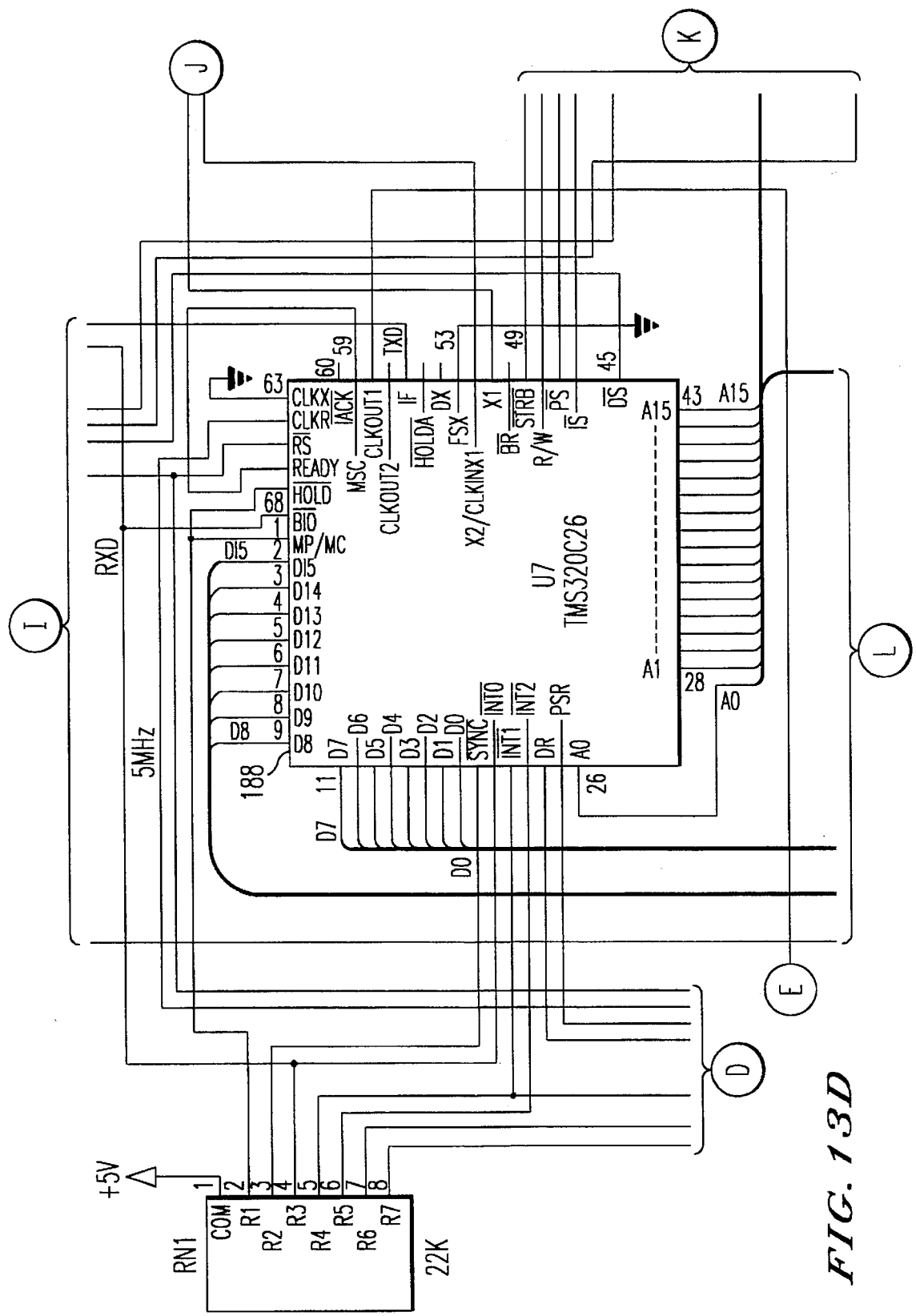
Figure 13E:
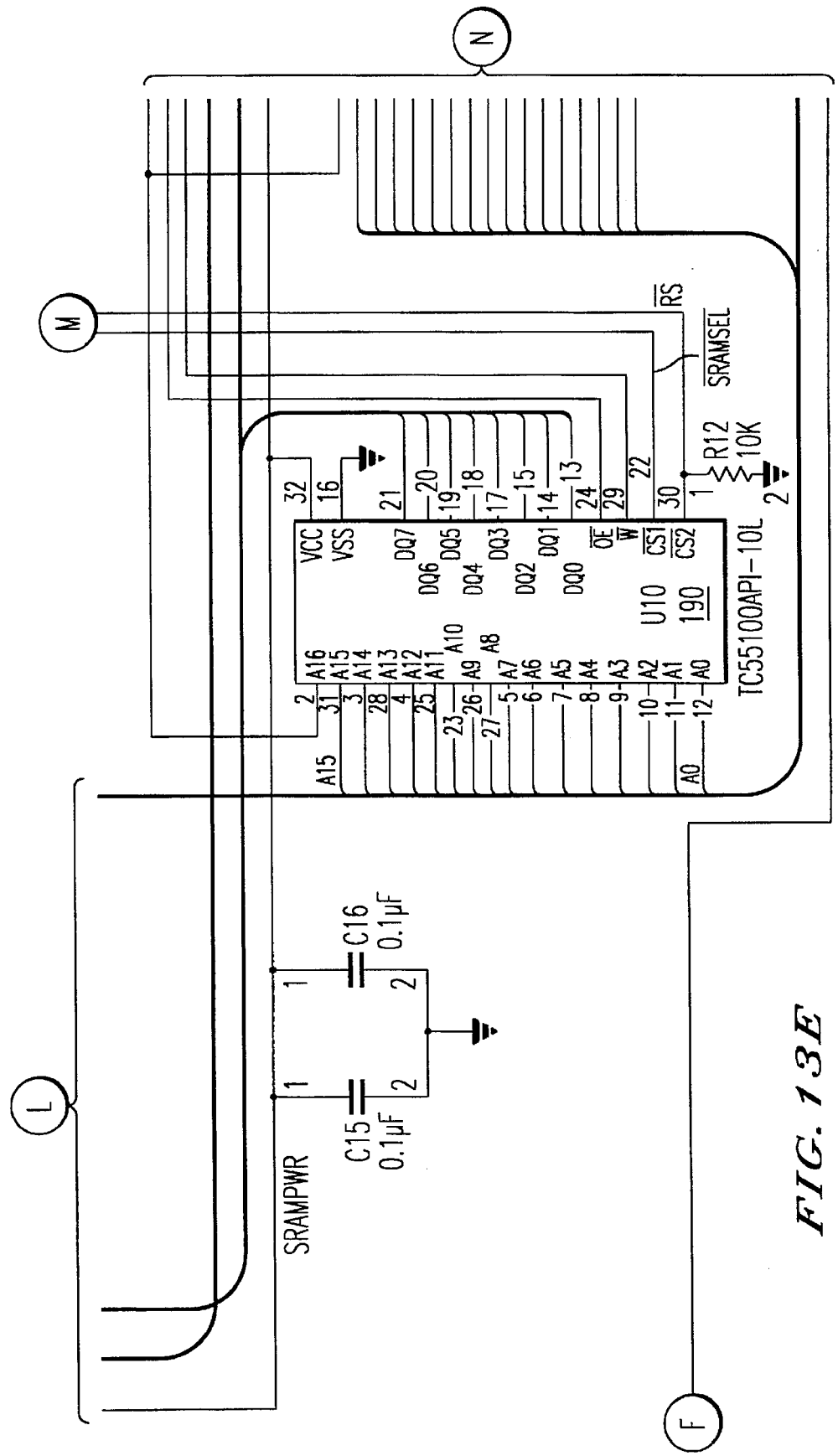

With continued reference to FIG. 3, a TEST switch 65 is provided on the capacitor unit 18 which can be manually actuated by an operator or lineman. The TEST switch 65 is preferably a double-throw, momentary push-type switch having one contact which bypasses the open MAIN POWER switch 63 and another contact which provides a test signal to the microprocessor 188 (FIG. 13D). The TEST switch 65 can therefore be used without unshunting the capacitor 44. Once the TEST switch 65 is actuated, that is, the lineman depresses the button and holds it momentarily, the microprocessor 188 commences a subroutine whereby it flashes the LEDS 56, 58 and 60, drives the buzzers 62 and 64, performs a checksum operation on the memory devices (e.g., the static random access memories (SRAMS) 190 and 192 and the ultraviolet programmable read-only memory (UVPROM) 194), among other test functions. Further, a voltage divider is provided on the circuit board 186 in lieu of the voltage divider 42.

Figure 4:
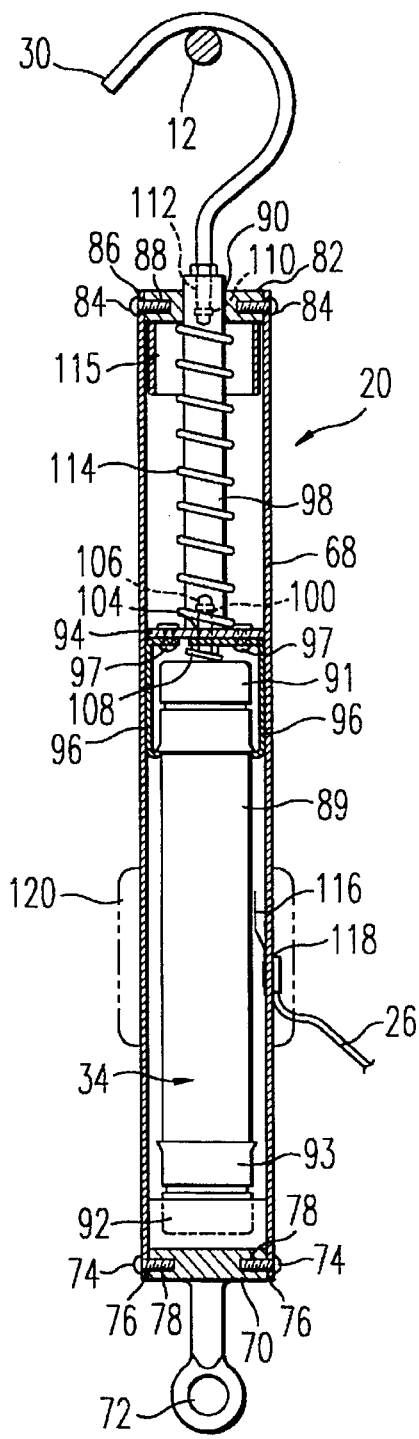
FIGS. 4 and 5 are cross-sectional views of the switch unit of the fault detection system depicted in FIG. 1 shown in open and closed positions, respectively.
Figure 5:
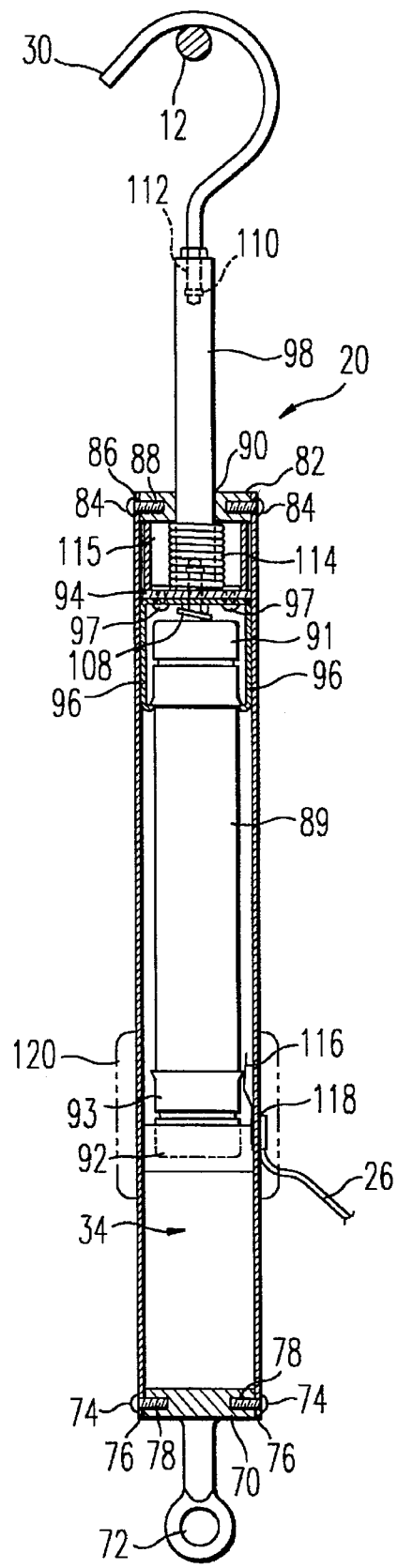
Figure 6:
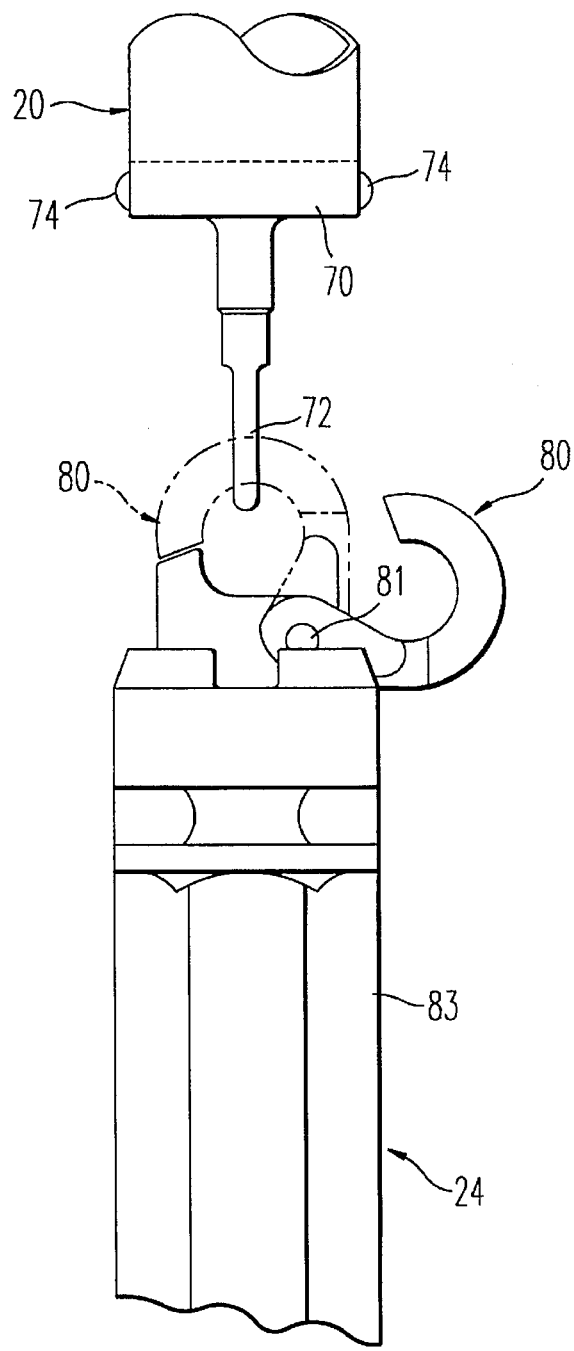
FIGS. 6 and 7 are partial, cross-sectional views of the switch unit of the fault detection system and the hot line tool depicted in FIG. 1 illustrating, respectively, the hot line tool disengaged and engaged with the switch unit.
Figure 7:
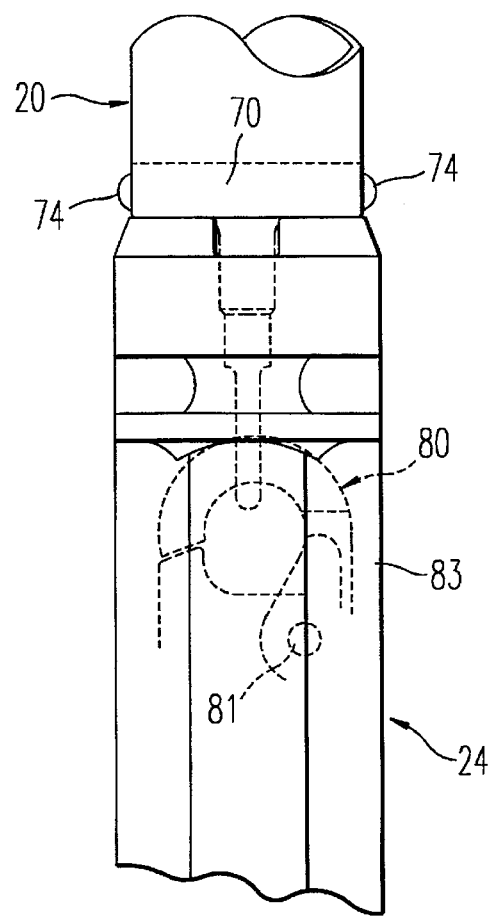

FIGS. 4 and 5 show the switch unit 20 with the discharge switch 32 in the open and closed positions, respectively. The switch is preferably configured with a cylindrical housing 68 made from an insulative material such as fiberglass or the same material used in the hot line tool 24. The bottom end of the housing comprises a plug 70 with an integrally molded eye 72. The plug 70 is secured within the housing in a conventional manner such as by one or more screws 74. Each screw 74 extends through an aperture 76 in the housing 68 into a corresponding recess 78 in the side of the plug 70. The eye 72 is adapted to fit over a hook-shaped member 80 extending from the end of the hot line tool 24, as shown in FIG. 6. The hot line tool can be, for example, the model no. C403-0294 manufactured by A.B. Chance of Centralia, Mo. The hook-shaped member 80 is pivotable about a hinge member 81 so as to be disposed in an open or closed position, as indicated by the solid and broken lines, respectively. The hot line tool 24 comprises a cylindrical housing 83 made of fiberglass or other insulative material. The hook-shaped member 80 is retractable inside the housing 83, as shown in FIG. 7. To mount the switch unit 20 on the end of the tool 24, the lineman inserts the hook-shaped member 80 of the hot line tool through the eye 72 and slides the hot line tool mechanism until the hook-shaped member is in a closed position. The lineman then continues to slide the mechanism on the hot line tool until the plug 70 abuts the end of the hot line tool, as shown in FIG. 7. The housing 83 provides sufficient longitudinal and lateral support for the switch unit 20 to enable the lineman to position the switch unit 20 on the test line 12. The lineman subsequently pulls on the hotline tool to activate the switch 32.

With continued reference to FIGS. 4 and 5, the other end of the housing is also provided with a plug 82 that is secured within the housing in a conventional manner such as one or more screws 84. Each screw 84 extends through an aperture 86 in the housing 68 into a corresponding recess 88 in the side of the plug 82.

The plugs 70 and 82 enclose the fuse 34 within the housing 68. The fuse 34 is slideably supported within the housing 68. The fuse comprises an insulative midsection 89 and conductive cover members 91 and 93 at the respective ends thereof. An insulated cap 92 is engaged with the cover member 93 via set screws. The flanged lower portion of cover member 91 provides latching to a conductive disk 94 by four clips 96, of which two are shown in FIG. 5. Each clip 96 is secured to the disk by a screw 97. The disk 94 is secured to a cylindrical shaft 98 by a screw 100. The shaft 98 is made from a conductive material. The screw 100 extends through an aperture 104 in the center of the disk 94 into a recess 106 in the shaft 98. A compression spring 108 encircles the screw 100 and is spring-biased against the cover member 91 to complete an electrically conductive path between the fuse 34 and the cylindrical shaft 98. Spring 108 also creates an additional current path between each clip 96 and edge of 91.

The cylindrical shaft 98 extends through the aperture 90 in the plug 82 and is slideably engaged therewith. The hook 30 is provided at one end thereof with threads 110 for functioning as a screw for securing the hook within a recess 112 in the cylindrical shaft 98. The hook 30 is made of an electrically conductive material and curved at the opposite end thereof to engage the test line 12, as shown in FIGS. 4 and 5.

A spring 114 is placed around the cylindrical shaft 98 and freely supported within the housing 68 between the upper plug 82 and the disk 94. An inner tube 115 is secured to the disk 94 and is slidable within the housing 68 inside diameter. The tube 115 has a sufficient inner diameter for concentrically enclosing the shaft 98 and the spring 114 thereon. The spring 114 is shown in a decompressed state in FIG. 4 and in a compressed state in FIG. 5. As stated previously, the shaft 98 is configured to move freely through the aperture 90 in the upper plug 82. Thus, when a lineman pulls on the switch unit 20 via the hot line tool 24, the hook 30 and part of the cylindrical shaft 98 is extracted from the interior of the housing 68, as shown in FIG. 5, moving the fuse toward the plug 82 and compressing the spring 114. The inner tube 115 functions as a stop to prevent the fuse from advancing further.

Moving the fuse in this manner operates the discharge switch 32. The discharge switch 32 is preferably a spring-biased, elbow-shaped contact 116 extending through an aperture 118 in the side of the housing 68. The contact 116 and the end of the conductor 26 are held in place on the exterior of the housing 68 by conventional means such as a hose clamp 120 on the outside of the housing 68 or an adhesive or a screw extending through the aperture 118. An insulated wrap or cover protects connections of contact 116 and conductor 26 from physical damage or conductive contact. The contact 116 is preferably made from spring-tempered conductive metal. The discharge switch 32 is open when the contact is against the insulated midsection 89 of the fuse, as shown in FIG. 4. When the lineman pulls the switch unit 20 toward himself using the hot line tool 24 to discharge the capacitor 44, the fuse 34 is drawn toward the upper plug 82, as shown in FIG. 5. Accordingly, the conductive cover member 93, which now abuts the contact, completes an electrically conductive path to the test line 12 via the hook 30, the cylindrical shaft 98, the four conductive clips 96, the conductive disk 94, the fuse 34, the contact 116 and the conductor 26 through which the capacitor 44 can discharge.

FIGS. 8, 9, 10 and 11 are views of the capacitor unit 18. With reference to FIG. 8, the capacitor unit comprises a rectangular housing 124 for enclosing the capacitor 44, the high voltage power supply 48, and the batteries 46 for the power supply 48. A fiberglass rod 126 is secured within the housing 124 by two screws 128 and extends longitudinally therein to function as a vertical support member for other components mounted within the housing 124. The clamp 36 is secured through the exterior of the housing 124. The back side of the housing 124 has a slot that allows the clamp 36 to be against the rod 126. The top bolt 128 secures the housing top and the clamp 36 to the rod 156. The shunt bar 150, which is secured to the rod 126, serves as a vertical strap to hold the capacitor 44 against the rod 126. A strap 125 provides horizontal support for the capacitor against the rod. The clamp 36 is preferably a model no. CC600-1734 grounding clamp, manufactured by A.B. Chance Company of Centralia, Mo. The clamp 36 comprises three supporting arms 130, 131 and 132 which extend toward three corresponding apertures 134, 135 and 136 in the housing 124. The aperture 134 is configured to receive a flange member 138 on the end of the arm 130. The flange member 138 extends into the interior of the housing 124 and has an aperture 141, which is aligned with an aperture 129 in the rod 126 for receiving the screw 128. The other two arms 131 and 132 comprise flanges 139 and 140, which are secured to the exterior of the housing 124 by screws 142 and 143 in apertures 135 and 136, respectively.

The clamp 36 comprises a spring-biased movable upper jaw 144 and a lower jaw 145. The movable upper jaw 144 can be advanced or retracted away from the lower jaw 145 by operating an eye screw 137 in order to firmly grip the neutral conductor 22 between the upper and lower jaws. If test line 12 is not suspended, the capacitor unit can placed on the ground or a table top or other surface adjacent to the neutral conductor 22.

With reference to FIGS. 8, 9 and 10, the safety shunt switch 52 comprises a lever 146, which extends from the outside of the housing 124 interiorly through an aperture 148 to an L-shaped shunt bar 150. The lever 146 is made from an insulative material, and the shunt bar 150 is made from a conductive material. The interiorly extending end of the lever 146 is secured to one end of the shunt bar 150 in a conventional manner, e.g., two bolts 152 and 153 with nuts (not shown). The shunt bar 150 is pivotally mounted on a shaft 154 inside the housing 124 which extends into the rod 126. A spacing member 156 displaces the shunt bar a predetermined distance from the rod 126 for clearance purposes, and a nut 158 secures the shunt bar 150 on the shaft 154.

With reference to FIG. 10, the aperture 148 is configured to guide the movement of the free end of the lever 146 between SHUNTED CAPACITOR and OPEN CAPACITOR positions. The lever 146 can be turned by the lineman from the SHUNTED CAPACITOR position to the OPEN CAPACITOR position. When the lever is thus turned, the L-shaped shunt bar 150 is rotated about the shaft 154 and away from the positive capacitor terminal, as indicated by broken lines in FIG. 9. The lever 146 can be turned again to the SHUNTED CAPACITOR position to bring the shunt bar 150 back into contact with the positive terminal of the capacitor as shown in FIG. 9.

With reference to FIG. 11, the voltage divider 42 is secured to the exterior of the housing 124 by conventional means such as nuts and bolts 160 and is secured to the electronics assembly 40 via a BNC connector 162. Conductors 164 and 166 extend from the positive and negative terminals of the capacitor, respectively, through an aperture 168 in the housing to the corresponding terminals of the voltage divider 42. The voltage divider 42, as stated previously, transforms the high voltage across capacitor 44 terminals into low voltage power, e.g., between +5 volts and −5 volts, which is provided to the circuit board 186.

With continued reference to FIG. 11, the electronics assembly 40 is secured to the exterior of the housing 124 by conventional means such as nuts and bolts 163. The circuit board 186 is mounted in the rectangular housing 170 of the electronics assembly 40 in a conventional manner such as by a bracket and nuts and bolts (not shown). The red LED 56, the amber LED 58 and the green LED 60 are provided on the circuit board 186 and extend through three apertures 172, 173 and 174, respectively, in the housing 170. Further, at least one aperture 175 is provided in the housing 170 for each switch, e.g., the MAIN power switch 63, the TEST switch 65, or a separate power switch.

Figure 2:
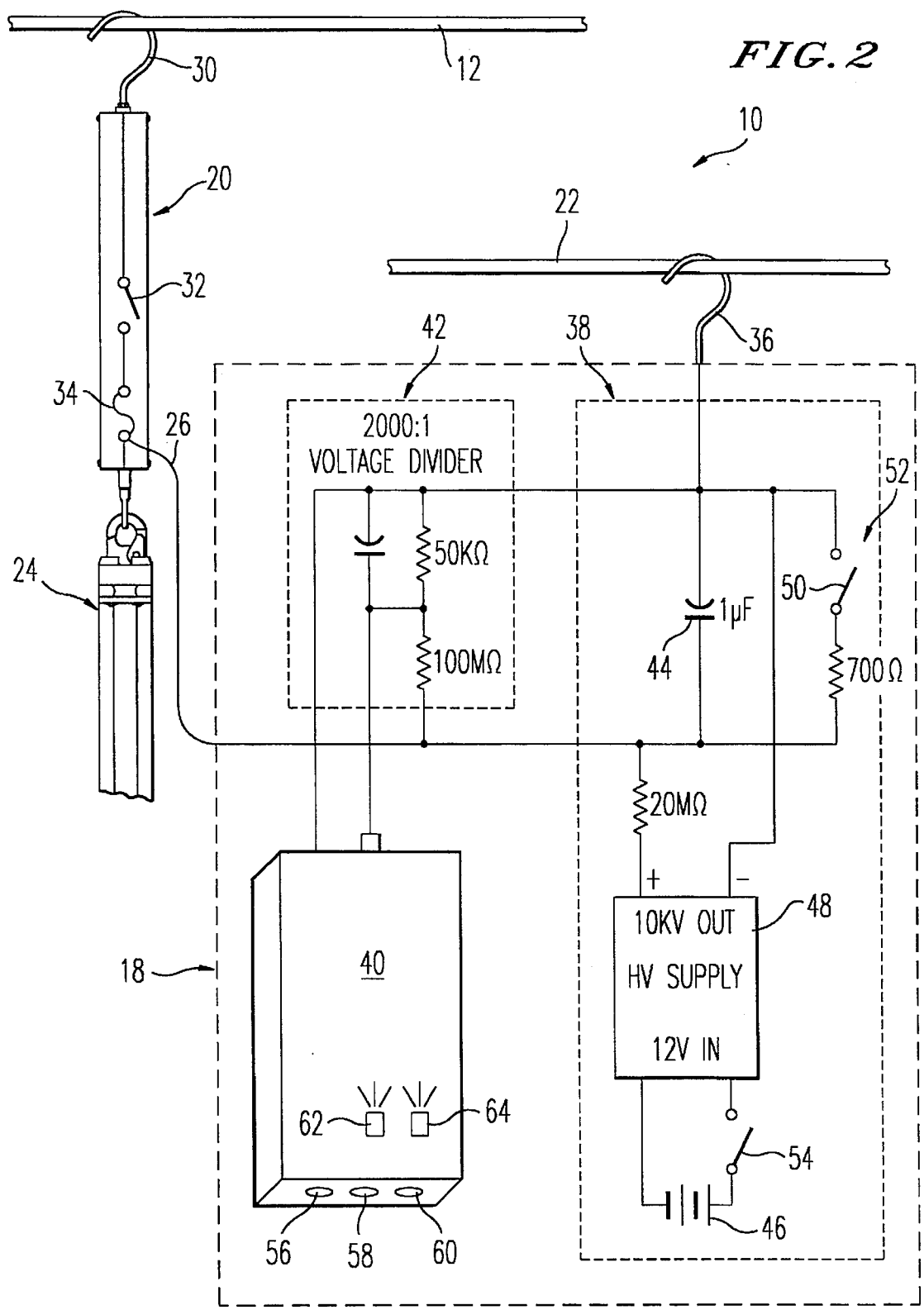
FIG. 2 is a diagram of the switch unit and the capacitor unit of the fault detection system depicted in FIG. 1.
Figure 12:
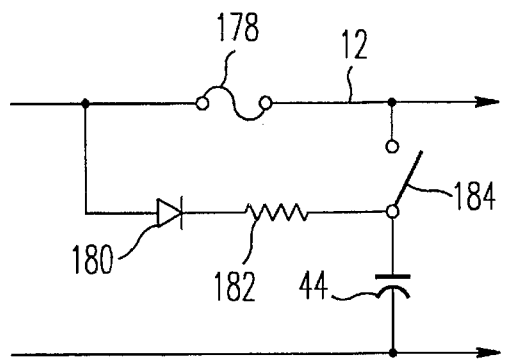
FIG. 12 is a diagram depicting a circuit for charging the capacitor unit using an energized line in accordance with an alternative embodiment of the present invention.

The capacitor unit is depicted in FIGS. 2 and 3 with its own power supply for charging the capacitor and supplying power to the circuit board. Alternatively, a charging unit can be installed externally to the capacitor unit, or an energized line can be used to provide power to the capacitor unit 18. For example, the capacitor 44 can be connected to the line side of the open cutout 178 of the test line 12 via a diode 180 and a 6 megohm resistor 182 connected in series, as shown in FIG. 12. The capacitor 44 charges until a switch 184 is closed to the test line 12.

The circuit board 186 will now be described in connection with the schematic diagram shown in FIG. 13A-13H. The circuit board 186 in FIGS. 13A-13H illustrates the embodiment of the fault detection system 10' described in connection with FIG. 3. Unlike the embodiment of the fault detection system 10 described above in connection with FIG. 2, the system 10' in FIG. 3 is characterized by microprocessor control of the high voltage power supply 48. The remaining components in FIGS. 13A-13H are essentially the same for either of the embodiments described in connection with FIGS. 2 and 3.

Figure 13F:
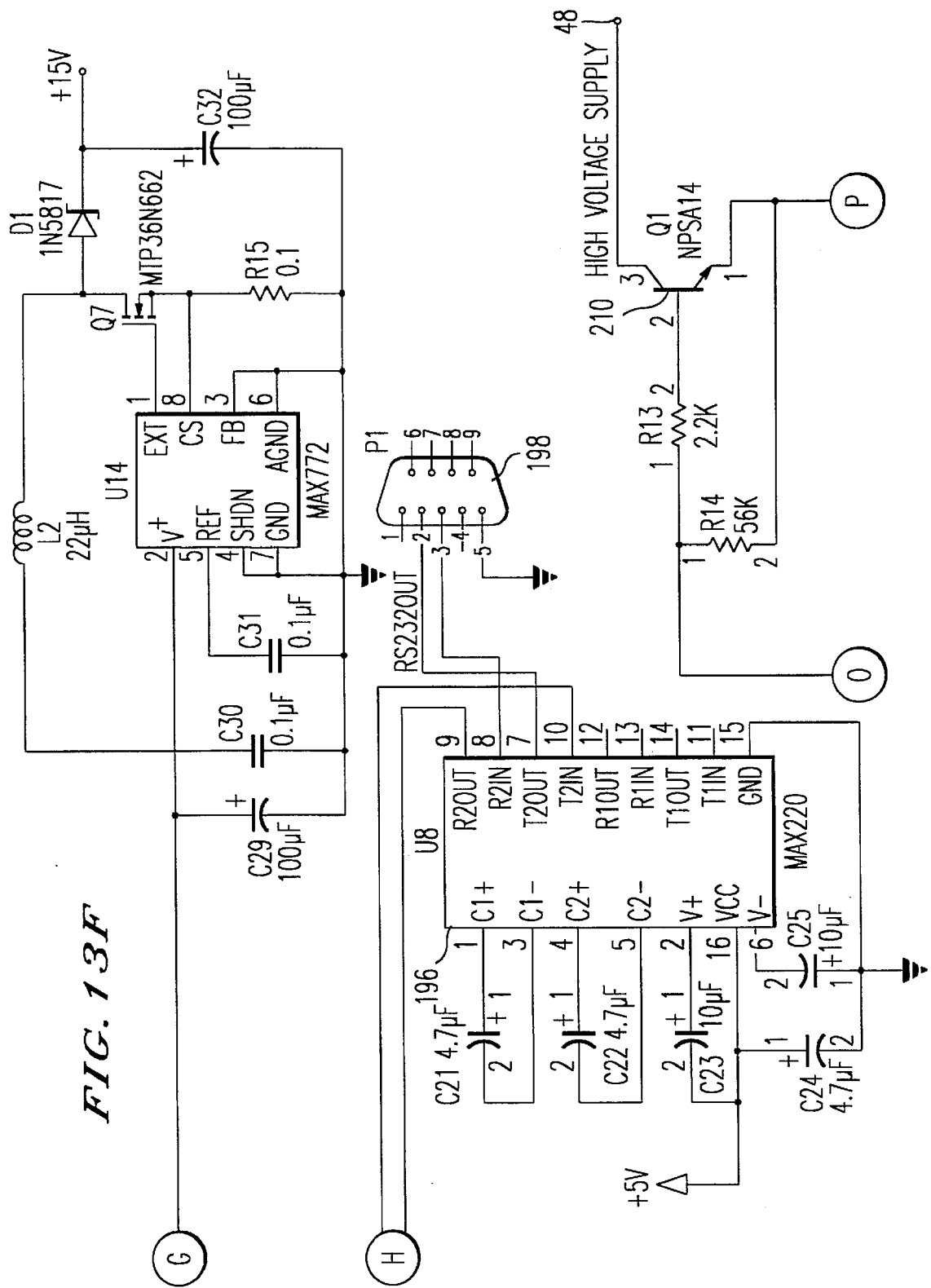
Figure 13G:
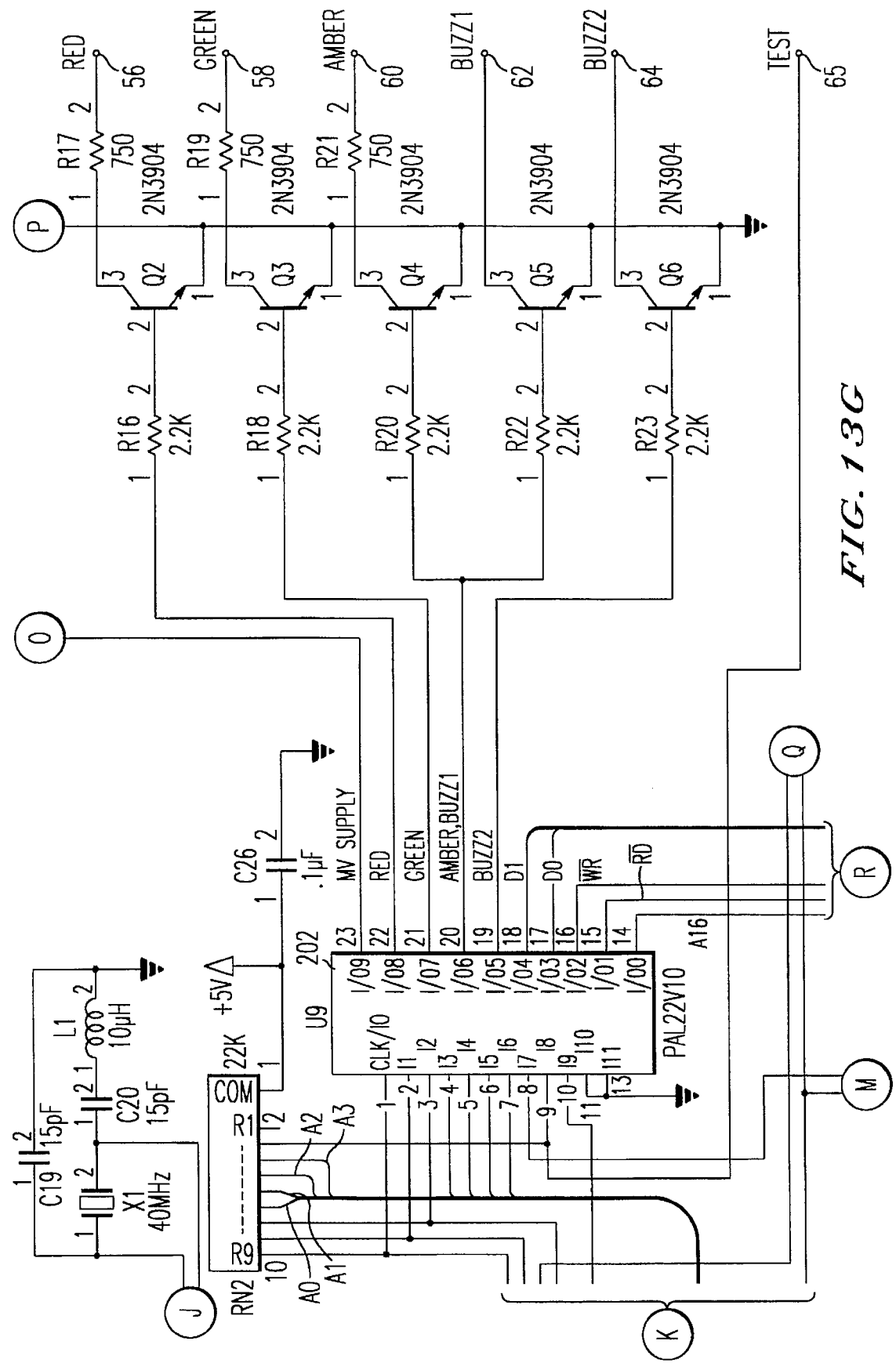
Figure 13H:
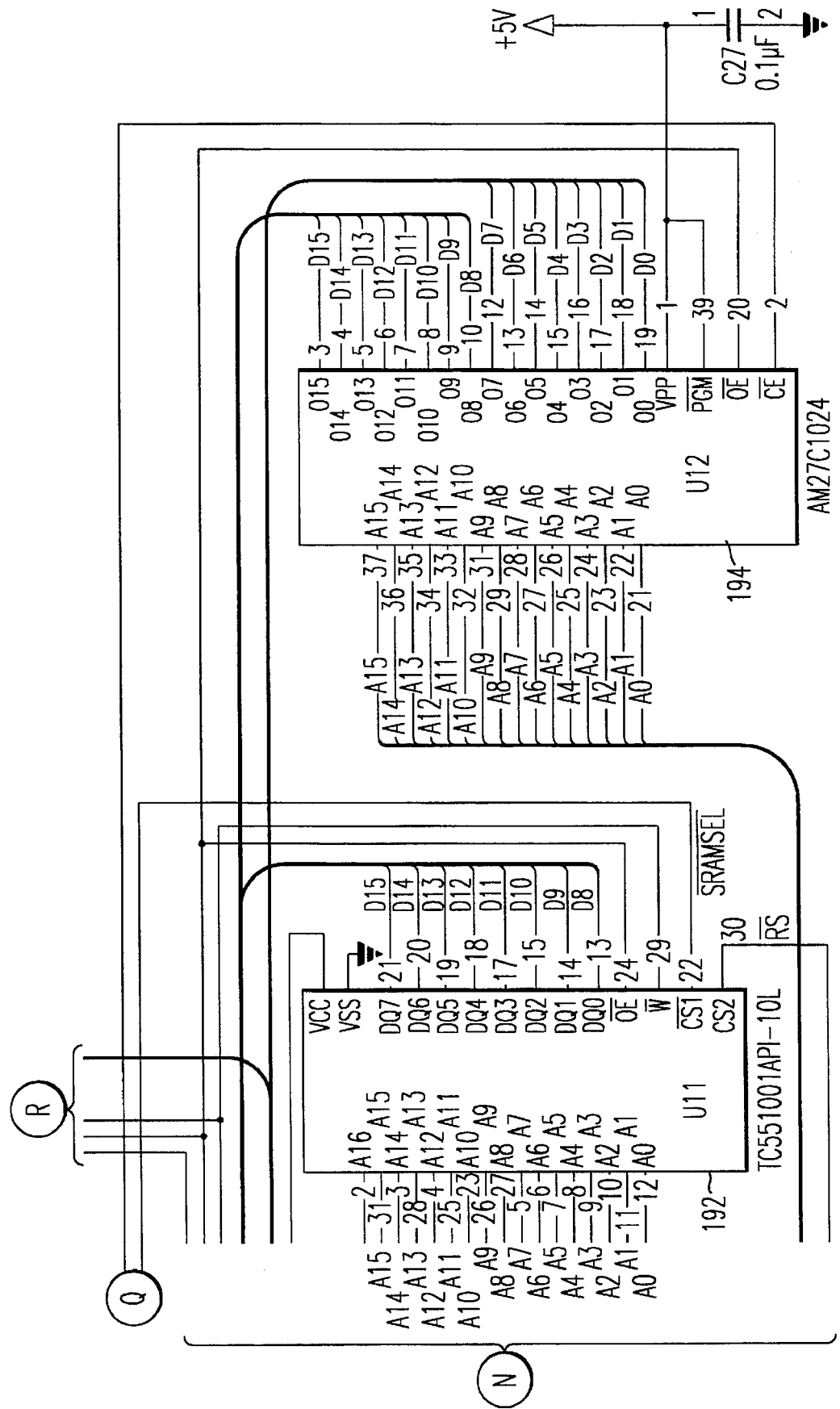

The circuit board 186 in FIGS. 13A–13H preferably comprises a microprocessor 188, SRAMs 190 and 192, and an UVPROM 194. The microprocessor 188 is preferably a model no. TMS320C26 manufactured by Texas Instruments, Dallas, Tex., although other processors can be used. The microprocessor 188 (FIG. 13D) is connected to an UVPROM 194 (FIG. 13H) which stores the program code for controlling the system 10' to operate in accordance with the present invention (e.g., for controlling the sampling process, and the fault detection process). The two 128K by 8 bit SRAMs 190 (FIG. 13E) and 192 (FIG. 13H) are used to store current and voltage samples, and Fast Fourier Transforms generated for these samples, as described below. The SRAMs are also used for storing data which can be downloaded to a computer (not shown) such as test data generated using the system 10'. The test data is provided to the computer via an RS232 interface 196 and serial port 198 (FIG. 13F).

With continued reference to FIGS. 13A–13H, the microprocessor 188 is connected to a single in-line package (SIP) resistive network 200 and a programmable array logic device (PAL) 202 (FIG. 13G) for providing output signals to the LEDs 56, 58 and 60, the buzzers 62 and 64 and the high voltage power supply 48. The PAL 202 is also connected to the TEST switch 65. The microprocessor is connected to another SIP resistive network 204 for receiving input signals from, for example, the charging switch 55.

As stated previously, the capacitor unit clamp 36 is configured to automatically and mechanically set up the capacitor 44 for charging when it is attached to the neutral conductor 22. The capacitor 44, however, is not enabled for charging until a lineman or operator actuates the charging switch 55. The microprocessor 188 monitors the pin to which the switch 55 is connected. When the pin is high, the microprocessor 188 sends an output signal to a solid state switch 210 (e.g., transistor Q1) via SIP 200. The switch 210 in turn actuates the high voltage power supply 48 to begin charging the capacitor 44.

After charging of the capacitor 44 is initiated, the microprocessor 188 is programmed to monitor the charge on the capacitor 44 via the output power from the voltage divider 42. The voltage divider 42 divides down the capacitor voltage to between −5 and +5 volts and supplies it to the amplifier 206 (FIG. 13A). As the capacitor 44 charges, the microprocessor generates and transmits an output signal via the PAL 202 to flash the amber LED 58. After the capacitor 44 is fully charged, the microprocessor generates and transmits an output signal via the PAL 202 to drive the amber LED 58 a solid color.

The power necessary to operate the components on the circuit board 186 is provided by one or more batteries, as indicated by terminal VBATT 211 (FIG. 13A). The battery output signal is provided to a voltage regulator 212 to generate a regulated +5 VDC signal. The regulated +5 VDC signal is provided to an amplifier 214, which generates −12 and +12 VDC signals. The −12 and +12 VDC signals are supplied to the analog circuitry, that is, the amplifier 206 (FIG. 13A) and the A/D converter 208 (FIG. 13B). A supply voltage supervisor circuit 216 (FIG. 13C), such as model no. MAX691 made by MAXIM, is provided for use as a reset controller and provides a necessary power up delay for the microprocessor. The supply voltage supervisor circuit 216 also forces a complete reset if the supply voltage decreases below predetermined tolerance levels.

Once the lineman sees the solid amber LED 58, lineman can actuate the discharge switch 32 on the switch unit 20.

Accordingly, the capacitor 44 discharges to create a pulse on the line 12. The responses to the pulse, that is, the reflected pulse waveforms signals generated when the pulse encounters various conditions on the line 12, as will be described below, are provided to the amplifier 206 and the A/D converter 208 via the conductor 26 on the positive terminal of the capacitor 44 and the voltage divider 42 connected to the capacitor 44.

A MAXIM A/D converter, model no. MAX121, is preferably used to provide A/D conversion up to 308 kHz. This A/D converter has an 14 bit serial data output. The 14 bit serial data output interfaces relatively easily to the microprocessor 188, which allows up to 16 bit serial data input. The data from the A/D converter 208 is imported to the microprocessor 188 through serial input ports and is stored in the SRAMs 190 and 192. The microprocessor analyzes the data stored in the SRAMs in accordance with an algorithm described in connection with the flow chart in FIGS. 41A, 41B and 41C. The microprocessor turns on the red or green LED according to the algorithm. PAL 202 is used to decode the microprocessor outputs to turn on the red, green or amber LEDs.

A method of distinguishing a faulted line from an unfaulted line in accordance with the present invention will now be described. The method is implemented using program code for the microprocessor described in connection with FIGS. 41A, 41B and 41C. As stated previously, the A/D converter 208 monitors the test line 12 and provides signal information to the microprocessor 188. The microprocessor 188 processes the signal information in accordance with an algorithm for fault determination stored in the UVPROM 194. The fault detection system is described for illustrative purposes for use on the stretch of a power distribution line extending between the fuses and the step down transformers which feed individual homes and businesses; however, as stated above, the fault detection system 10 or 10' can be used with any electrical conductor, whether it be on the supply or load side of an electrical system. These stretches of line are hereinafter called laterals and can have a multitude of configurations. They can be of any length up to typically about 10 miles and can contain branches. Laterals have at least one unterminated end and a distribution of transformers. When weather or other unfavorable conditions cause a lateral fuse to blow, there may be a fault which does not clear by itself, i.e., without intervention of a lineman. Another important property of the distribution lateral is its characteristic impedance. The characteristic impedance is defined as the proportionality between a voltage pulse traveling on a line and the corresponding current pulse traveling on that line. The characteristic impedance ($Z_0$) of the typical distribution lateral is approximately 400Ω.

During a fault test, a pulse traveling down a line can encounter any or all of the following in a variety of combinations: a branch, a fault, the end of the line, or a transformer. Each of these features, and the effect these features have on a square transient pulse traveling down the line will now be discussed. For this discussion, the lateral is treated as lossless.

A branch is a point where the power line branches in two or more directions (FIG. 14A). For the ease of branching in two directions, the result is a node that is attached to three lines in parallel. Since the power line has a characteristic impedance of 400Ω, two of the lines in parallel appear as 200Ω to the pulse (FIG. 14B) traveling down the original line. The result is that a portion of the pulse is refracted and a portion of it is reflected after the pulse reaches the branch, as shown in FIG. 14. The amount reflected is a function of the reflection coefficient (ρ) of the two parallel lines.

$$\rho = \frac{Z_L - Z_O}{Z_L + Z_O} \quad (1)$$

where $Z_L$ is the terminating impedance and $Z_O$ is the characteristic impedance.

FIGS. 14A, 14B and 14C show the branch, and the result of a pulse running into a branch. In this case, $Z_L=200\Omega$ which produces a reflection coefficient ($\rho$) of $-\frac{1}{3}$. If the incoming pulse has amplitude V, the reflected pulse has an amplitude of $-\frac{1}{3}$ V. The refracted portion is $V-\frac{1}{3}V=\frac{2}{3}$ V. The $\frac{2}{3}$ V pulse is transmitted down the two branches giving a $\frac{2}{3}$ V pulse on each branch. Thus, shortly after the pulse reaches the branch, there are now three pulses on the line instead of just one (FIG. 14C).

In general, a fault which occurs on a distribution lateral is resistive and can be modeled as a resistor (FIG. 15A). When the pulse reaches a fault (FIG. 15B), a portion of it is reflected and a portion of it is refracted (FIG. 15C), depending on the resistive value of the fault. FIGS. 15A, 15B and 15C show the distribution lateral with a 100Ω fault on it. The 100Ω fault and the 400Ω line in parallel produce a $Z_L$ of 80Ω. Using 80Ω in equation (1), $\rho=-\frac{2}{3}$. If the input pulse has amplitude V (FIG. 15B), the reflected pulse has amplitude $-\frac{2}{3}$ V and the refracted pulse has amplitude $\frac{1}{3}$ V (FIG. 15C).

FIG. 16A shows an open-ended lateral, and FIGS. 16B and 16C show how reaching the end of a lateral line effects a pulse. The end of the line presents the impedance $Z_L=\infty$, so $\rho=1$. The result is that the entire pulse is reflected.

FIGS. 17A, 17B, 17C and 17D show the effects of a transformer plus a load on a pulse. It also provides the model for an exemplary transformer having a loaded secondary. Using this model, the complex impedance ($Z_L$) is $$Z_L = Z_{TRANSFORMER} = j\omega L1 + \frac{R1(R2 + j\omega L2)}{R1 + R2 + j\omega L2} \quad (2)$$

where $\omega = 2\pi f$ and $f$ = frequency (Hz)

and the reflection coefficient can be found.

$$\rho = \frac{j\omega L1 + \frac{R1(R2 + j\omega L2)}{R1 + R2 + j\omega L2} - Z_O}{j\omega L1 + \frac{R1(R2 + j\omega L2)}{R1 + R2 + j\omega L2} + Z_O} \quad (3)$$

Figure 18A:
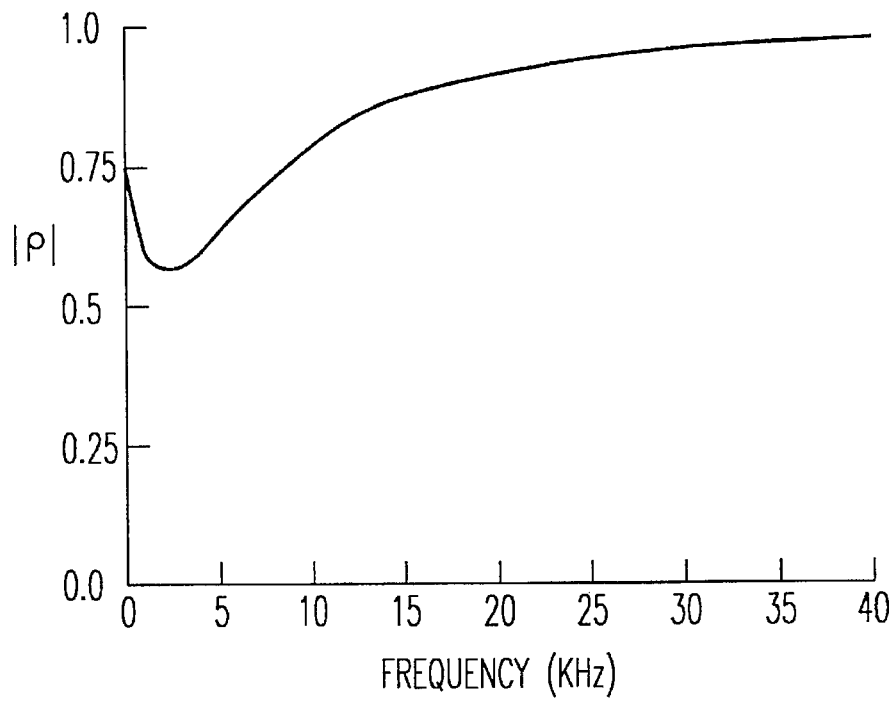
FIGS. 18A and 18B is a graph of the magnitude and angle of the reflection coefficient for the transformer versus frequency.
Figure 18B:
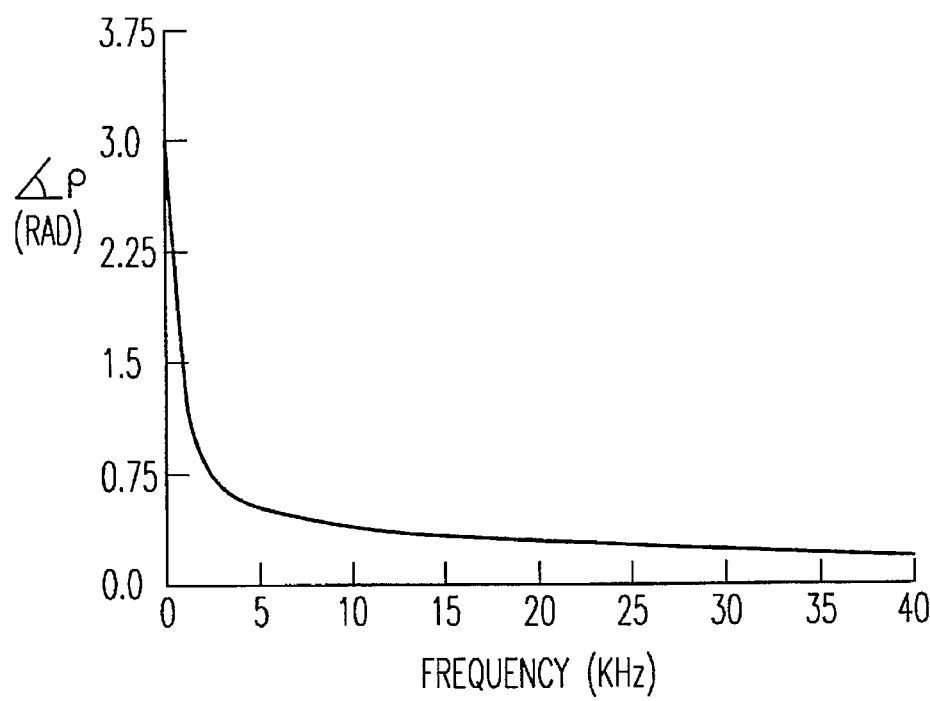

FIGS. 18A and 18B depict the reflection coefficient as a function of frequency from 0 to 40 kHz with L1=0.1 H, L2=0.46 H, R1=4000Ω, and R2=282Ω. Since $\rho$ is complex in this case, the magnitude and the angle in radians is given in FIGS. 18A and 18B, respectively. From these graphs, it appears that the transformer looks like an open-ended line. The magnitude of the reflection coefficient is very close to the value 1 at most frequencies.

The difference between the transformer and the open-ended line is primarily at low frequencies. The angle of $\rho$ is near $\pi$ radians at low frequencies, which means that the transformer looks like a low impedance at these frequencies. At higher frequencies, the angle of $\rho$ is small and positive, which means the transformer looks like a high impedance at these frequencies. If the transformer is on the end of the line, most of the pulse will be reflected. The shape of the pulse is changed slightly due to the charging and discharging as shown in FIGS. 17C and 17D. If the transformer is not at the end of the line, the pulse passes by the transformer with only a slight shape change and amplitude loss.

For several reasons, voltages in the 10,000 V range are generally necessary for finding faults on distribution laterals. One reason is that certain faults require voltages close to the operating line voltage to initiate breakdown to the point where current can flow. Another reason is that a large amount of energy is necessary so that the pulse can travel 5 or 10 miles and back without being overly attenuated.

Figure 19:
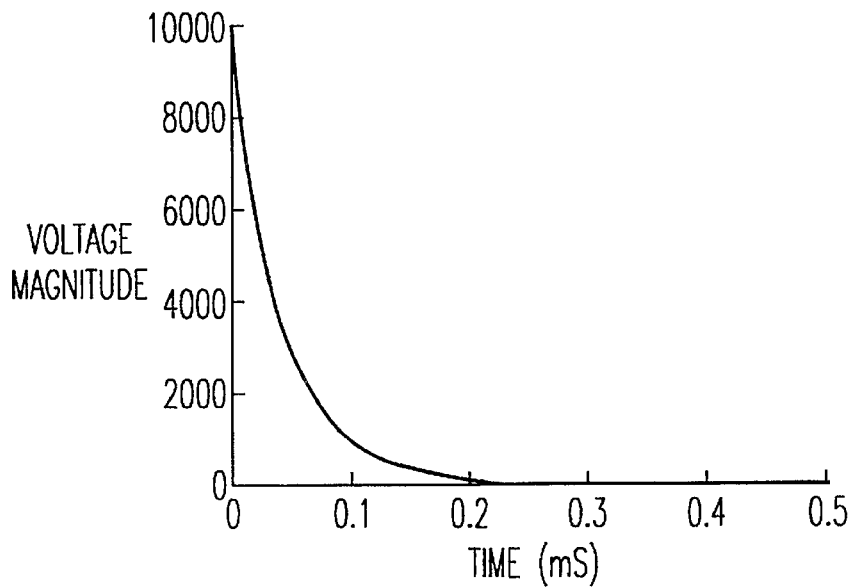
FIG. 19 is a graph of a pulse generated by a decaying capacitor.

Generating a square pulse at 10,000 Volts is probably impractical. One alternative is to use a discharging capacitor as a source for the pulse. FIG. 19 shows the time response of a 0.1 μF capacitor discharging into a 400Ω distribution lateral. The time response of the decaying pulse can be expressed using the following equation:

$$V(t) = V_0 e^{-\frac{t}{Z_O C}} \quad (4)$$

where $Z_O$ is the characteristic impedance of the line, C is the capacitance, and $V_0$ is the initial voltage.

The discharging capacitor pulse generation has a number of advantages. First and foremost, it is simple. The capacitor can be charged from the energized main line using a peak detection circuit such as that shown in FIG. 12, or from a power supply in the capacitor unit. After the capacitor is fully charged, it simply needs to touch the line. The capacitor then discharges and generates the pulse required for the fault test.

Another advantage is that the capacitor discharging method supplies adequate energy to send the pulse miles down the line and back. The energy of the pulse is given by the following equation:

$$E = \frac{1}{2} CV^2 \quad (5)$$

If C=0.1 μF and V=10,000 volts then the Energy (E)=5 joules. For maximum energy in the pulse, the capacitor should be chosen to be as large as possible.

Another advantage relates to the spectral components of the exponentially decaying pulse. The Fourier transform of V(t) from equation (4) is $$V(f) = \frac{V_0}{\frac{1}{Z_O C} + j2\pi f} \quad (6)$$

Figure 20:
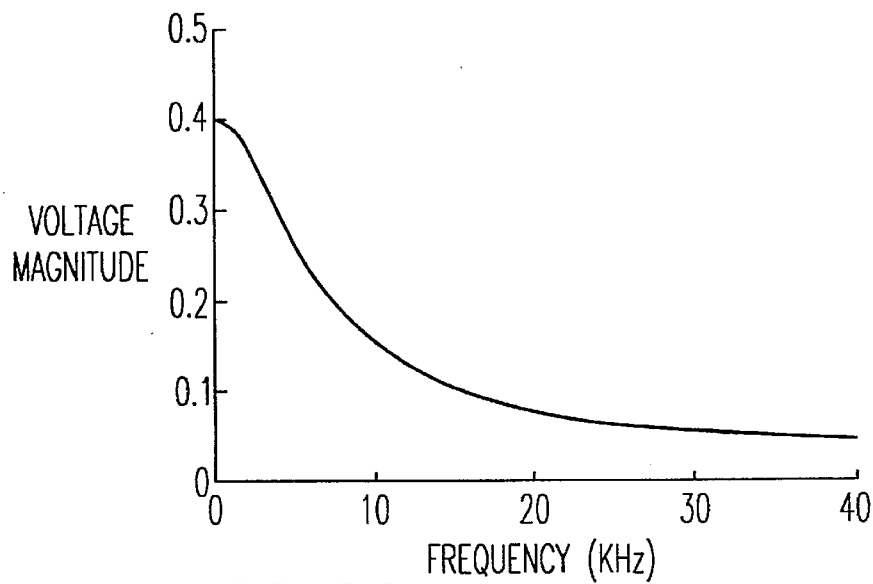
FIG. 20 is a graph of the frequency response of a pulse from discharging capacitor.

FIG. 20 shows the single-sided spectrum for this decaying pulse if $V_0$=10,000 volts, $Z_O$=400Ω and C=0.1 μF. The discharging capacitor provides almost uniform excitation at frequencies from 0 to 40 kHz. This excitation allows the use of the frequency domain approach to fault detection in accordance with the present invention.

As described above, Time Domain Reflectometry (TDR) is analogous to radar in that a pulse is sent out and the reflections generated by that pulse are detected and used. TDR appears to be a viable solution to fault detection whereby a pulse is sent down the distribution lateral being tested and the characteristics of the reflections are used to decide if the lateral is faulted. The fault, which is a low impedance compared to the 400Ω characteristic impedance of the line, produces a negative reflection. In contrast, an open circuit produces the opposite type of signal, that is, a reflected pulse with a positive amplitude. These fundamental differences between faulted and unfaulted laterals, however, cannot be solely relied upon for fault detection because of two basic aspects of the fault detection problem which make using time domain reflectometry an extremely difficult technical proposition. The first reason is the relatively short line distance (e.g., up to 10 miles). The second and more serious reason is the fact that most feeder lines contain branches.

The speed of a pulse down a transmission line is approximately equal to 186,000 miles/second. This means that the pulse travels approximately 1 mile in 5 μs. Reflections from a fault or a branch 1 mile away return to the source within 10 μs. As shown in FIG. 19, the pulse does not decay out for 200 μs. Thus, the reflected pulses will interact with the original pulse.

Figure 21:
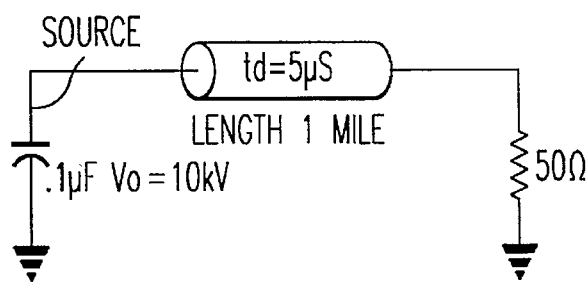
FIG. 21 is a schematic diagram of a capacitor discharging into a 400Ω line terminated with a 50 ohm resistor.
Figure 22:
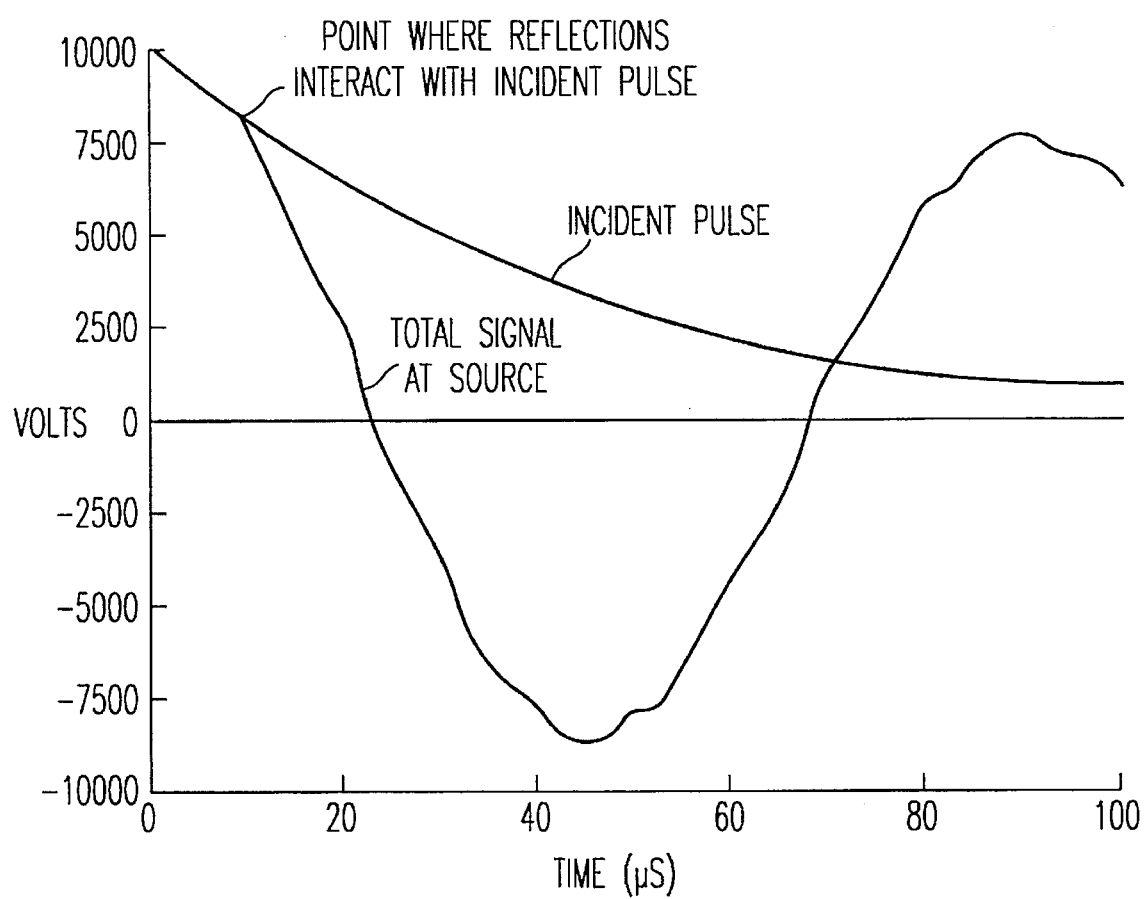
FIG. 22 is a graph depicting the effect on a reflected pulse of interactions between the source pulse and reflected pulse.

FIG. 21 shows a 0.1 μF capacitor discharging into a 400Ω transmission line which is 1 mile in length and is terminated in 50Ω. FIG. 22 illustrates the voltage waveform of the incident pulse and the total signal seen at the source, which includes the changes in shape due to the reflections. The first change of the signal from the incident trace occurs at 10 μs, which is the time required for the pulse to travel to the 50Ω termination and back. With reference to Equation (1), since 50Ω is less than 400Ω, the reflection coefficient is negative. The reflected pulse has a negative amplitude and subtracts from the incident pulse when it reaches the source. The second change in wave shape of the total signal occurs at 20 μs. This is caused by the second reflection. Twenty microseconds after the pulse is initiated, it has traveled to and from the 50Ω termination twice. This pattern continues until the pulse dies out.

FIG. 22 demonstrates the difficulty encountered when trying to use time domain reflectometry to make a decision about the line. The interaction between the incident pulse and the reflected pulse makes it difficult to decipher the characteristics of the reflected pulse. Even if it were possible to remove the incident pulse, the problem is still difficult because of interaction between the first reflection and subsequent reflections.

The pulse width of the decaying exponential can be shortened by choosing a smaller capacitor. This, however, is probably not a solution because the narrower pulse contains less energy. Equation (5) shows that the energy contained in the signal is directly proportional to the capacitor size. If the energy is decreased significantly, the pulse may not have enough energy to travel to the end of the line and back without being attenuated below useful levels.

A branch in a lateral creates two problems which may be insurmountable insofar as time domain reflectometry is concerned. One problem is simply that the branch and the fault both create negative reflections. The other problem is that the branch splits the pulse from one big pulse into two smaller ones.

For faults much less than 200Ω, the reflection coefficient is significantly more negative than for the branch, as described above. The problem is that the line may contain a branch and a fault. If the pulse reaches the branch point first, the pulse is split between the two branches. The pulses traveling down each branch are smaller. These smaller pulses can obscure the fault because the pulse that reaches the fault is smaller than the original pulse. In addition, the smaller reflection returning to the monitor point must pass the branch again. The branch diminishes the size of the reflected pulse even further. As a result, the reflection from the fault is much smaller than if original pulse had interacted with the fault. Since a large negative reflection is characteristic of the fault, anything that decreases the size of the reflection returning to the monitor point makes detection more difficult.

Another problem caused by a branch is that, instead of one pulse after interpreting a branch, there are now three pulses propagating on the lateral. This makes interpreting the reflections from the source more complicated.

Figure 23A:
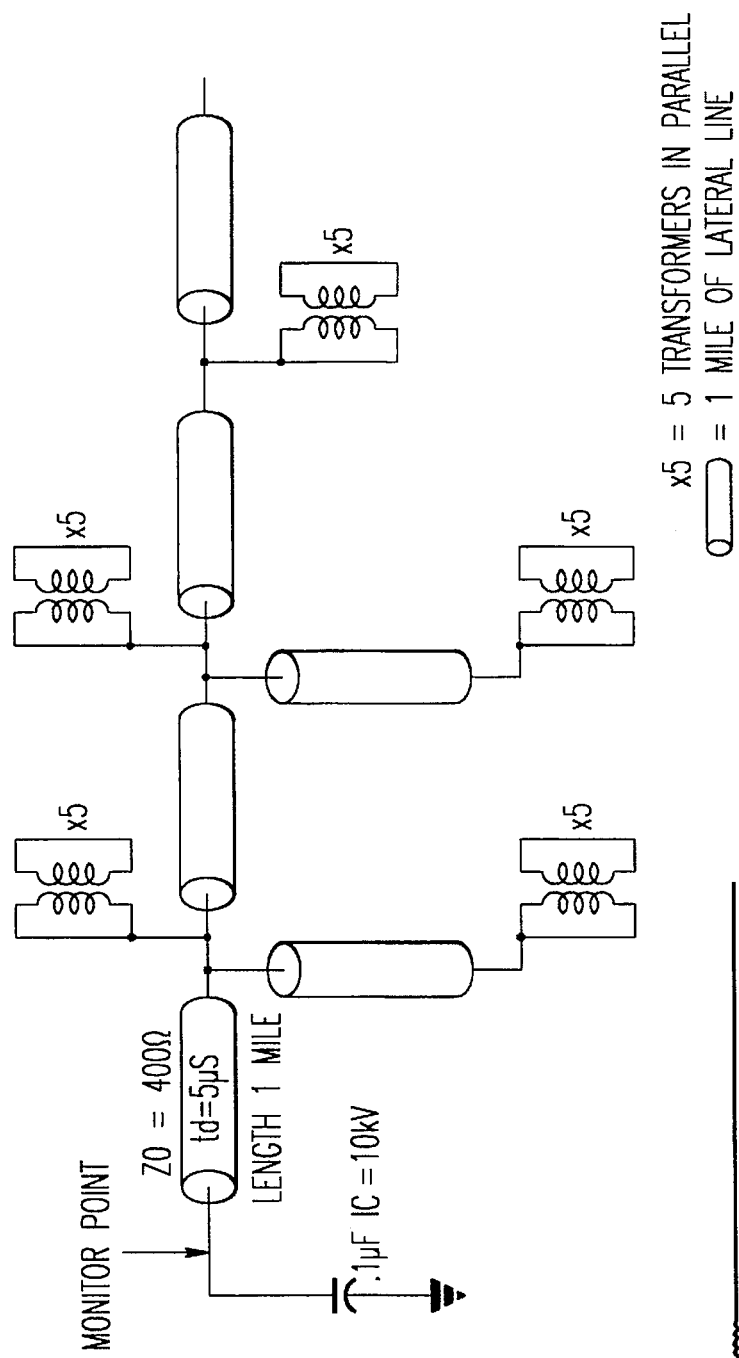
FIGS. 23A and 23B are, respectively, a schematic diagram of a typical distribution lateral and a graph of the voltage during a test on the lateral without a fault.
Figure 23B:
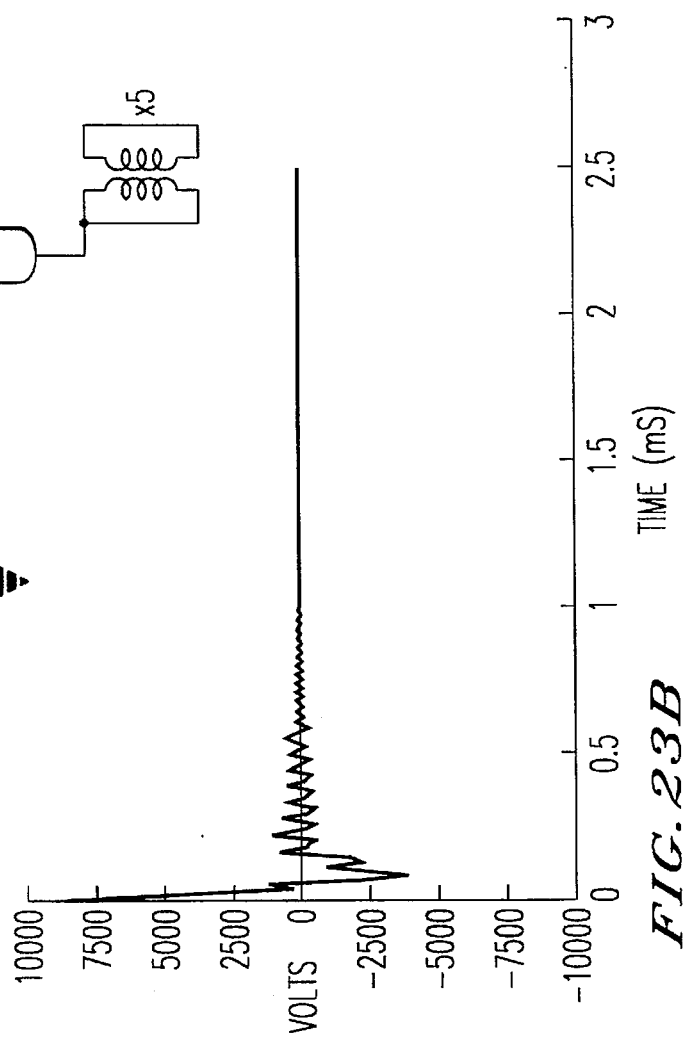

As an example, FIG. 23A shows a typical distribution lateral with heavily loaded transformers distributed throughout the line. FIG. 23B illustrates the time domain voltage waveform seen on the line from the source for a capacitor discharging into it during a test for the lateral without a fault. FIG. 24B shows the voltage for the lateral with a simulated 5Ω (FIG. 24A) fault on it.

An unfaulted distribution lateral has a certain input admittance. Since components on the line and the transmission line itself are reactive, this input admittance varies with the frequency of an input signal. In other words, if sinusoidal excitation of a certain frequency is placed on the line, the line is seen as a complex admittance at that frequency. If a fault which draws enough current to blow the fuse is placed on the line, the input admittance of the transmission line changes radically at certain frequencies. For example, for faulted lines, the input admittance increased at 60 Hz or else the fuse would not have blown. It is this difference between faulted and unfaulted lines which is used to identify faulted lines in accordance with the present invention.

The admittance versus frequency data is produced by the microprocessor in accordance with an algorithm which uses samples of the current waveforms and of the voltage waveforms as the capacitor 44 is discharged into the distribution lateral 12. This is why the frequency response of the capacitor discharging into the line is important. The capacitor 44 provides excitation at a large band of frequencies from a 0 Hertz or DC level to higher frequencies simultaneously. It is not possible to find the admittance at a certain frequency if there is no excitation at that frequency. The algorithm for calculating the admittance versus frequency preferably calculates the Fast Fourier Transform (FFT) of both the current and the voltage waveforms to obtain their corresponding frequency samples, and divides the current frequency samples by the voltage frequency samples.

A benefit of using this admittance versus frequency approach is avoidance of the problems associated with time domain reflectometry described above. The admittance versus frequency method of the present invention will now be described in further detail, including its derivation, how the method can be used to detect faults, and some examples.

To simplify the derivation, the distribution lateral is initially considered to be a lumped circuit rather than a distributed element. The assumption is that if frequencies are low enough and distances are short enough, transmission line effects can be neglected. Regarding laterals, viewing the distribution line as a lumped circuit is only partially true. Most of the time, neglecting transmission line effects produces useful results, but, in certain cases, transmission line effects are a significant part of the solution, as will be explained below.

Figure 25A:
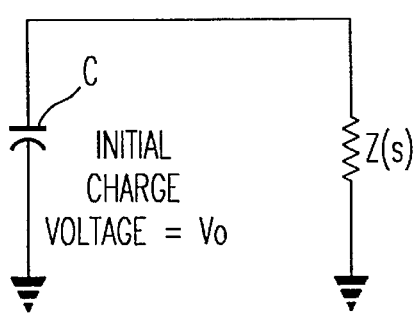
FIGS. 25A and 25B is a schematic diagram of an excited distribution lateral equivalent circuit and its Laplace equivalent circuit.
Figure 25B:
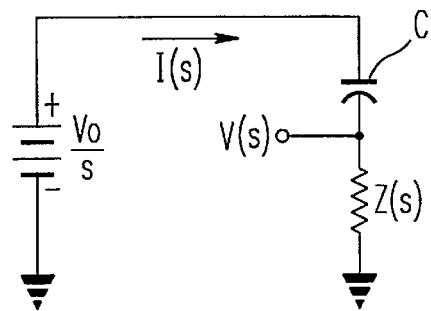

FIG. 25A shows the Laplace equivalent circuit for the distribution lateral during a test. Z(s) represents the input impedance looking into the distribution lateral and is equal to the reciprocal of the input admittance Y(s). The circuit of FIG. 25B takes into account the initial condition on the capacitor C and is an equivalent circuit to the circuit in FIG. 25A. This circuit can be solved to provide the complex input admittance for an arbitrary distribution lateral. The current I(s) is found using a node equation.

$$I(s) = \frac{\frac{V_O}{s}}{Z(s) + \frac{1}{sC}} = \frac{V_O}{s\left[Z(s) + \frac{1}{sC}\right]} \quad (7)$$

Similarly, V(s) is found using a loop equation and substituting for I(s).

$$\frac{I(s)}{sC} + V(s) = \frac{V_O}{s} \quad (8)$$

$$V(s) = \frac{V_O}{s} - \frac{1}{sC} * \frac{V_O}{s\left[Z(s) + \frac{1}{sC}\right]}$$

Simplifying V(s) further produces $$V(s) = \frac{V_O s\left[Z(s) + \frac{1}{sC}\right]}{s^2\left[Z(s) + \frac{1}{sC}\right]} - \frac{\frac{V_O}{C}}{s^2\left[Z(s) + \frac{1}{sC}\right]} = \frac{V_O * Z(s)}{s\left[Z(s) + \frac{1}{sC}\right]} \quad (9)$$

Using the current and voltage equations, the admittance as a function of s is as follows:

$$Y(s) = \frac{I(s)}{V(s)} = \frac{s\left[Z(s) + \frac{1}{sC}\right]}{V_O * Z(s)} = \frac{1}{Z(s)} \quad (10)$$

For signals that have a Fourier transform, the complex admittance is found from Y(s) by substituting jω for s.

$$Y(j\omega) = \frac{I(j\omega)}{V(j\omega)} \quad (11)$$

where I(jω) is the Fourier transform of I(t), and V(jω) is the Fourier transform of V(t).

The derivation above shows that if the Fourier transform exists for the current and voltage waveforms generated by the capacitor discharge test, then the complex admittance can be calculated from them. The current and voltage signals generated during this test are decaying exponential signals. These signals always converge to zero in a fixed period of time, therefore, they are energy signals and have Fourier transforms.

The Fourier transforms for the current and voltage sampled signals are generated using an FFT algorithm. The FFT of these exponentially decaying signals will approximate the Fourier transform of the signals as long as the sampling window is sufficiently long enough and the sampling rate is sufficiently fast enough. As a result, the following equation is true.

$$I(j\omega) = FFT[I(t)], \; V(j\omega) = FFT[V(t)] \quad (12)$$
$$Y(j\omega) = \frac{FFT[I(t)]}{FFT[V(t)]}$$

Figure 26:
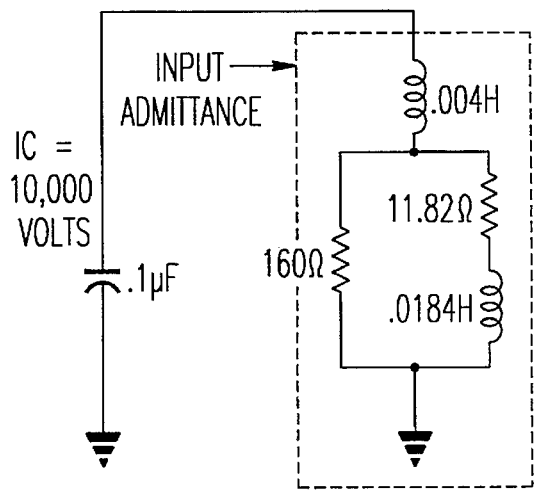
FIG. 26 is a schematic diagram of a capacitor discharging into a network.
Figure 27:
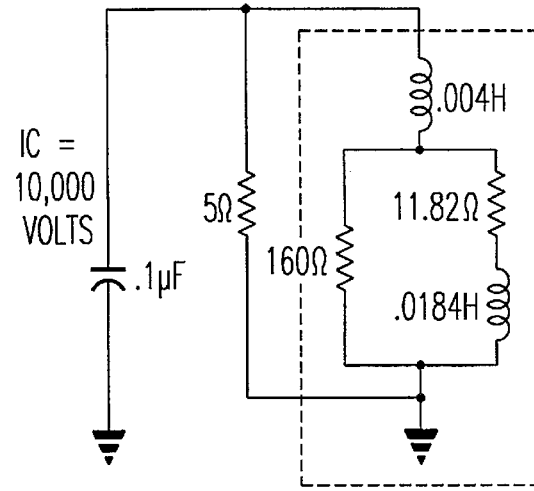
FIG. 27 is a schematic diagram of a network with a parallel 50 ohm fault.
Figure 28A:
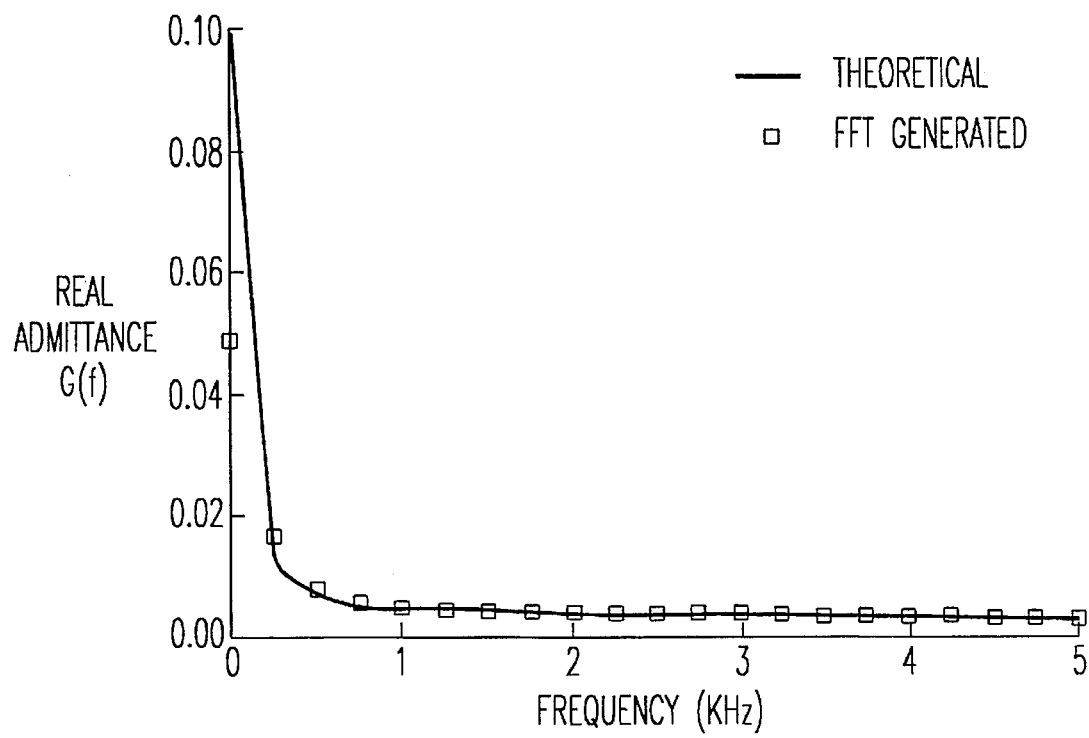
FIGS. 28A and 28B are graphs illustrating a comparison of admittance versus frequency for a simulated unfaulted lateral.
Figure 28B:
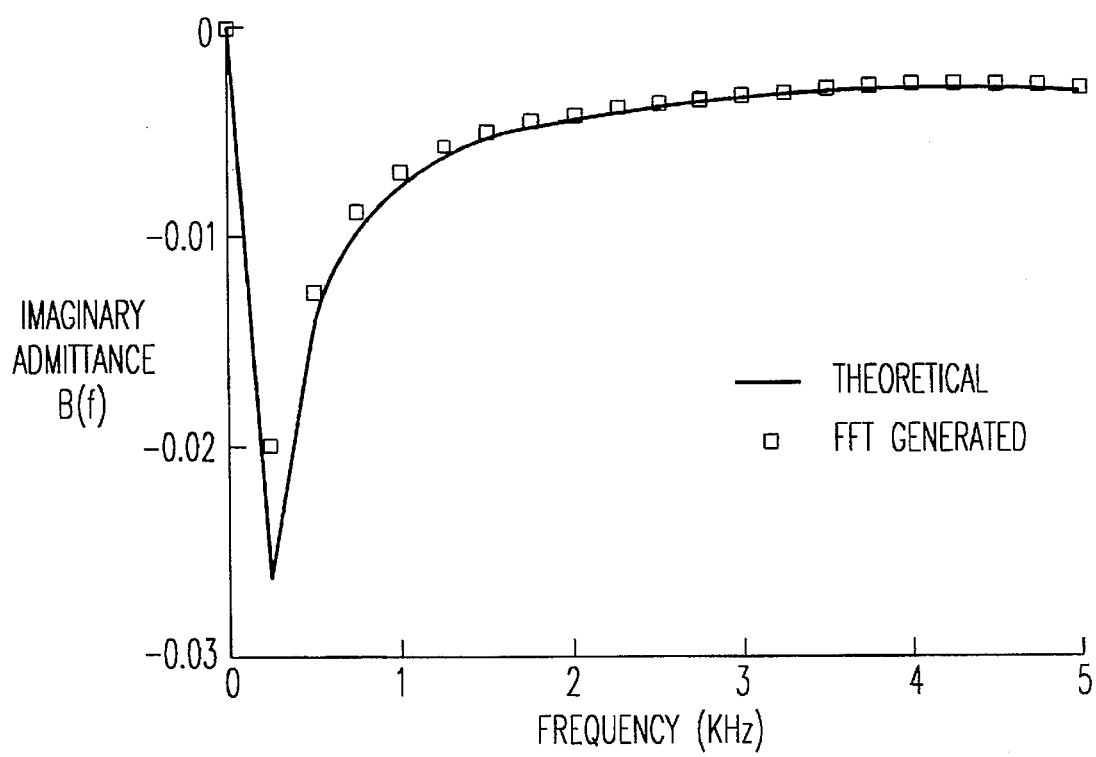

Equation (12) will now be used with exemplary unfaulted and faulted circuits in FIGS. 26 and 27, respectively. FIG. 26 shows an exemplary circuit which represents a capacitor discharging into a resistive and inductive network. This network is a model for a distribution lateral with a large number of loaded transformers attached to it. It shows what would be left if all of the transmission line were removed from it. In other words, this network is equivalent to an unfaulted lateral if the transmission line is neglected. To demonstrate the effectiveness of the admittance versus frequency method of the present invention in finding faults, the circuit in FIG. 26 was simulated using PSPICE software developed by Microsoft Corporation. Current and voltage samples were generated every 2 μs which is equivalent to sampling at 500 kHz. The admittance versus frequency for this network was then calculated using equation (12). FIGS. 28A and 28B show the results of these calculations. Both the real part G(f) and the imaginary part B(f) of the admittance are given in FIGS. 28A and 28B, respectively. The squares represent the discrete frequencies generated by the FFT approach. For comparison, the graph also shows a continuous line corresponding to theoretical values. The theoretical values were generated in MATHCAD by solving the network for its admittance and graphing it as a function of frequency. FIGS. 28A and 28B illustrate the agreement between the two approaches.

Figure 29A:
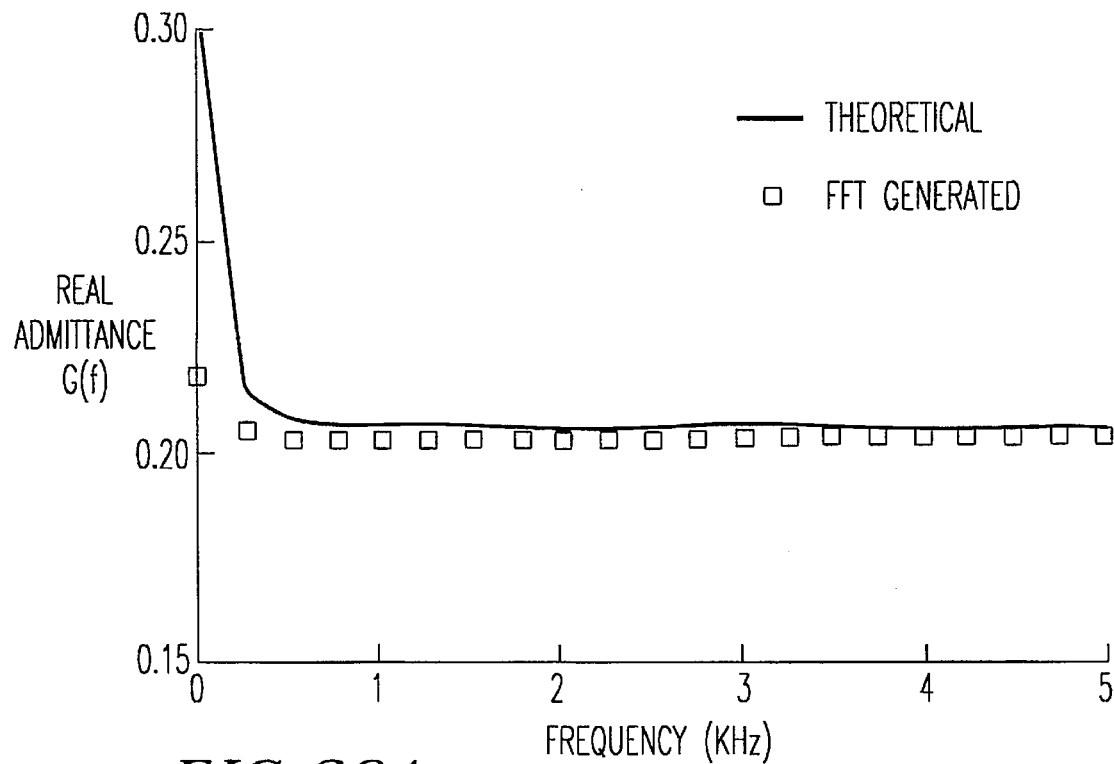
FIGS. 29A and 29B are graphs illustrating a comparison of admittance versus frequency for simulated faulted lateral.
Figure 29B:
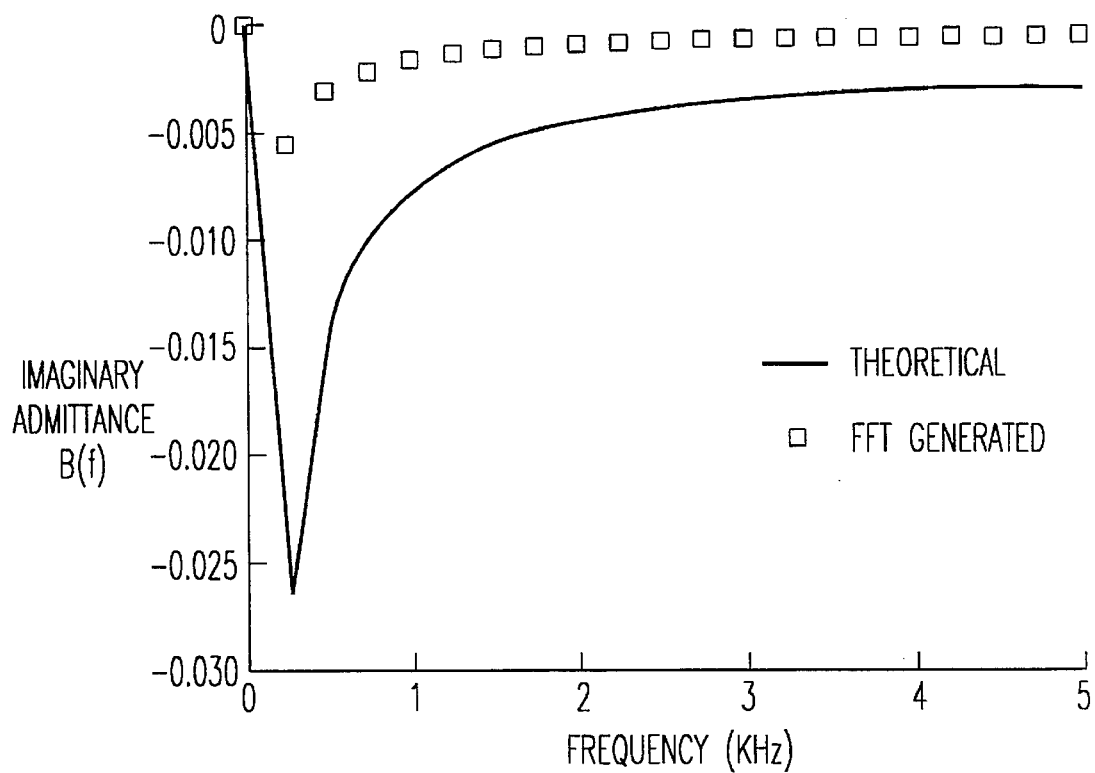

The circuit of FIG. 27 is the same as the circuit of FIG. 26, except that a simulated 5Ω fault is added. The same procedure as described above was repeated for this network. The results are shown in FIGS. 29A and 29B.

There are two aspects regarding the faulted case on which to comment. First, a large change in the real part of the admittance occurs from the unfaulted case to the faulted case at frequencies just above DC. This is the expected response that discriminates the fault, since the fuse would not blow if the input admittance did not increase for the circuit. Secondly, the agreement between the theoretical and the FFT generated is not as good in the faulted case. The reason for this is that the decay of the signals in the faulted case is so sharp that higher frequencies are introduced. In order to get a more accurate answer in the faulted case, a higher sampling rate is required to overcome the problem of aliasing, which is discussed in more detail below.

So far, the discussion of the admittance versus frequency method has, for the most part, ignored transmission line effects. The transmission line effects at certain frequencies of interest will now be considered. Even though the frequencies are low and the distances are short for certain loads, the transmission line causes a dramatic effect.

The effects of a given load element, located a given distance down the transmission line, on the input admittance of the line can be approximated using the following equation:

$$Y(l) = \frac{Z_0 + jZ_L \tan(\beta l)}{Z_0(Z_L + jZ_0 \tan(\beta l))} \quad (13)$$

$$\beta = \frac{2\pi}{\lambda}, \; \lambda = \frac{c}{f}, \; c = 186{,}000 \frac{mi}{s}$$

where Y(l) is the input admittance as a function of the distance between $Z_L$ and the source 1, $Z_L$ is the load impedance, and $Z_0$ is the characteristic impedance of the line. This equation takes into account the effects of a lossless transmission line and predicts the resulting admittance that is seen at the source due to the load.

Figure 30A:
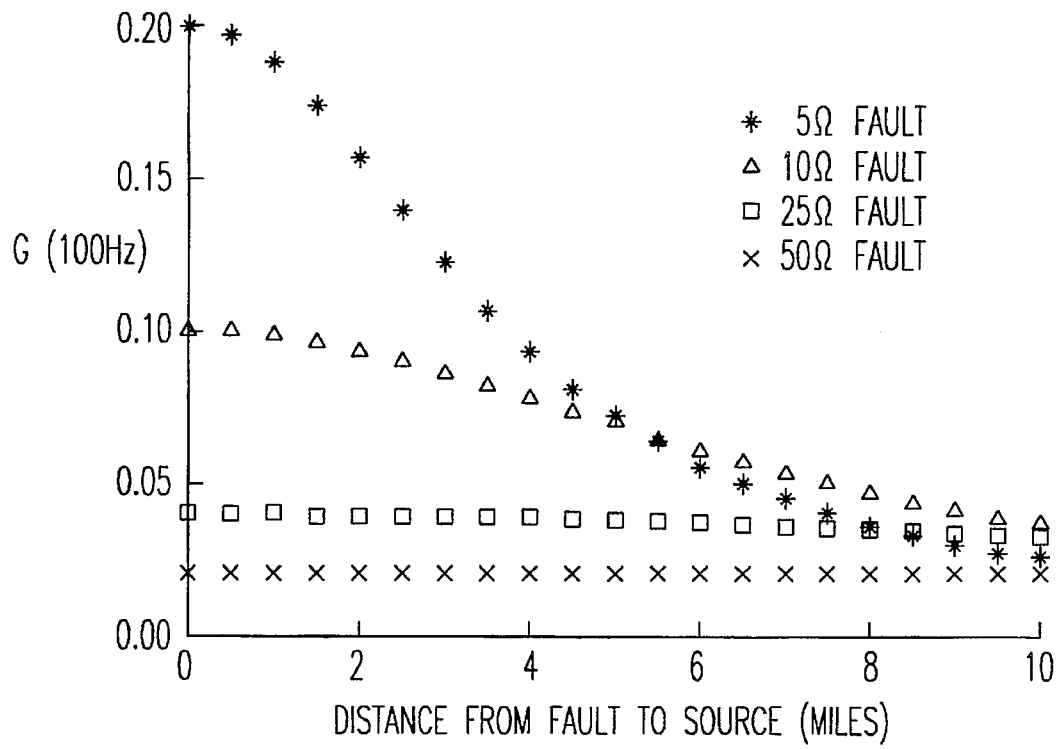
FIGS. 30A and 30B are graphs illustrating the complex admittance at 100 Hz for various faults as a function of the distance from the source.
Figure 30B:
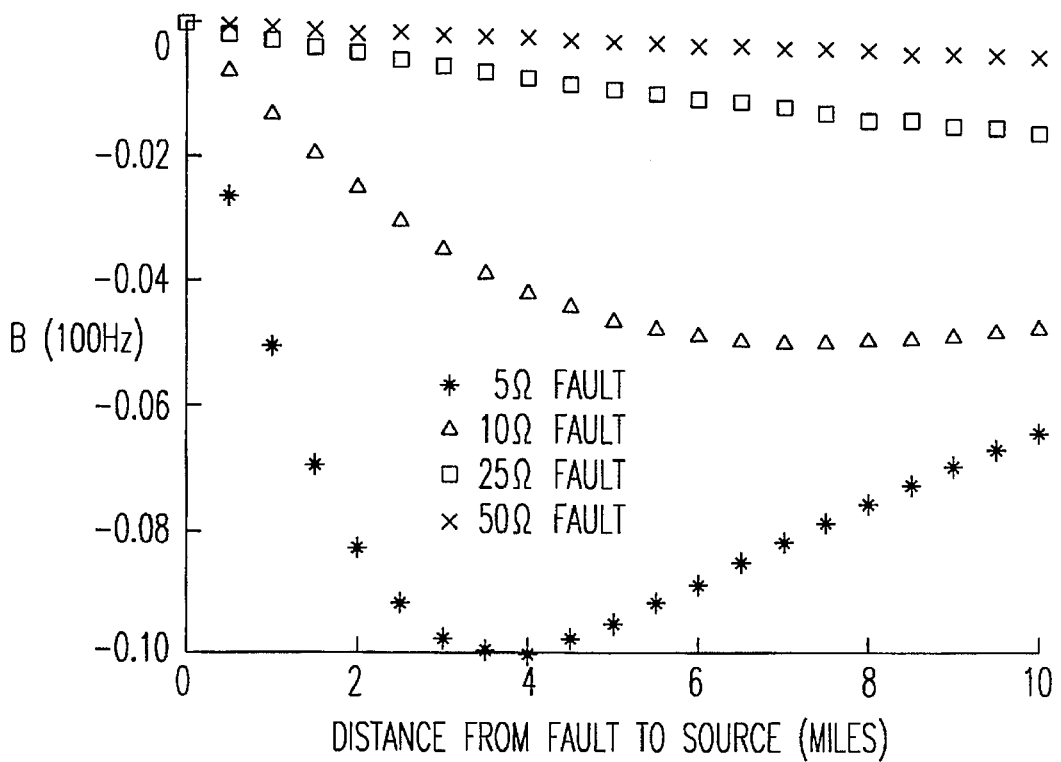

The graphs of FIGS. 30A and 30B were generated using Equation (13). These graphs show the conductance (G) and the susceptance (B) of several different values of fault $Z_L$ as a function of their distance from the source. The graphs show Y(l) at 100 Hz. At lower frequencies, the effects are slightly less dramatic, and at higher frequencies slightly more dramatic.

From these graphs, the change in input admittance that a fault on a line a given distance from the source will cause can be found. In other words, these graphs predict the change in input admittance from an unfaulted line to a faulted line. FIGS. 30A and 30B also show trends in the change in input admittance caused by the fault as its location on the line moves away from the test point and as the resistive value of the fault changes. These trends are considered in the development of the fault detection algorithm of the present invention, which works regardless of the impedance value of the fault or its location on the line.

With reference to FIGS. 30A and 30B, as the location of the fault moves away from the source, the conductance (FIG. 30A) changes more rapidly for low impedances. For higher impedance faults, the conductance changes only slightly. The susceptance (FIG. 30B) becomes more negative as the fault moves farther from the source, and lower impedance faults appear to have a larger negative susceptance than higher impedance faults. The susceptance can be neglected for higher impedance faults.

Figure 31:
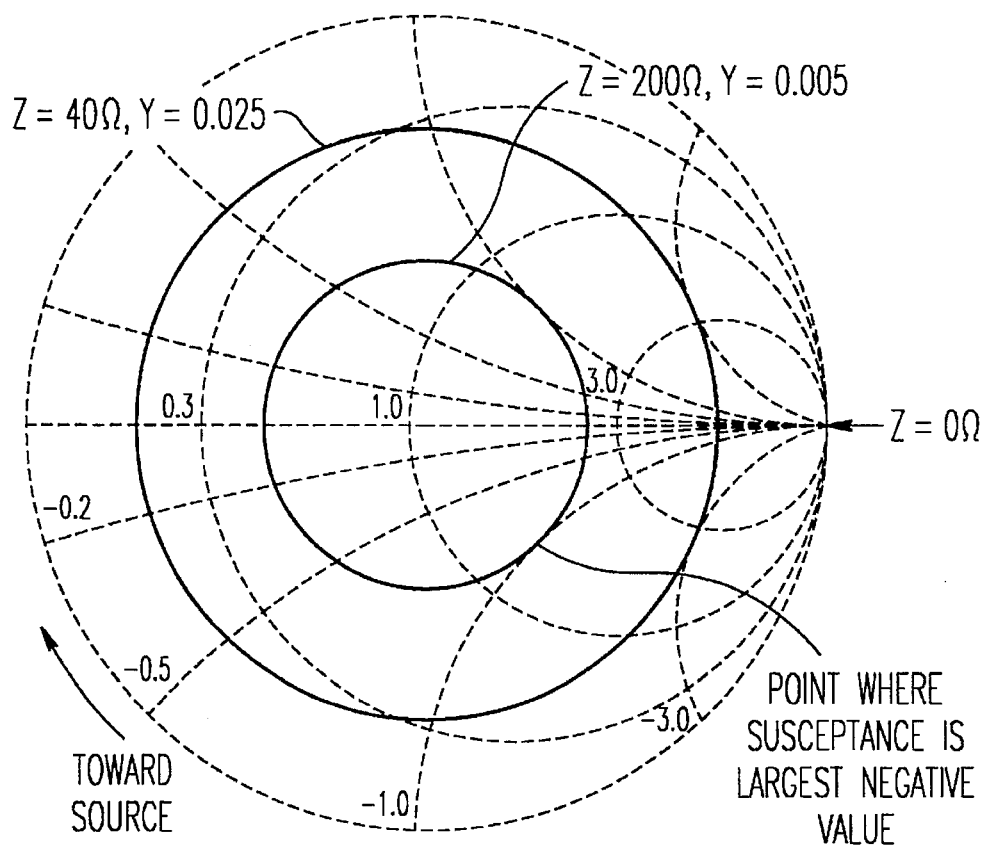
FIG. 31 is a Smith chart showing how effects on input admittance change as a fault moves down a transmission line.

All of these effects can also be observed using the Smith chart of FIG. 31. The Smith chart lines represent the normalized admittance $Y_N$. $Y_N = 400/Z_L$, placing 400Ω in the center of the Smith chart, 0Ω at the farthest point to the right, and an open circuit at the farthest point to the left.

Using the Smith Chart, the extent to which an impedance affects the input admittance can be observed. For example, if $Z_L$ is 40Ω then $Y_N$ is 10Ω. The standing wave circle for this impedance is shown. If this fault existed on the line, its effect on the input admittance is found by starting at the real axis and following the standing wave circle clockwise, the number of wavelengths that represent its distance from the source. Using this approach, it is observed that for any impedance less than 400Ω the conductance decreases as the distance grows larger. The susceptance increases from zero to some maximum negative value and then decreases to zero again. The smaller the impedance the faster the susceptance increases and the larger the negative value is at its maximum point on the standing wave circle. For impedances close to 400Ω, both conductance and susceptance change very slowly. Impedances greater than 400Ω also change very slowly. This is significant because the transformer at most frequencies looks like a high impedance.

For a further study of these effects, the electrical distance in wavelengths is calculated for 10 miles and 100 Hz.

$$\lambda = \frac{c}{f} = \frac{186,000 \text{ mi/s}}{100 \text{ Hz}} = 1860 \text{ miles} \quad (14)$$

From this equation, the electrical distance for 10 miles is 0.00537 wavelengths. Since one full revolution is 0.5 wavelengths, 10 miles is a very short distance around the Smith chart at low frequencies.

It is important to keep in mind that the Smith chart and equation (13) are both derived for lossless transmission lines. However a distribution lateral is not lossless. When losses were considered, the trends are the same, but the effects less dramatic. Thus, the method can still be used to draw conclusions.

With regard to input admittance, the conclusions are that transmission line effects can be neglected at low frequencies and short distances (less than 10 miles) for transformers and for impedances greater than 50Ω. More importantly, transmission line effects for impedances less than 50Ω are not neglected, but rather are considered.

As described above, two constraints were placed on the FFTs of the current and the voltage before they were used to calculate an accurate approximation for the admittance versus frequency, Y(jω). Both of these constraints are preferably satisfied before the admittance is used.

The first constraint is the sampling window. The signals encountered in the fault detection system of the present invention are exponentially decaying and die out relatively quickly. The signals, however, need to be sampled for a long enough period of time such that the signal is sufficiently decayed by the end of the sampling window. Simulations on typical line models with a 1 μF capacitor suggest that during the test the line should be sampled for at least 20 ms.

The second constraint is the sampling rate, which needs to be sufficiently fast. If the sampling rate is not fast enough, large errors in the FFT can result. This error in the FFT is called aliasing. One way to view aliasing is that the signal changes fast enough between samples such that the samples do not adequately represent the signal.

Figure 32:
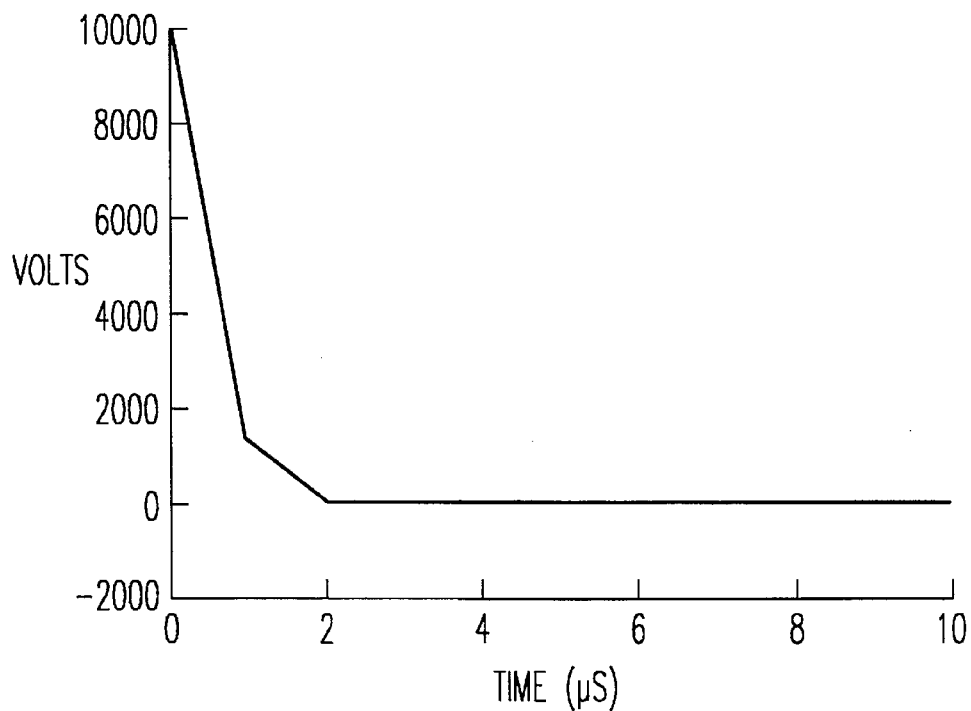
FIG. 32 is a graph illustrating voltage versus time for a faulted network.

The aliasing problem can be demonstrated using the circuit of FIG. 27. FIGS. 29A and 29B show that there was noticeable error in the admittance calculated when this circuit was simulated using a 200 kHz sampling rate. The problem was a sampling rate that was too slow and can be explained by a time domain plot of the voltage during a test, as shown in FIG. 32. With reference to FIG. 32, if the sample period is 5 μs or greater, the FFT of these samples does not produce a very accurate approximation of V(jω). Thus, a poor approximation for Y(jω) is generated.

Figure 33A:
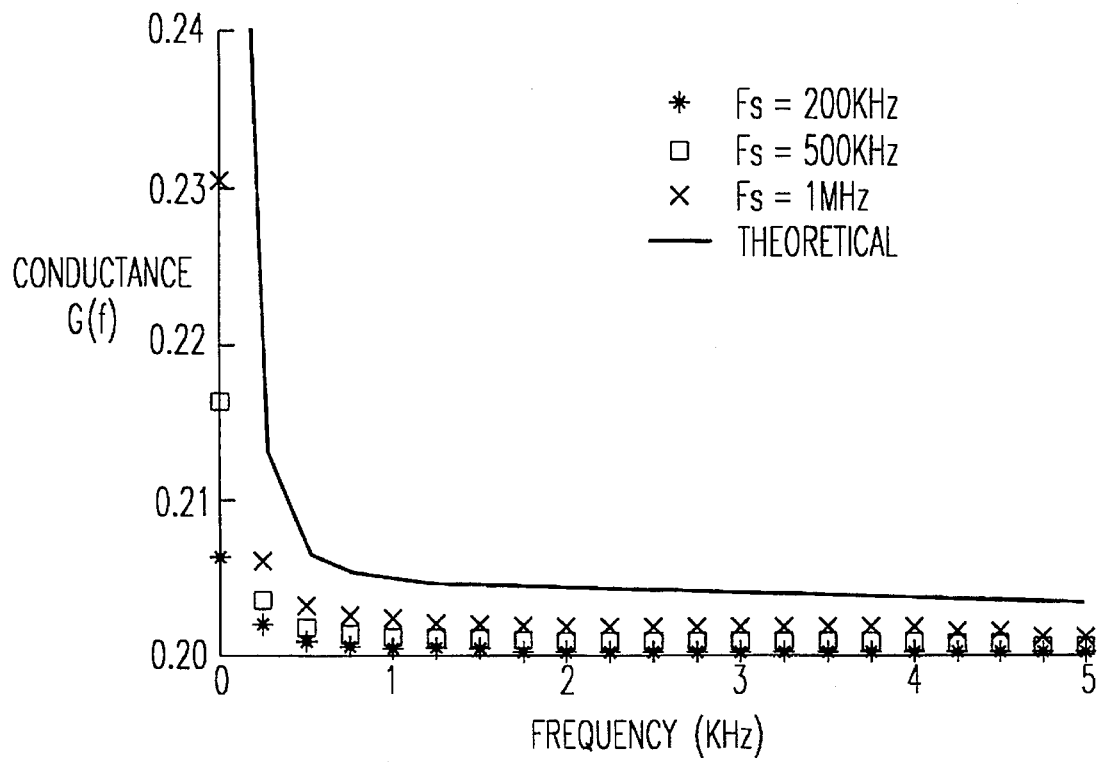
FIGS. 33A and 33B are graphs illustrating a comparison of input admittance calculated using different sampling rates.
Figure 33B:
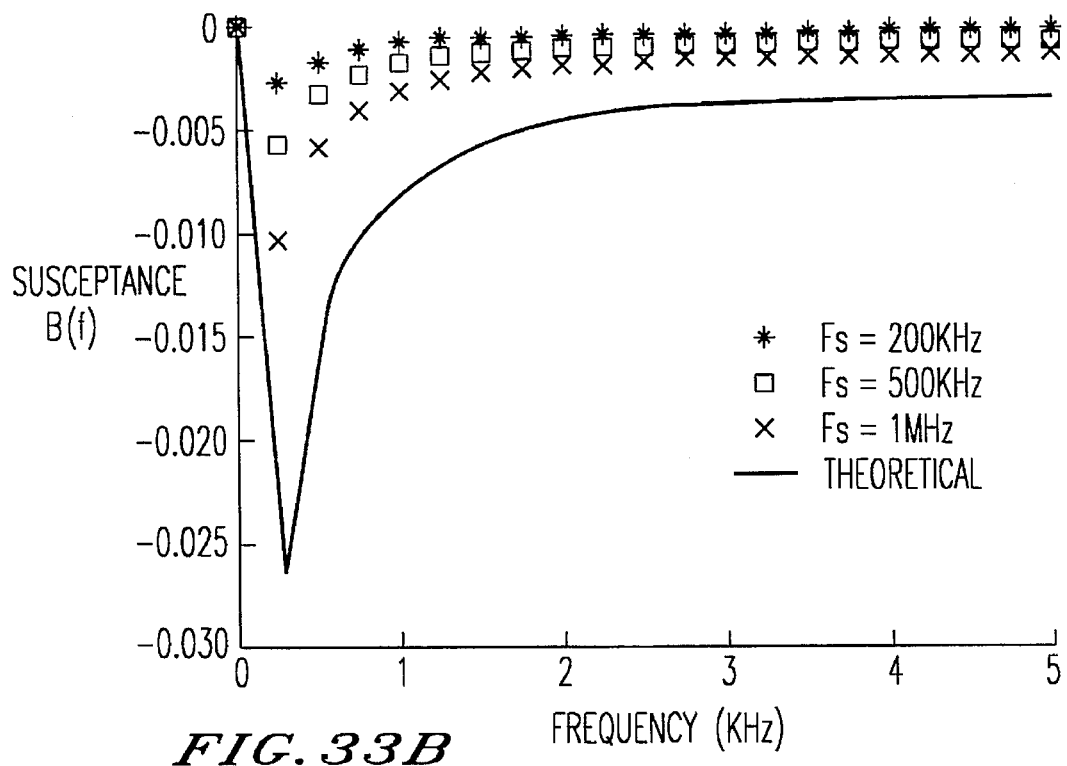

One solution is to sample the signal at a more rapid rate. FIGS. 33A and 33B show the theoretical answer for Y(jω) for this network and the FFT generated approximations using three different sampling rates. The best approximation is obtained with the fastest sampling rate.

Figure 34:
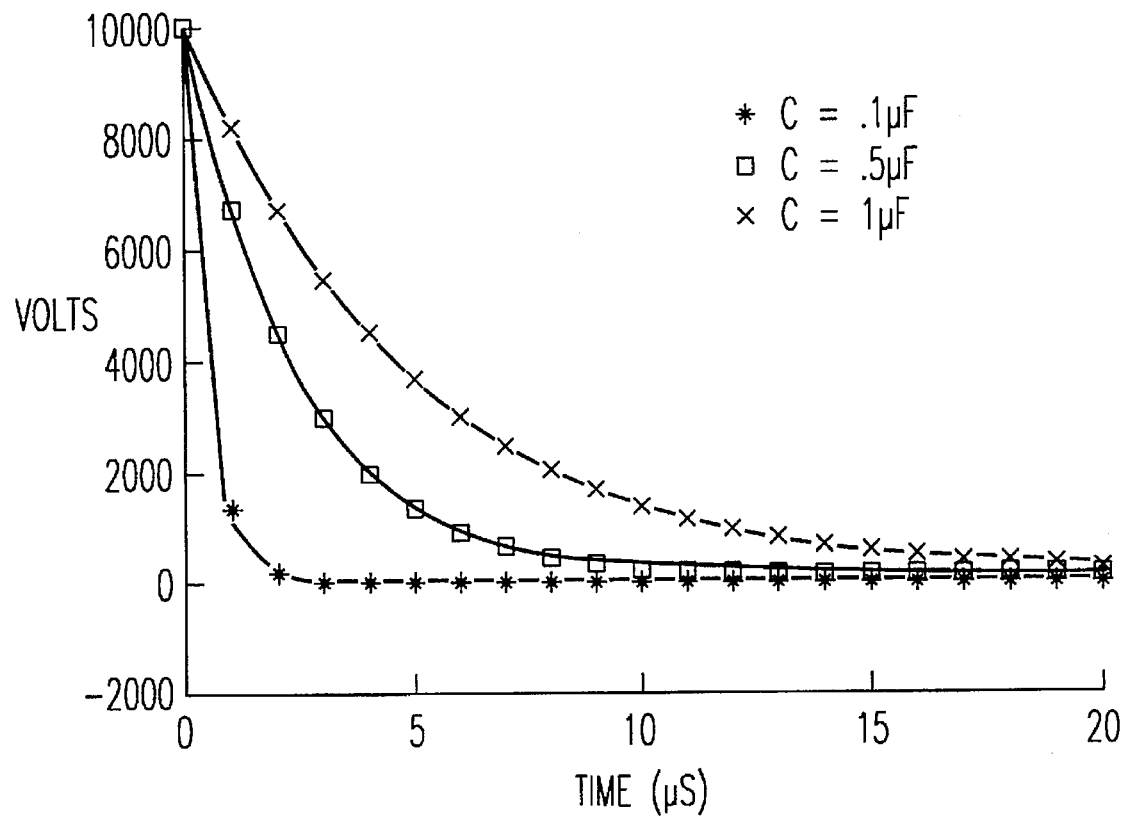
FIG. 34 is a graph illustrating decay time signals for various sizes of capacitors.

Another solution to get better approximations for Y(jω) is to change the size of the capacitor used in the test. The idea is that a larger capacitor decays more slowly. If the decay is slower, then the sampling rate can be slower. This is illustrated in FIG. 34, which has time domain plots for the discharge test done on the circuit of FIG. 27 with different sizes of capacitor. The rate of decay decreases with an increase in the size of the capacitor.

Figure 35A:
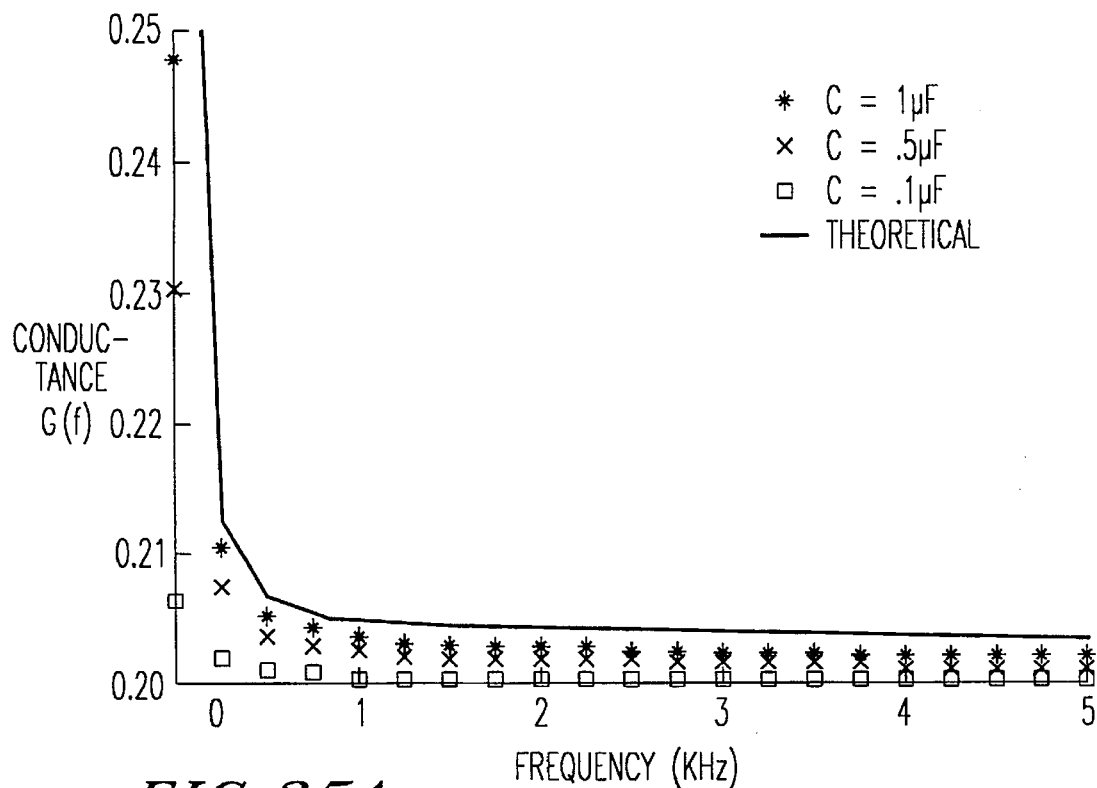
FIGS. 35A and 35B are graphs illustrating a comparison of input admittance using different sizes of exciting capacitors.
Figure 35B:
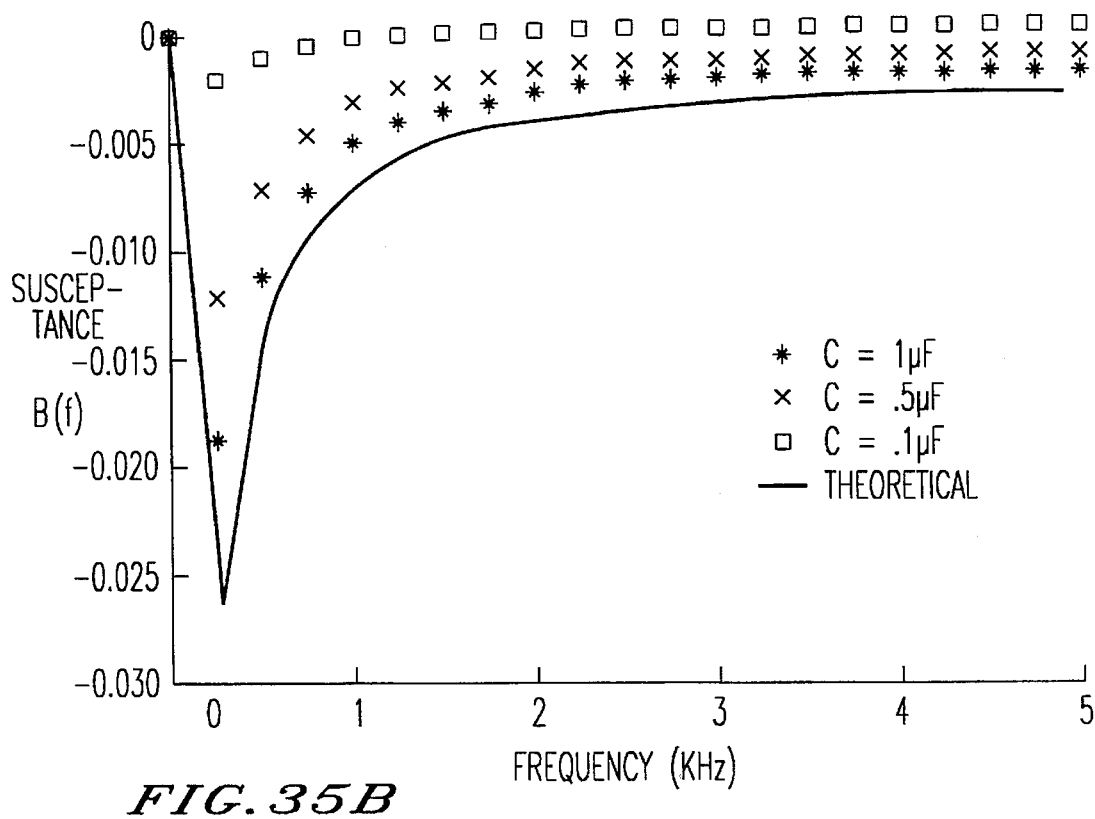

FIGS. 35A and 35B show the results for Y(jω) calculated in each of the three tests using different sizes of capacitor. The sampling rate used for these tests was 200 kHz. The largest capacitor produces the best approximations.

In view of the foregoing, it is advantageous to use the biggest capacitor that size and weight constraints allow. It is also advantageous to use the fastest sampling rate which meets economic constraints. Further, if the choice is between faster sampling and a larger capacitor, a larger capacitor is preferably used. If a larger capacitor is used, its slower decay can require a longer sampling window.

Once an accurate approximation for the input admittance of the line is obtained, the information contained in the input admittance needs to be deciphered to determine if there is a fault. One obvious difference between faulted and unfaulted lines is the considerable increase in the input admittance. This suggests that an automated process can identify faults by looking for an input admittance above a certain threshold. Setting the threshold, however, is difficult because the input admittance of the unfaulted line changes depending on the load of the line, which in turn, is primarily dependent on the number of customers serviced by that particular line.

The following derivation provides a preferred one of a number of possible approaches for determining the necessary thresholds for the input admittance. The following variables are defined:

$Y_T$=Overall input admittance of the line
$Y_f$=Input admittance due to a fault
$Y_t$=Input admittance due to everything except a fault (transformers)

such that $$Y_T = Y_f + Y_t$$

Separating admittance Y into its conductance (G) and susceptance (B) components gives $G_T = G_f + G_t$ and $B_T = B_f + B_t$ In order to be sure of a fault using this approach, two assumptions are made. The first is that it is possible to define $Min(G_f)$ and $Max(G_t)$ where $Min(G_f)$ is the minimum value for the input conductance due to the fault and $Max(G_t)$ is the maximum value for the conductance of the line without the fault. The second assumption is that frequencies can be identified such that $Min(G_f) > Max(G_t)$. If these frequencies are identified then anytime $G_T > Min(G_f)$, a fault must exist. Conversely, if $G_T < Min(G_f)$, there cannot be a fault present.

This stipulation for a fault works well for higher impedances (e.g., impedances above 15Ω), but, as described in an earlier section, the transmission line effects are greater for very low impedance faults. As a result, using only the conductance may not give good results for low impedances. The solution is to use magnitude. A similar derivation to the one above is done using the magnitude of the admittance.

Figure 36:
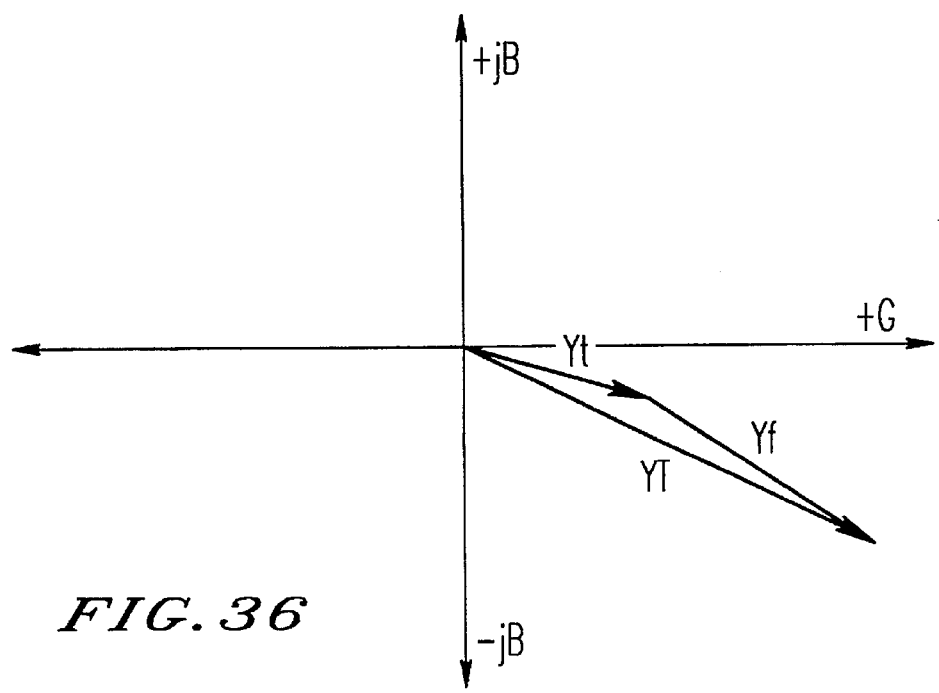
FIG. 36 is a graph depicting a magnitude derivation of admittance.

Due to the transformers, the transmission line without a fault looks inductive. In other words, $B_t$ will be negative and $G_t$ will be positive, as shown in FIG. 36. As stated earlier, transmission line effects cause $Y_f$ to have a negative $B_f$ and a positive $G_f$. Since $B_f$, $B_t$ have the same sign, and $G_f$ and $G_t$ have the same sign, the following is true: at the frequencies where $Min(|Y_f|) > Max(|Y_t|)$, anytime $|Y_T| > Min(|Y_f|)$ there must be a fault.

With reference to FIG. 36, the maximum $|Y_T|$ occurs when the angle of $Y_t$ is equal to the angle of $Y_f$. This fact helps explain why magnitude works better if the fault impedance is low. Transmission line effects on low impedances cause them to have significant susceptance. This susceptance causes the angle of $Y_f$ to grow closer to the angle of $Y_t$ which causes $Y_T$ to come closer to the maximum value.

Now that a criterion has been identified which can be used to identify the fault, the two assumptions that were made in its derivation must be satisfied. Finding $Min(G_f)$, $Max(G_t)$, $Min(|Y_f|)$, and $Max(|Y_t|)$ can be done mathematically. For example, $Min(G_f)$ and $Min(|Y_f|)$ can be obtained with reasonable accuracy using equation (13). This equation gives the effect of the fault on the admittance at a given frequency and distance from the source. $Max(G_t)$ and $Max(|Y_t|)$ can be found using the worst case transformer load such as the one in FIG. 26. This represents a heavily loaded distribution lateral which models a worst case number of customers serviced by the line. The maximum input admittance corresponds with the maximum number of customers serviced.

Satisfying the second assumption requires finding a band of frequencies where $Min(G_f) > Max(G_t)$ or $Min(|Y_f|) > Max(|Y_t|)$. A band of frequencies is more desirable than a single frequency because the results at each frequency can be summed to produce a larger noise margin. It is difficult to find a band meeting the needed requirements for all impedances from 0Ω to 99Ω. It is preferred to identify bands meeting the need requirements for smaller groups of impedances.

TABLE I

| | Fault Detection Thresholds | | |
|---|---|---|---|
| Test # | Impedance | Maximum $|Y_t|$ or $G_t$ | Minimum $|Y_f|$ or $G_f$ |
| 1 | 0Ω < $Z_L$ < 10Ω | $\sum_{n=1}^{4} |Y_t(76n)| = .154$ | $\sum_{n=1}^{4} |Y_f(76n)| = .168$ |

TABLE I-continued

| | Fault Detection Thresholds | | |
|---|---|---|---|
| Test # | Impedance | Maximum $|Y_t|$ or $G_t$ | Minimum $|Y_f|$ or $G_f$ |
| 2 | 10Ω < $Z_L$ < 15Ω | $\sum_{n=3}^{7} |Y_t(76n)| = .090$ | $\sum_{n=3}^{7} |Y_f(76n)| = .100$ |
| 3 | 15Ω < $Z_L$ < 20Ω | $\sum_{n=1}^{4} G_t(76n) = .076$ | $\sum_{n=1}^{4} G_f(76n) = .088$ |
| 4 | 20Ω < $Z_L$ < 30Ω | $\sum_{n=2}^{5} G_t(76n) = .0512$ | $\sum_{n=3}^{8} G_f(76n) = .059$ |
| 5 | 30Ω < $Z_L$ < 50Ω | $\sum_{n=3}^{7} G_t(76n) = .045$ | $\sum_{n=3}^{7} G_f(76n) = .051$ |
| 6 | 50Ω < $Z_L$ < 80Ω | $\sum_{n=2}^{9} G_t(76n) = .038$ | $\sum_{n=2}^{9} G_f(76n) = .046$ |
| 7 | 80Ω < $Z_L$ < 99Ω | $\sum_{n=5}^{11} G_t(76n) = .034$ | $\sum_{n=5}^{11} G_f(76n) = .044$ |

Table I shows how the impedances from 0Ω to 99Ω can be broken up into 7 smaller groups. The table was generated by calculating $Max[|Y_t(f)|]$, $Max[G_t(f)]$, $Min[|Y_f(f)|]$, and $Min[G_f(f)]$ at 76 Hz intervals up to 1000 Hz. $Max[|Y_t(f)|]$ and $Max[G_t(f)]$ are preferably calculated by solving the circuit of FIG. 26. $Min[|Y_f(f)|]$ and $Min[G_f(f)]$ for each impedance interval are preferably found by selecting the worst case impedance and distance from the source (e.g., a distance as great as 10 miles) which produced the minimum increase in input admittance using equation (13). For each impedance interval, bands of frequencies are selected where $|Y_f| > |Y_t|$ or $G_f > G_t$. Once these frequencies are identified, the calculated admittance values are summed to produce the thresholds listed in Table I.

A test for a fault using Table I consists of seven checks. The input admittance for the line ($Y_T$) is calculated from 0 to 1000 Hz in 76 Hz steps. Beginning from the lowest impedance interval 0Ω–10Ω, $|Y_T|$ is summed from 0 to 300 Hz. This sum will then be compared to 0.168. If $\Sigma|Y_T|$ is greater than the threshold value, the test terminates. In this case, there must be a fault because $\Sigma|Y_T|$ is greater than the maximum value of admittance that the line provides by itself. If $\Sigma|Y_T|$ is less than the threshold value, testing continues to the next impedance interval. If $\Sigma|Y_T|$ or $\Sigma G_T$ fails any of the seven tests, there is a fault, unless the line contains a power factor correction capacitor which can appear as a fault. A separate test is performed to determine if what appears to be a fault is actually a capacitor, as described below in connection with FIGS. 41A, 41B and 41C. If all seven tests are passed, the line is not faulted.

This seven test approach has many useful characteristics. It is not likely to identify an unfaulted line as faulted for two reasons. First, the heavily loaded line was used to produce the maximum values. Most lines have a considerably lower input admittance. A safety factor is also provided by using the minimum fault admittance for the threshold. The maximum unfaulted line admittance is even less than this value which supplies a noise margin.

Another useful characteristic is the redundancy of doing seven separate tests. It is not likely that a fault is missed because the minimum value for input admittance caused by the fault was used for the threshold. Most faults have a much higher admittance. Even if the faulted line passes one or several of the tests, it is not likely to pass all seven.

The foregoing description of the admittance versus frequency method of the present invention employs seven tests for illustrative purposes. It is to be understood that the method of the present invention can be employed using different equivalent circuits besides the circuit in FIG. 26, different impedances and distances for use with equation (13), different impedance intervals, different bands of frequencies and different numbers of tests. For example, a fault test can be designed to consist of only three or four tests as opposed to seven tests.

Figure 37A:
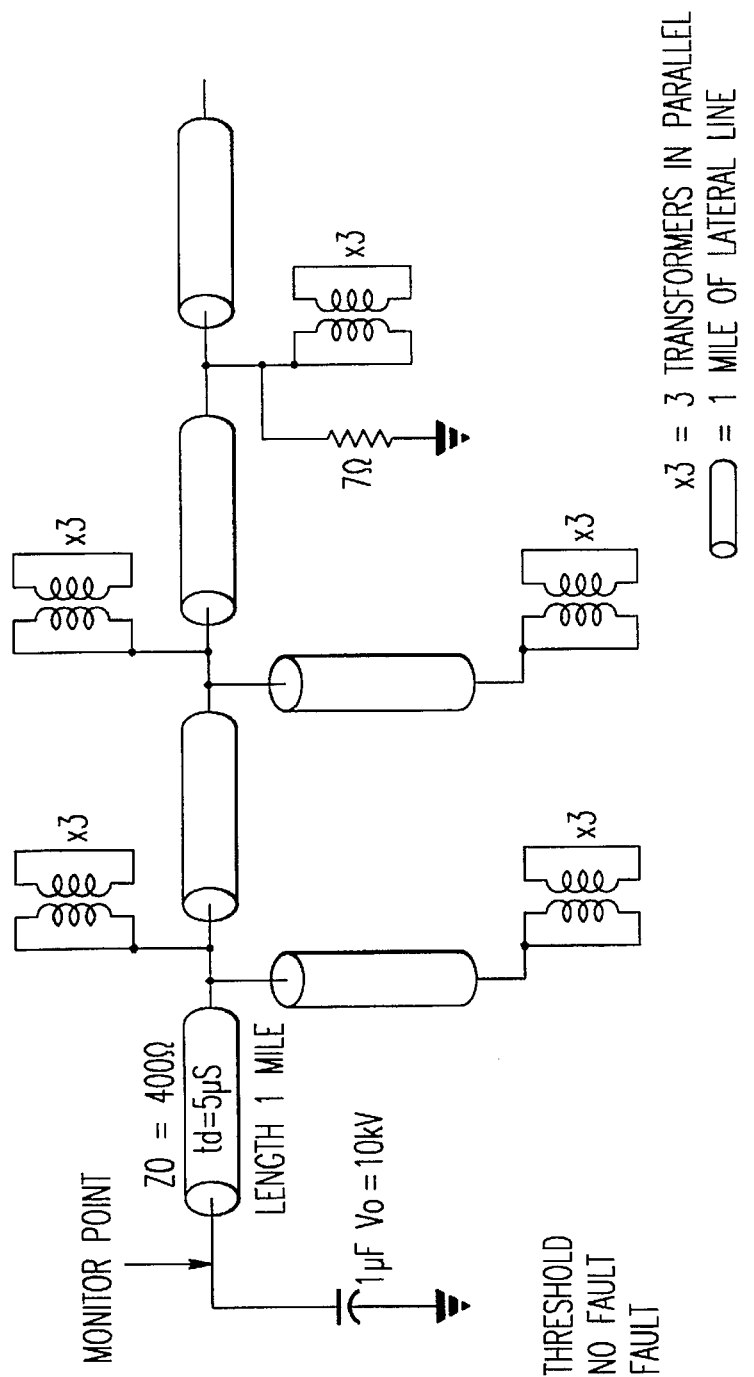
FIGS. 37A and 37B are, respectively, a schematic diagram and a graph depicting results of seven sum-of-admittance tests conducted in accordance with the present invention for a simulated lateral line.

The lateral of FIG. 37A will now be used to demonstrate the effectiveness of the seven test algorithm. This lateral was chosen because it is a typical case for which the algorithm can be used to diagnose as faulted or clear. It is not a difficult nor an easy case. The easiest faults to detect are generally the minimum impedance fault of each interval in Table I located at the test point. When looking for an admittance above a threshold, the maximum admittance is the easiest to detect. Conversely, the most difficult detection corresponds to the minimum admittance presented by the fault. For each interval, this occurs with the maximum impedance fault the farthest distance from the test point. In addition, the lateral of FIG. 37A has a transformer load which is below the maximum that would be seen on a lateral.

Figure 37B:
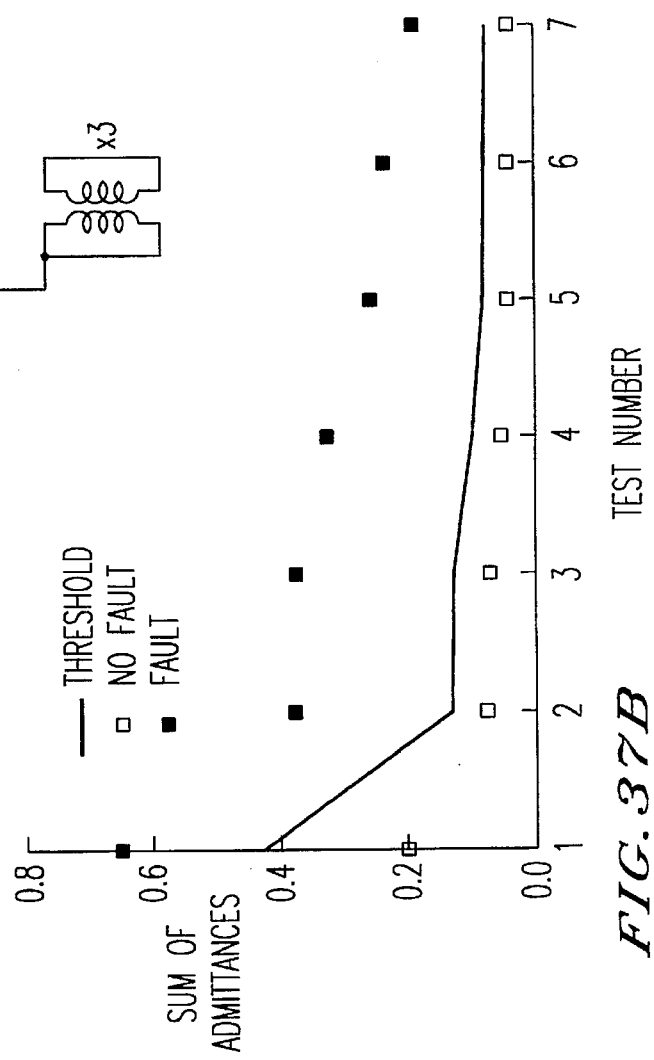

This example lateral was simulated during a test using the PSPICE software on a personal computer. The input admittance versus frequency up to 1000 Hz was calculated. The admittance values were subsequently summed for each of the seven tests of Table I. FIG. 37B shows the results of this simulation. The empty squares represent the values obtained without the 7Ω fault. The filled squares represent the lateral and the 7Ω fault three miles from the test point. The continuous line represents the minimum admittance caused by a fault alone for that impedance interval which is the detection threshold to be used. This graph shows that, for each of the seven tests, the unfaulted lateral passed, and, for each of the seven tests, the faulted lateral is above the fault threshold. This was not an easy case example and yet it failed all seven checks. It is only necessary for the faulted lateral to fail one of the checks to be identified as faulted. Thus, the fault could be moved farther away, and the algorithm of the present invention can still correctly identify the faulted line as faulted and the clear line as unfaulted. In fact, the algorithm can correctly identify faulted laterals as faulted until the fault reaches maximum impedance for each test interval and distance from the test point.

As stated above, the admittance versus frequency method of detecting a fault in accordance with the present invention uses both current and voltage samples to calculate admittance. Sampling both voltage and current increases the complexity of the hardware needed for the detection device because two transformers are needed instead of one. Further, signal conditioning for two analog signals is necessary. The digital and sampling complexity suffers as well because either two analog-to-digital (A/D) converters must be handled by the microprocessor, or one A/D converter is multiplexed at a higher sampling rate. One solution which eliminates this extra hardware is to sample one variable and calculate the other.

Using circuit theory, the current samples can be calculated from the voltage samples, and conversely the voltage samples can be found using the current samples. FIG. 38 shows an equivalent circuit for the power line during the test. The relationship between the voltage and current shown is given by the equation:

$$I = -C * \frac{dV}{dt} \tag{29}$$

If the voltage is sampled during the test, the current samples can be calculated by approximating the time derivative.

$$I(0) = \frac{V(0)}{Z0} = \frac{V(0)}{400} \tag{30}$$

$$I(n) \stackrel{\Delta}{=} -C * \frac{V(n) - V(n-1)}{T_s} \quad n \geq 1$$

$$I(n) \stackrel{\Delta}{=} \frac{C}{T_s} * (V(n-1) - V(n)) \quad n \geq 1$$

where $V(n)$ is the voltage at a given time, and $T_s$ is the time between samples (sample period). The initial current $I(0)$ is approximated as the initial voltage divided by the characteristic impedance.

This approach to finding the current samples works very well for several reasons. Foremost, the voltage samples are measured across a large capacitor which limits the rate of change of the voltage and makes the derivative approximation a good one. Another reason is that noise on a specific voltage sample only affects two current samples. The last reason is that the frequencies of interest are less than 1000 Hz. If a sharp change is missed between samples, it does not greatly affect the admittance versus frequency calculation because that sharp change corresponds to high frequency information. All information above 1000 Hz is simply not used.

In a similar manner, an equation which describes the voltage as a function of the current can be derived.

$$V = -\frac{1}{C} * \int_{-\infty}^{t} I(t)dt \tag{31}$$

$$V = -\frac{1}{C} * \left[ \int_{-\infty}^{0^-} I(t)dt + \int_{0}^{t} I(t)dt \right]$$

An approximation for the integral can be used to generate an equation which relates the current samples to the voltage samples. The following equation can be used to calculate the values for the voltage samples from the current samples:

$$\int_{-\infty}^{0^-} -I(t)dt = V(0^-) = V(0) = I(0)*Z0 = I(0)*400 \tag{32}$$

$$\int_{0}^{t} I(t)dt \stackrel{\Delta}{=} T_s * \sum_{k=1}^{n} \frac{I(k) + I(k-1)}{2} \quad (n=t) \geq 1$$

$$V(n) \stackrel{\Delta}{=} \frac{1}{C} * \left[ I(0)*400 - \left[ T_s * \sum_{k=1}^{n} \frac{I(k) + I(k-1)}{2} \right] \right] \quad n \geq 1$$

Using this equation to find the voltage samples from the sampled current is not as useful. The current changes very rapidly through the capacitor, and therefore requires faster sampling to prevent noisy results. Another problem is inherent in the integration approximation. If there is noise in one of the samples, every voltage sample from that point forward accumulates that noise. The result is that the voltage calculated may not converge to zero as it should, but rather to some value caused by the noise. The result of using these calculated voltage samples with this noise problem to generate the admittance versus frequency is not as reliable. Both of the approaches to calculating one of the needed quantities from the other introduce noise. The first approach using only voltage samples to calculate the admittance of the line, however, has the most potential to be used in noisy conditions and is the preferred approach.

Figure 40A:
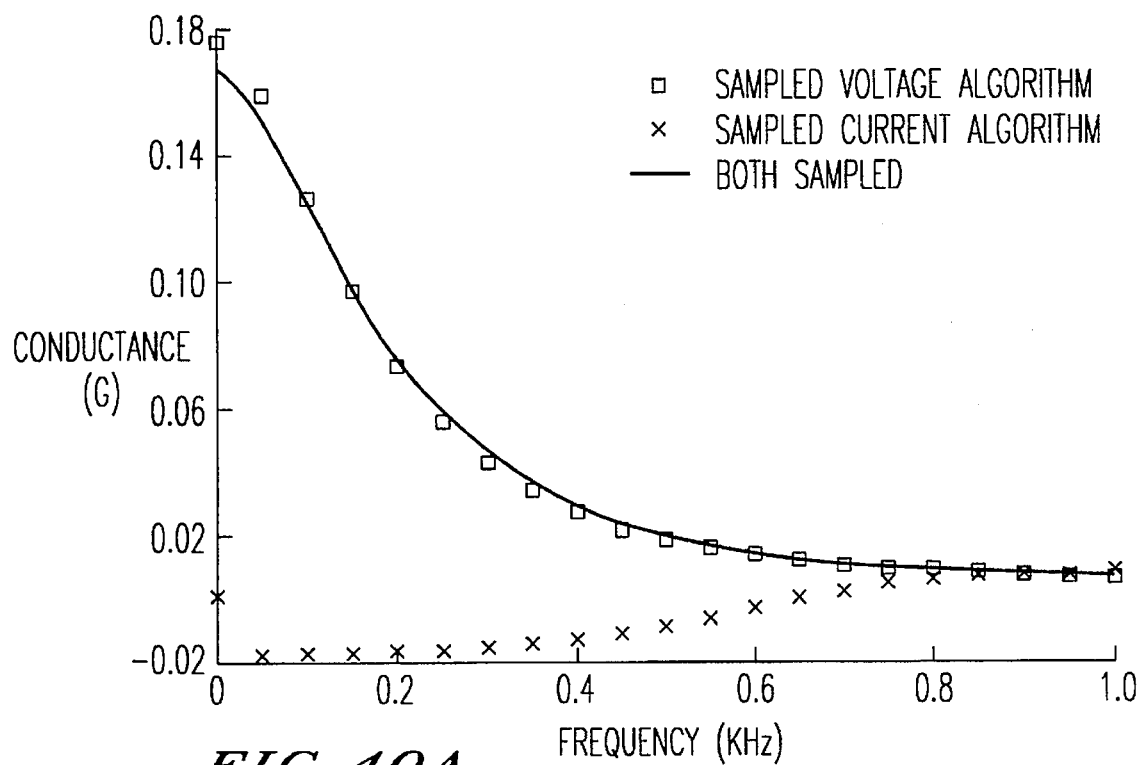
FIGS. 40A and 40B are graphs depicting a comparison of admittance versus frequency for algorithms using only current or voltage samples and using both sampled voltage and sampled current.
Figure 40B:
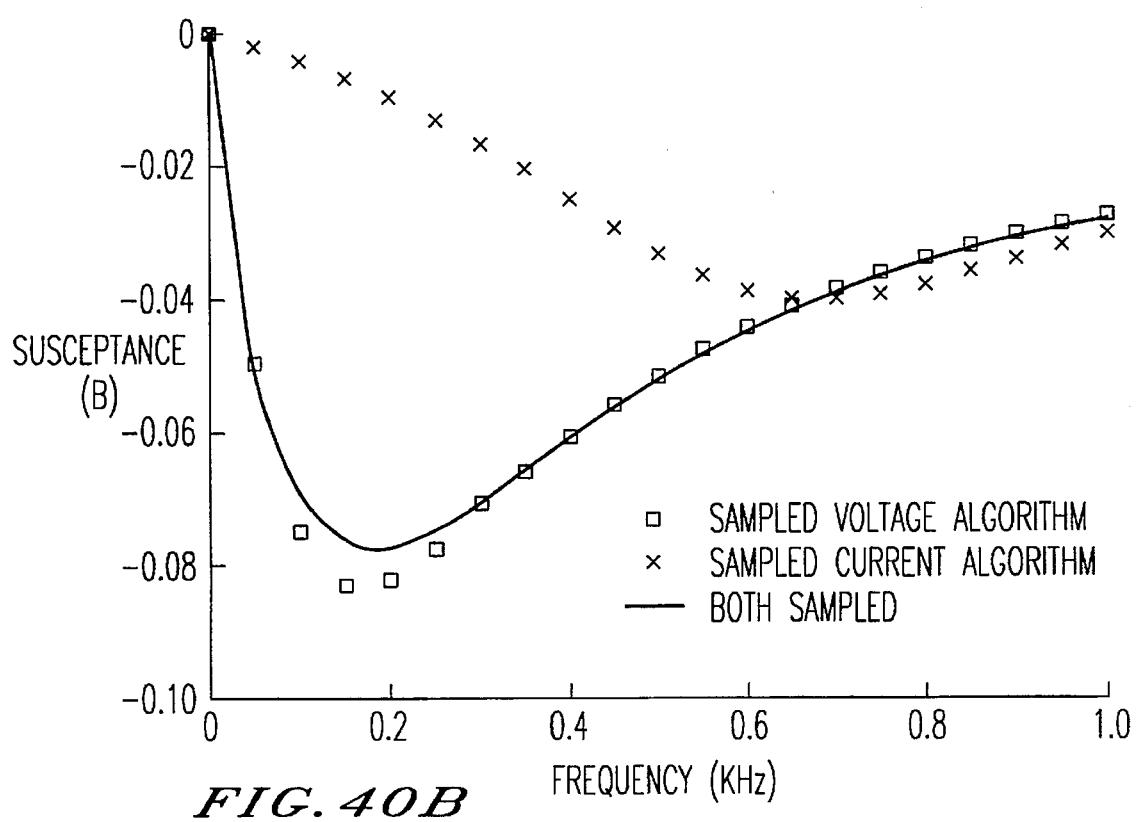

FIG. 39 shows a typical distributed lateral with a fault during a test. FIGS. 40A and 40B shows the admittance versus frequency for this line when tested. Admittances calculated using both sampled current and sampled voltage, using only the voltage samples, and using only the current samples as shown. These plots demonstrate that the voltage samples alone can be used reliably to calculate the admittance versus frequency, and that the current samples alone using this approach cannot be used reliably.

Figure 41A:
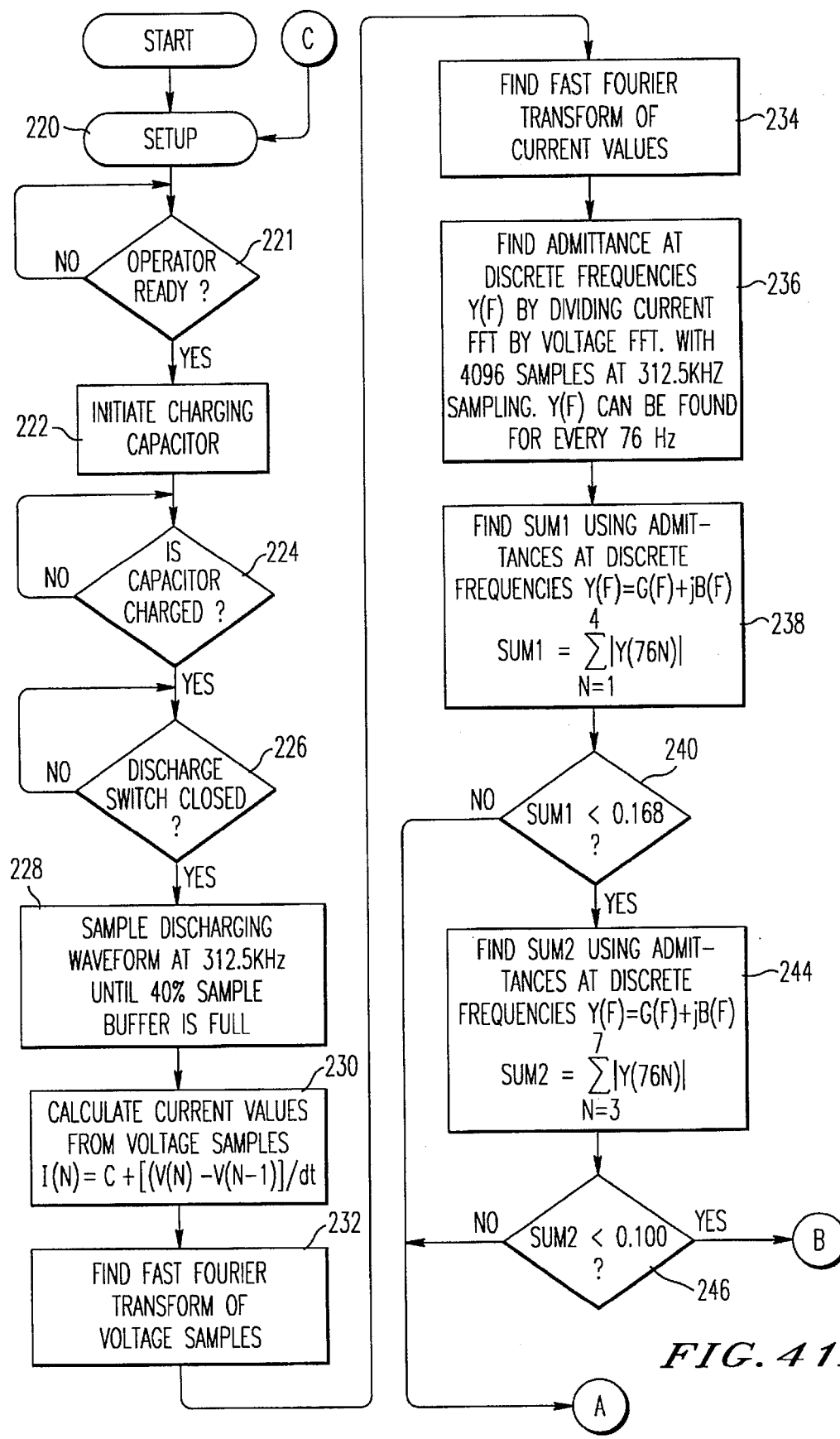
FIGS. 41A, 41B and 41C are flow charts depicting a sequence of operations for fault diagnosis in accordance with an embodiment of the present invention.
Figure 41B:
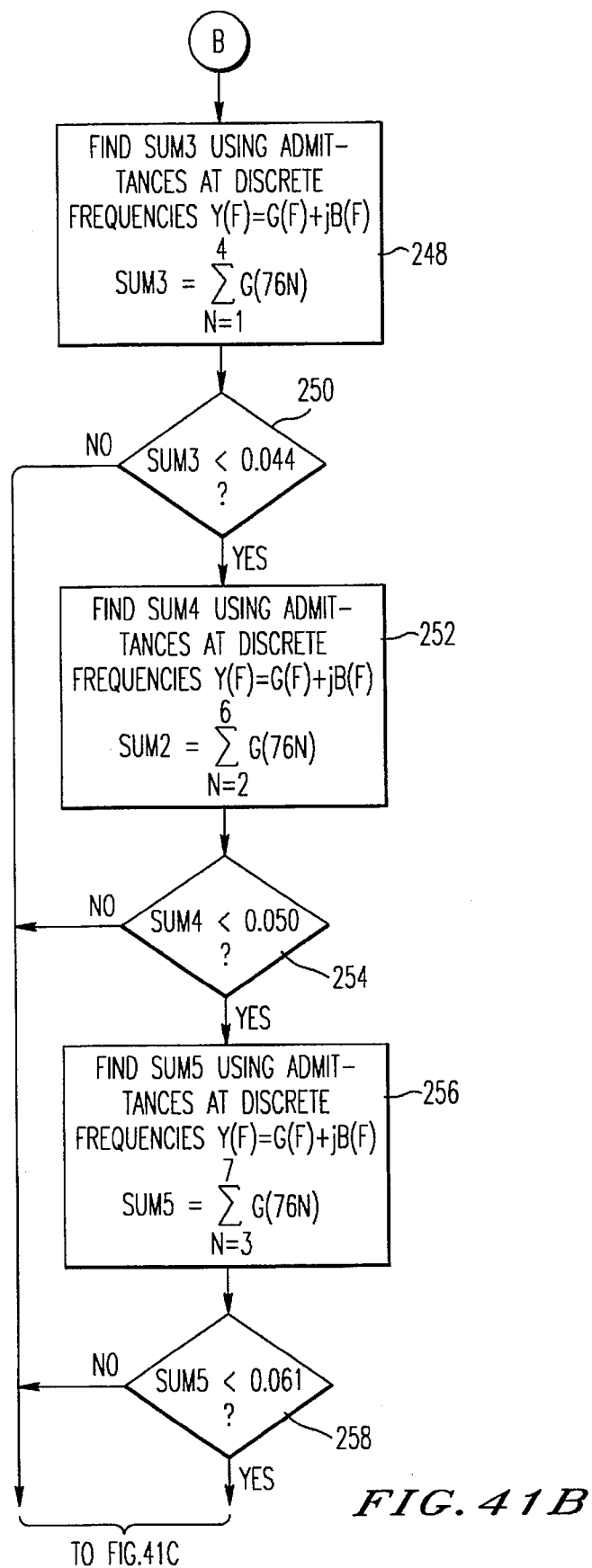
Figure 41C:
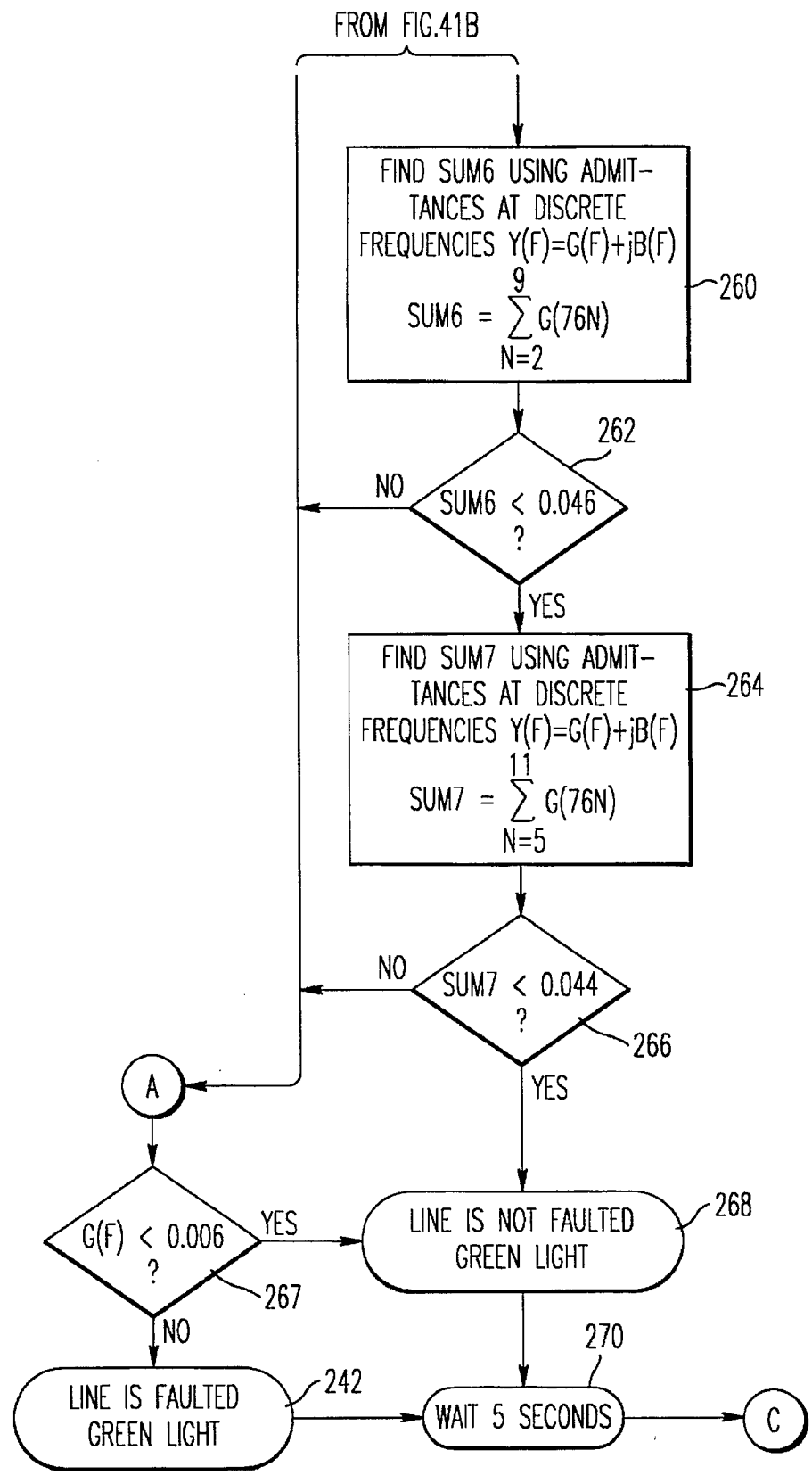

FIGS. 41A, 41B and 41C shows the flow diagram for the software that runs on the microprocessor. After power up, that is, the ON/OFF button is activated and the circuit board is provided power via the batteries (block 220). The microprocessor is also programmed to generate a table of sine and cosine values. The sine and cosine table is used in the FFT calculations. One approach for generating a sine and cosine table (0–360 degrees) is to store 0–90 degrees in ROM and to use these values to generate the entire table. Further, sine and cosine can be contained in the same table since sine is the same as cosine except with a 90 degree offset.

After setup, the microprocessor waits for a signal signifying that the operator is ready, i.e., the operator engages momentary start charging switch 55 (block 221). The processor starts the amber LED flashing to show capacitor is charging (block 222). After the charge voltage is obtained, the microprocessor sets the amber LED to continuous on. Once the capacitor is properly charged (block 224), the microprocessor waits for a prescribed event to happen, such as the activation of the discharge switch (block 226). The microprocessor samples the voltage across the capacitor 44 at 308 kilohertz and stores the values in a 4096 value ring buffer (block 228). The microprocessor continues to sample until it senses a large change in voltage, which occurs when the capacitor is discharged into the test line 12. From the start of the discharge into the line, the next 4096 samples are stored in the buffer to be used by the algorithm.

Once the voltage samples are successfully stored in memory, the microprocessor calculates current samples from the stored voltage samples (block 230). The microprocessor subsequently determines the Fast Fourier Transform (FFT) of the voltage and current samples (blocks 232 and 234).

With reference to block 236, the microprocessor calculates admittance at discrete frequencies Y(f) by dividing the FFT calculated for the current samples with the FFT calculated for the voltage samples. In this example, Y(f) is calculated for every 76 Hz. With reference to block 238, the microprocessor determines whether the first criterion in Table I is met for the first impedance group by summing the admittances determined in block 236 for discrete frequencies between 76 and 304 Hz. With reference to block 240, if SUM 1 is less than 0.168, the microprocessor begins to calculate the admittance for the next test; otherwise, a fault has been detected. The microprocessor is programmed to turn on the red LED (block 242).

With reference to block 244, the microprocessor sums the admittances determined in block 236 at discrete frequencies in increments of, for example, 76 Hz between 228 and 532 Hz. If the summed value is less than 0.1, then a fault has occurred (block 246); otherwise the microprocessor continues to the third test in block 248. If the admittances determined in block 236 for frequencies between 76 and 304 Hz is less than 0.088 (block 250), then the microprocessor illuminates the red LED to indicate a fault has occurred; otherwise, the microprocessor proceeds to the fourth test in block 252. Similarly, if the summed admittances for frequencies between 152 and 380 Hz is less than 0.059 (block 254), then a fault has occurred; otherwise the microprocessor proceeds to the fifth test in block 256.

With reference to block 256, the admittances, which were determined at 76 Hz increments between frequencies 228 and 532, are summed to determine if the waveforms on the discharged line reveal a fault, that is, the SUM is less than 0.051 (block 258). If the SUM is less than this value, a fault has occurred, and the microprocessor flashes the red LED; otherwise, the microprocessor proceeds to perform the sixth test.

With reference to block 260, the admittances calculated for the discharge line between frequencies 152 and 684 Hz are summed. If the summed value is less than 0.046 (block 262), the microprocessor indicates that a fault has occurred, otherwise, it proceeds to the seventh and last test in block 264. The microprocessor determines if the summed admittances at the discrete frequencies between 380 and 836 Hz is less than value 0.044 (block 266). If the SUM is less than this value a fault has occurred; otherwise, the circuit has passed each of the seven tests and the line is not faulted (block 268). The microprocessor proceeds to illuminate the green LED to indicate to the lineman that no fault has occurred. The microprocessor waits approximately 5 seconds, as shown in block 270, before initializing the hardware again to perform another test including generating sample waveforms after charging the capacitor and discharging it into the de-energized line.

If any one of the seven tests indicates the test line is faulted, the microprocessor 188 is programmed to perform a final test, as shown in block 267. This test addresses a problem wherein large capacitors (e.g., a 30 microfarad capacitor) connected to the test line 12 can resemble high admittances at low frequencies. For example, an unfaulted distribution lateral having a power factor correction capacitor can be diagnosed as being faulted. To determine if a line is faulted or has a power factor correction capacitor, the microprocessor 188 compares a sample at 0 Hz or DC with a preprogrammed threshold to determine if an increase n input admittance is due to a capacitor or a fault. The frequency 0 Hz or DC is used because it is one of the admittance frequencies that is unaffected by capacitors. If the threshold is reached, the line is determined to be unfaulted, as indicated by the affirmative branch of block 267, otherwise, the line is faulted and the red LED is driven on.

While certain advantageous embodiments have been chosen to illustrate the invention, it will be understood by those skilled in the art that various changes and modifications can be made herein without departing from the scope of the invention as defined in the appended claims.

What is claimed is:

1. A portable apparatus for use with a hot line tool for determining the presence of a fault along a de-energized electrical line and an electrical return path, comprising:

a capacitor unit comprising a first terminal and a second terminal, said first terminal being detachably connectable to said return path;

a power supply connected to said capacitor unit;

a switch unit detachably connectable to said electrical line; and a cable for connecting said switch unit to said second terminal of said capacitor unit;

said capacitor unit comprising a capacitor having a positive terminal connected to said second terminal and a negative terminal connected to said first terminal, said power supply being connected in parallel to said capacitor for charging said capacitor and generating a voltage across said positive terminal and said negative terminal, a programmable processing device having a first input connected to said first terminal and a second input connected to said second terminal, and circuit means connected in parallel to said capacitor and to said processing device for transforming said voltage across said positive terminal and said negative terminal of said capacitor for processing by said processing device;

said switch unit comprising first switching means connectable at one switch terminal thereof to said electrical line and at the other switch terminal thereof to said second terminal, said capacitor unit being operable to discharge said capacitor into said electrical line via said cable and said first switching means when said first switching means is activated, said processing device being programmable to measure electrical characteristics of said electrical line in response to said capacitor discharging for determining the existence of a fault on said electrical line.

2. An apparatus as claimed in claim 1, wherein said return path is a neutral line between a load and an electrical power source for said load, said capacitor unit being detachably connectable to said neutral line, and said processing device is programmable to determine the existence of a fault between said electrical line and said neutral line.

3. An apparatus as claimed in claim 1, wherein said return path is a second electrical line installed between a load and an electrical power source for said load, said capacitor unit being detachably connectable to said second electrical line when said second electrical line is de-energized, and said processing device is programmable to determine the existence of a fault between said electrical line and said second electrical line.

4. An apparatus as claimed in claim 1, wherein said circuit means for transforming said voltage is a voltage divider.

5. An apparatus as claimed in claim 1, wherein said switch unit is detachably mountable on the end of said hot line tool.

6. An apparatus as claimed in claim 1, wherein said switch unit and said hot line tool are integrally formed as a unitary member.

7. An apparatus as claimed in claim 1, wherein said capacitor unit further comprises:

second switching means connected to said capacitor, said second switching means being operable in a first position to shunt said positive terminal to said negative terminal, and being operable in a second position to remove said shunt from said positive terminal and said negative terminal to allow said capacitor to charge; and third switching means connected to said processing device, said power supply being operable to charge said capacitor in response to activation of said third switching means when said second switching means is in said second position.

8. An apparatus as claimed in claim 1, wherein said switch unit is attached to said hot line tool, said first switching means comprising a hook member for engaging said electrical line, a housing slidably mounted on said hook member, and a contact attached to said housing, said contact being electrically connected to said hook member and to said electrical line when said housing is in a first position relative to said hook member and electrically insulated from said hook member and said electrical line when said housing is in a second position relative to said hook member.

9. An apparatus as claimed in claim 8, wherein said housing is attached to said hot line tool and said first switching means is activated by pulling said switch unit.

10. An apparatus as claimed in claim 8, wherein said housing is attached to said hot line tool and said first switching means is activated by pushing said switch unit.

11. An apparatus as claimed in claim 8, wherein said housing is attached to said hot line tool and said first switching means is activated by rotating said switch unit.

12. An apparatus as claimed in claim 1, wherein said power supply comprises at least one battery connected to said capacitor.

13. An apparatus as claimed in claim 1, wherein said electrical line comprises a cutout, said electrical line being energized on one side of said cutout and de-energized on the other side of said cutout when said cutout is open, said power supply comprising a switch and an electrically conductive line comprising a peak detection circuit, said electrically conductive line being connectable at one end thereof to said energized portion of said electrical line and connectable at the other end thereof to said positive terminal, said switch being connected between said positive terminal and said de-energized electrical line.

14. An apparatus as claimed in claim 13, wherein said peak detection circuit comprises a diode and a resistor connectable in series with each other and with said electrically conductive line.

15. A portable apparatus for determining the presence of a fault along a de-energized electrical line and an electrical return path, comprising:

a capacitor unit comprising a first terminal thereof connected to said return path and a second terminal;

a switch unit connected at one terminal thereof to said electrical line and at the other terminal thereof to said capacitor unit; and a power source connected to said capacitor unit;

said capacitor unit comprising a capacitor having a positive terminal connected to said second terminal and a negative terminal connected to said first terminal, said power source being connected in parallel with said capacitor for charging said capacitor and generating a voltage across said positive terminal and said negative terminal, a programmable processing device connected in parallel to said capacitor, and circuit means connected in parallel to said capacitor and to said processing device for transforming said voltage across said positive terminal and said negative terminal of said capacitor for processing by said processing device;

said switch unit comprising first switching means connectable at one switch terminal thereof to said electrical line and at the other switch terminal thereof to said positive terminal, said capacitor unit being operable to generate a pulse by discharging said capacitor into said electrical line when said first switching means is activated, said electrical line having a load impedance and being operable to propagate at least one response pulse created as a result of said pulse traveling and encountering said load impedance on said electrical line, said processing device being programmable to calculate admittance versus frequency characteristics of said electrical line using a plurality of said response pulse for determining the existence of a fault on said electrical line.

16. A method of detecting the presence of a fault along a de-energized electrical line using a portable apparatus, comprising the steps of:

detachably and electrically connecting a capacitor unit comprising a capacitor to one of a plurality of devices comprising a neutral conductor and a second de-energized electrical line; said capacitor unit being connected to a switch unit comprising a discharge switch by an electrical conductor;

detachably and electrically connecting said switch unit to said electrical line;

charging said capacitor;

activating said discharge switch;

discharging said capacitor into said electrical line to create a pulse, said electrical line being operable to propagate a response to said pulse created when said pulse encounters a load impedance on said electrical line;

detecting and storing said response;

measuring an electrical characteristic of said electrical line using said response; and detecting if fault is present on said electrical line using said measured electrical characteristic.

17. A method as claimed in claim 16, wherein said electrical line is a power line suspended overhead and accessible by a lineman using a hot line tool, said connecting step for detachably and electrically connecting said capacitor unit to one of said plurality of devices comprising the steps of:

detachably connecting said capacitor unit to said hot line tool;

elevating said capacitor unit toward said one of said plurality of devices using said hot line tool;

suspending said capacitor unit from said one of said plurality of devices.

18. A method as claimed in claim 16, wherein said electrical line is a power line suspended overhead and accessible by a lineman using a hot line tool, said connecting step for detachably and electrically connecting said switch unit to said electrical line comprising the steps of:

attaching said switch unit to a hot line tool;

elevating said switch unit toward said electrical line using said hot line tool; and suspending said switch unit from said electrical line.

19. A method as claimed in claim 18, wherein said activating step comprises the step of pulling said switch unit away from said electrical line using said hot line tool.

20. A method as claimed in claim 18, wherein said activating step comprises the step of pushing said switch unit toward said electrical line using said hot line tool.

21. An apparatus as claimed in claim 18, wherein said activating step comprises the step of rotating said hot line tool.

22. A method as claimed in claim 16, wherein said electrical line comprises at least one of a plurality of selectively open circuits comprising a cutout, a fuse and a sectionalizer, said electrical line being energized on one side of said one of said plurality of selectively open circuits and de-energized on the other side of said one of said plurality of selectively open circuits when said cutout is open, said charging step comprising the step of connecting said capacitor to said energized side of said electrical line.

23. A method as claimed in claim 16, wherein said charging step comprises the step of connecting said capacitor to a power supply.

24. A method as claimed in claim 16, wherein said charging step comprises the steps of detecting and indicating when said capacitor is fully charged.

25. A method as claimed in claim 16, wherein said measuring step comprises the step of measuring admittance as a function of frequency using said response.

26. A method as claimed in claim 16, further comprising the step of indicating at least one of a plurality of line conditions comprising the presence of a fault and the absence of a fault.

27. A method of determining the existence of a fault along a de-energized electrical line having a return path, comprising the steps of:

generating a pulse for transmission along said electrical line, said electrical line being operable to propagate a response to said pulse created when said pulse encounters a load impedance said electrical line;

detecting said response on said electrical line and said return path;

calculating admittance versus frequency data relating to the input admittance of said electrical line using said response; and determining from said admittance versus frequency data whether a fault exists on said electrical line.

28. The method as claimed in claim 27, wherein said generating step comprises the steps of connecting a capacitor between said electrical line and said return path and discharging said capacitor into said electrical line.

29. A method as claimed in claim 28, wherein said calculating step comprises the steps of:

sampling the voltage across said capacitor to obtain voltage samples; and calculating current samples using said voltage samples.

30. A method as claimed in claim 28, wherein said calculating step comprises the steps of:

sampling the current across said capacitor to obtain current samples; and calculating voltage samples using said current samples.

31. A method as claimed in claim 28, wherein said calculating step comprises the steps of:

sampling the current across said capacitor to obtain current samples; and sampling the voltage across said capacitor to obtain voltage samples.

32. A method as claimed in claim 27, wherein said calculating step for determining whether a fault exists comprises the steps of:

obtaining current samples and voltage samples from said electrical line;

calculating a first discrete Fourier transform of said voltage samples;

calculating a second discrete Fourier transform of said current samples; and calculating at least one input admittance of said electrical line using the ratio of said first discrete Fourier transform and said second discrete Fourier transform.

33. A method as claimed in claim 32, wherein said determining step for determining whether a fault exists further comprises the steps of:

calculating a first value representing a minimum increase in the conductance of said electrical line created by a fault in said electrical line;

calculating a second value corresponding to the maximum conductance of said electrical line when said electrical line is unfaulted and has a maximum load attached thereto; and determining frequencies wherein said first value is greater than said second value.

34. A method as claimed in claim 33, wherein said determining step for determining whether a fault exists further comprises the step of comparing said input admittance with said first value to determine whether said electrical line is faulted, said line being faulted when said input admittance is greater than said first value.

35. A method as claimed in claim 34, wherein said determining step for determining whether a fault exists further comprises the step of determining whether said line comprises a capacitor and is not faulted by comparing one sample selected from a plurality of samples comprising said voltage samples and said current samples at zero hertz with a predetermined value.

36. A method as claimed in claim 33, wherein said determining step for determining whether a fault exists further comprises the steps of:

determining said first value, said second value and said frequencies for each of a plurality of impedance groups comprising at least a first group and a second group, said first group and said second group each comprising a said load impedances for said electrical line, said load impedances of said first group being smaller than said load impedances of said second group.

37. A method as claimed in claim 36, wherein said determining step for determining whether a fault exists further comprises the steps of:

calculating said input admittance of said electrical line for each of said frequencies in said first group of said plurality of impedance groups using said first discrete Fourier transform and said second discrete Fourier transform;

summing said calculated input admittance for each of said frequencies in said first group; and comparing said summed input admittance with said first value corresponding to said first group.

38. A method as claimed in claim 37, wherein said determining step for determining whether a fault exists further comprises the step of determining whether said line comprises a capacitor and is not faulted by comparing one sample selected from a plurality of samples comprising said voltage samples and said current samples at zero hertz with a predetermined value.

39. A method as claimed in claim 37, wherein said determining step for determining whether a fault exists further comprises the steps of:

calculating said input admittance of said electrical line for each of said frequencies in said second group of said plurality of impedance groups using said first discrete Fourier transform and said second discrete Fourier transform when said input admittance calculated using said frequencies for said first group is less than said first value calculated for said first group;

summing said calculated input admittance for each of said frequencies in said second group; and comparing said summed input admittance corresponding to said second group with said first value corresponding to said second group.

40. A method as claimed in claim 32, wherein said determining step for determining whether a fault exists further comprises the steps of:

calculating a first value representing a minimum increase in the magnitude of the admittance of said electrical line created by a fault in said electrical line, said load impedance being relatively small;

calculating a second value corresponding to the maximum magnitude of the admittance of said electrical line when said electrical line is unfaulted; and determining frequencies wherein said first value is greater than said second value.

41. A method as claimed in claim 27, wherein said calculating step for determining whether a fault exists comprises the steps of:

obtaining current samples and voltage samples from said electrical line;

calculating a first fast Fourier transform of said voltage samples;

calculating a second fast Fourier transform of said current samples; and calculating at least one input admittance of said electrical line using the ratio of said first fast Fourier transform and said second fast Fourier transform.

42. A method as claimed in claim 41, wherein said determining step for determining whether a fault exists further comprises the steps of:

calculating a first value representing a minimum increase in the conductance of said electrical line created by a fault in said electrical line;

calculating a second value corresponding to the maximum conductance of said electrical line when said electrical line is unfaulted and has a maximum load attached thereto; and determining frequencies wherein said first value is greater than said second value.

43. A method as claimed in claim 42, wherein said determining step for determining whether a fault exists further comprises the step of comparing said input admittance with said first value to determine whether said electrical line is faulted, said line being faulted when said input admittance is greater than said first value.

44. A method as claimed in claim 43, wherein said determining step for determining whether a fault exists further comprises the step of determining whether said line comprises a capacitor and is not faulted by comparing one sample selected from a plurality of samples comprising said voltage samples and said current samples at zero hertz with a predetermined value.

45. A method as claimed in claim 42, wherein said determining step for determining whether a fault exists further comprises the steps of:

determining said first value, said second value and said frequencies for each of a plurality of impedance groups comprising at least a first group and a second group, said first group and said second group each comprising a said load impedances for said electrical line, said load impedances of said first group being smaller than said load impedances of said second group.

46. A method as claimed in claim 45, wherein said determining step for determining whether a fault exists further comprises the steps of:

calculating said input admittance of said electrical line for each of said frequencies in said first group of said plurality of impedance groups using said first fast Fourier transform and said second fast Fourier transform;

summing said calculated input admittance for each of said frequencies in said first group; and comparing said summed input admittance with said first value corresponding to said first group.

47. A method as claimed in claim 46, wherein said determining step for determining whether a fault exists further comprises the step of determining whether said line comprises a capacitor and is not faulted by comparing one sample selected from a plurality of samples comprising said voltage samples and said current samples at zero hertz with a predetermined value.

48. A method as claimed in claim 46, wherein said determining step for determining whether a fault exists further comprises the steps of:

calculating said input admittance of said electrical line for each of said frequencies in said second group of said plurality of impedance groups using said first fast Fourier transform and said second fast Fourier transform when said input admittance calculated using said frequencies for said first group is less than said first value calculated for said first group;

summing said calculated input admittance for each of said frequencies in said second group; and comparing said summed input admittance corresponding to said second group with said first value corresponding to said second group.

49. A method as claimed in claim 41, wherein said determining step for determining whether a fault exists further comprises the steps of:

calculating a first value representing a minimum increase in the magnitude of the admittance of said electrical line created by a fault in said electrical line, said load impedance being relatively small;

calculating a second value corresponding to the maximum magnitude of the admittance of said electrical line when said electrical line is unfaulted; and determining frequencies wherein said first value is greater than said second value.

50. An apparatus as claimed in claim 1, wherein said power supply is selected from the group consisting of a portable power source connected across said first terminal and said second terminal of said capacitor unit, a power source located inside said capacitor unit and connected to said capacitor, and a second electrical line between a load and an electrical power source for said load that is energized and is connected across said first terminal and said second terminal of said capacitor unit.

* * * * *